(12) United States Patent  (10) Patent No.: US 8,174,590 B2
Honda et al.  (45) Date of Patent: May 8, 2012

(54) IMAGE PICKUP APPARATUS AND IMAGE PICKUP METHOD

(75) Inventors: Tsutomu Honda, Hachioji (JP); Yuichi Gomi, Hachioji (JP); Yoshinao Shimada, Hino (JP); Jun Aoki, Kunitachi (JP); Kazuhiro Haneda, Akiruno (JP)

(73) Assignees: Olympus Imaging Corp., Tokyo (JP); Olympus Corporation, Tokyo (JP)

( * ) Notice: Subject to any disclaimer, the term of this patent is extended or adjusted under 35 U.S.C. 154(b) by 250 days.

(21) Appl. No.: 12/693,699

(22) Filed: Jan. 26, 2010

(65) Prior Publication Data

US 2010/0194922 A1 Aug. 5, 2010

(30) Foreign Application Priority Data

Feb. 3, 2009 (JP) .................................. 2009-023035
Aug. 20, 2009 (JP) .................................. 2009-191216

(51) Int. Cl.
*H04N 5/217* (2011.01)
*H04N 9/64* (2006.01)
(52) U.S. Cl. ........................................ 348/241; 348/251
(58) Field of Classification Search .................. 348/241, 348/246–248
See application file for complete search history.

(56) References Cited

U.S. PATENT DOCUMENTS

| 2009/0021622 | A1* | 1/2009 | Kume | 348/302 |
| 2009/0180014 | A1* | 7/2009 | Noda et al. | 348/308 |
| 2009/0218477 | A1* | 9/2009 | Okita et al. | 250/214 A |
| 2009/0225212 | A1* | 9/2009 | Kikuchi et al. | 348/308 |
| 2009/0256079 | A1* | 10/2009 | Endo et al. | 250/370.08 |
| 2010/0259639 | A1* | 10/2010 | Hung et al. | 348/223.1 |

FOREIGN PATENT DOCUMENTS

JP    2005-065184    3/2005

* cited by examiner

*Primary Examiner* — Hung Lam
(74) *Attorney, Agent, or Firm* — John C. Pokotylo; Straub & Pokotylo

(57) ABSTRACT

The present invention is an image pickup apparatus provided with a pixel section in which pixels each including a photoelectric conversion section and a signal storage section that temporarily stores a signal charge of the photoelectric conversion section are two-dimensionally arrayed, that resets the signal storage sections before exposing a still image and reads reset data used to remove reset noise of a still image, configured to divide the pixel section into a plurality of pixel groups and sequentially reset the signal storage sections of the respective pixel groups by a transistor, sequentially read reset signals by a selection transistor and cause the selection transistor to read one or more times an LV signal charge generated by exposure of a predetermined pixel group within a time segment during which the signal storage sections are sequentially reset before the signal storage sections of the predetermined pixel group are reset.

12 Claims, 39 Drawing Sheets

IMAGE PICKUP APPARATUS AND IMAGE PICKUP METHOD

CROSS REFERENCE TO RELATED APPLICATION

This application claims benefit of Japanese Application No. 2009-023035 filed in Japan on Feb. 3, 2009 and Japanese Application No. 2009-191216 filed in Japan on Aug. 20, 2009, the contents of which are incorporated by this reference.

BACKGROUND OF THE INVENTION

1. Field of the Invention

The present invention relates to an image pickup apparatus and an image pickup method capable of acquiring image data for still image recording and image data for image display.

2. Description of the Related Art

Image pickup apparatuses such as digital cameras and digital video cameras are mounted with an image pickup device that converts an optical image to an electric signal, and the market share of image pickup devices is shifting from CCD to CMOS in recent years.

A MOS-type image pickup device such as CMOS mounted in an image pickup apparatus is designed to sequentially read charge of many pixels which are two-dimensionally arrayed on an image pickup surface, but an exposure start time and an exposure end time in this condition differ from one pixel to another (from one line to another). Thus, a MOS-type image pickup device configured to be able to equalize exposure start times of all pixels and equalize exposure end times of all pixels (that is, configured to be able to perform control using a global shutter) has a configuration including a photoelectric conversion section such as a photodiode that generates a signal according to an exposure amount, a signal storage section that temporarily stores signal charge generated in the photoelectric conversion section and further a transistor that functions as a switch when transferring or resetting charge.

One example of pixel configuration of such an image pickup device is a configuration shown in FIG. 3 according to an embodiment of the present invention provided with five transistors within one pixel. The configuration shown in FIG. 3 allows control through a global shutter using a signal storage section FD as an in-pixel memory. When this image pickup device is used for a digital camera, for example, Japanese Patent Application Laid-Open Publication No. 2005-65184 describes a technique of driving the image pickup device to suppress KTC noise (reset noise) according to the following sequence.

(1) The signal storage section FD is reset by a transistor Mr and the reset data is read line by line through sequential scanning and stored.
(2) Photoelectric conversion sections PD of all pixels are collectively reset and pixel data of the photoelectric conversion sections PD are collectively transferred to the signal storage sections FD after a lapse of a predetermined exposure time.
(3) The pixel data transferred to the signal storage sections FD is read line by line through sequential scanning and the reset data stored in (1) is subtracted therefrom (a difference is calculated).

SUMMARY OF THE INVENTION

It is an object of the present invention to provide an image pickup apparatus and an image pickup method capable of shortening, when a still image is picked up, a time during which a live view image is not updated.

In brief, the present invention is an image pickup apparatus including: a pixel section in which pixels each including a photoelectric conversion section for generating a signal charge according to an exposure amount are two-dimensionally arrayed; a storage section that is light-shielded and temporarily stores the signal charge of the pixel section; a second reset section that divides the pixels in the pixel section into a plurality of pixel groups that do not, overlap each other and sequentially resets the storage sections of the plurality of pixel groups; a reset signal reading section that sequentially reads reset signals of the storage sections of the plurality of pixel groups reset by the second reset section; a second signal charge reading section that reads one or more times the signal charge generated by exposure of a predetermined pixel group out of the plurality of pixel groups within a time segment during which the second reset section sequentially resets the storage sections of the plurality of pixel groups before the storage sections of the predetermined pixel group are reset by the second reset section; a second image processing section that generates second image data for image display based on the signal charge read by the second signal charge reading section; a first reset section that collectively resets all photoelectric conversion sections that belong to the plurality of pixel groups after reading of reset signals of the plurality of pixel groups by the reset signal reading section is completed; a transfer section that exposes the photoelectric conversion sections for a predetermined time after resetting by the first reset section and then collectively transfers the signal charge generated by the photoelectric conversion sections to the storage sections; a first signal charge reading section that reads the signal charge in the storage sections transferred by the transfer section; and a first image processing section that generates first image data for still image recording based on the signal charge read by the first signal charge reading section and the reset signal read by the reset signal reading section.

Furthermore, the present invention is an image pickup method of reading a reset signal of a storage section that is light-shielded and temporarily stores a signal charge generated by a pixel section in which pixels each including a photoelectric conversion section are arrayed two-dimensionally, then exposing the photoelectric conversion sections for a predetermined time after collectively resetting the photoelectric conversion sections, collectively transferring the signal charge generated by the photoelectric conversion sections to the storage sections, then reading the signal charge and creating image data based on the read signal charge and the read reset signal, the method comprising: a step of causing a second reset section to divide the pixels in the pixel section into a plurality of pixel groups that do not overlap each other and sequentially reset the storage sections of the plurality of pixel groups; a step of causing a reset signal reading section to sequentially read the reset signals of the storage sections of the plurality of pixel groups reset by the second reset section; a step of causing a second signal charge reading section to read one or more times the signal charge generated by exposure of a predetermined pixel group out of the plurality of pixel groups within a time segment during which the second reset section sequentially resets the storage sections of the plurality of pixel groups before the storage sections of the predetermined pixel group are reset by the second reset section; a step of causing a second image processing section to create second image data for image display based on the signal charge read by the second signal charge reading section; a step of causing a first reset section to collectively reset all photoelectric conversion sections that belong to the plurality of pixel groups after reading of reset signals of the plurality of pixel groups by the reset signal reading section is completed; a step of causing a transfer section to expose the photoelectric conversion sections for a predetermined time after resetting by the first reset section and then collectively transfer the signal charge generated by the photoelectric conversion sections to the storage sections; a step of causing a first signal charge reading section to read the signal charge in the storage sections transferred by the transfer section; and a step of causing a first image processing section to generate first image data for still image recording based on the signal charge read by the first signal charge reading section and the reset signal read by the reset signal reading section.

The above and other objects, features and advantages of the invention will become more clearly understood from the following description referring to the accompanying drawings.

DETAILED DESCRIPTION OF THE PREFERRED EMBODIMENTS

Hereinafter, embodiments of the present invention will be explained with reference to the accompanying drawings.

Embodiment 1

Figure 1:
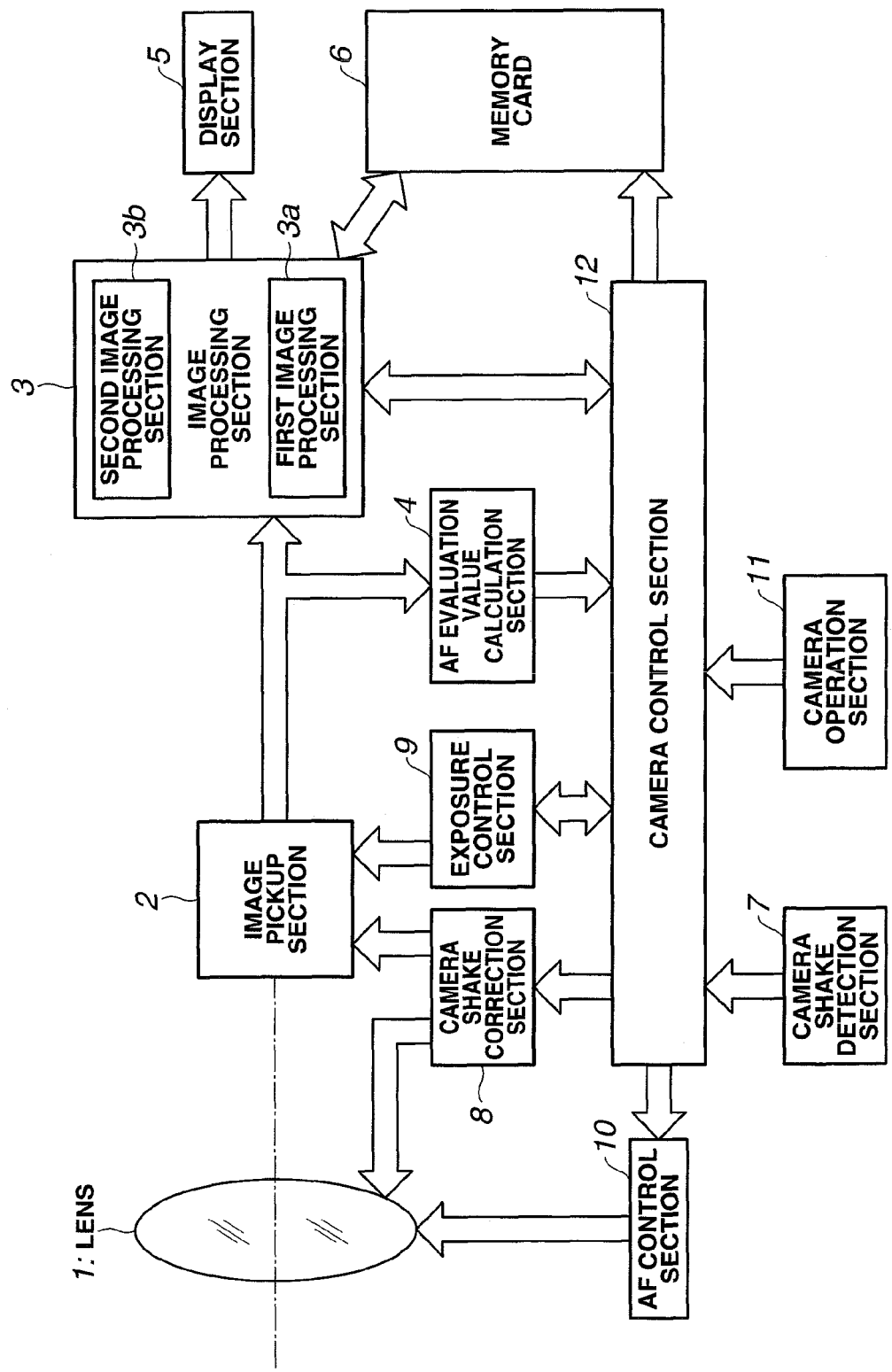
FIG. 1 is a block diagram illustrating a configuration of an image pickup apparatus according to Embodiment 1 of the present invention.

FIG. 1 to FIG. 14 illustrate Embodiment 1 of the present invention, and FIG. 1 is a block diagram illustrating a configuration of an image pickup apparatus.

As shown in FIG. 1, this image pickup apparatus is provided with a lens 1, an image pickup section 2, an image processing section 3, an AF evaluation value calculation section 4, a display section 5, a camera shake detection section 7, a camera shake correction section 8, an exposure control section 9, an AF control section 10, a camera operation section 11 and a camera control section 12. Though a memory card 6 is also described in the figure, the memory card 6 is configured to be detachable from the image pickup apparatus, and so the memory card 6 need not necessarily conform to the configuration specific to the image pickup apparatus.

The lens 1 is a photographing lens to form an optical image of an object on an image pickup plane of an image pickup device 21 (see FIG. 2) of the image pickup section 2.

The image pickup section 2 is intended to photoelectrically convert the optical image of the object formed by the lens 1, convert the optical image to a digital signal as will be described later and then output the digital signal. The image pickup section 2 is configured to at least allow an operation through a global shutter that equalizes exposure start times and exposure end times of all pixels (in addition, may also be configured to allow an operation through a rolling shutter that sequentially performs exposure, for example, line by line (or pixel by pixel)).

The image processing section 3 is intended to apply various types of digital image processing to an image signal outputted from the image pickup section 2. The image processing section 3 is provided with a first image processing section 3a that processes image data for recording and a second image processing section 3b (also serves as a third image processing section) that processes image data for display.

The AF evaluation value calculation section 4 is intended to calculate an AF evaluation value indicating a level of focusing on the object based on the image signal outputted from the image pickup section 2 (e.g., luminance signal in the image signal (or luminance equivalent signal) or the like). The AF evaluation value calculated by the AF evaluation value calculation section 4 is outputted to the camera control section 12.

The display section 5 is intended to display an image based on the signal subjected to image processing for a display by the second image processing section 3b of the image processing section 3. The display section 5 is designed to be able to reproduce and display a still image and perform a live view (LV) display that displays an image pickup range in real time.

The memory card 6 is a recording medium for saving a signal subjected to image processing for recording by the first image processing section 3a of the image processing section 3.

The camera shake detection section 7 is intended to detect camera shake of the image pickup apparatus.

The camera shake correction section 8 is intended to drive the lens 1 and the image pickup section 2 based on camera shake information detected by the camera shake detection section 7 so as to cancel out influences of camera shake on an image to be picked up (camera shake correction section).

The exposure control section 9 is intended to drive the image pickup section 2 and perform exposure control based on a command from the camera control section 12.

The AF control section 10 is intended to drive a focus lens included in the lens 1 based on the control of the camera control section 12 that has received the AF evaluation value from the AF evaluation value calculation section 4 so that focus is achieved on the object image formed on the image pickup section 2.

The camera operation section 11 is intended to perform various operations and inputs on the image pickup apparatus. Examples of operation members included in the camera operation section 11 include a power switch for turning ON/OFF the power of the image pickup apparatus, a release button made up of a two-stage push-button for inputting a command of photographing a still image, a photographing mode switch for switching a photographing mode between a single shooting mode and a continuous shooting mode and an AF mode switch for switching an AF mode between a single AF mode and a continuous AF mode or the like.

The camera control section 12 is intended to control the entire image pickup apparatus including the image processing section 3, the memory card 6, the camera shake correction section 8, the exposure control section 9, the AF control section 10 or the like based on the AF evaluation value from the AF evaluation value calculation section 4, camera shake information from the camera shake detection section 7 and operations and inputs from the camera operation section 11.

Figure 2:
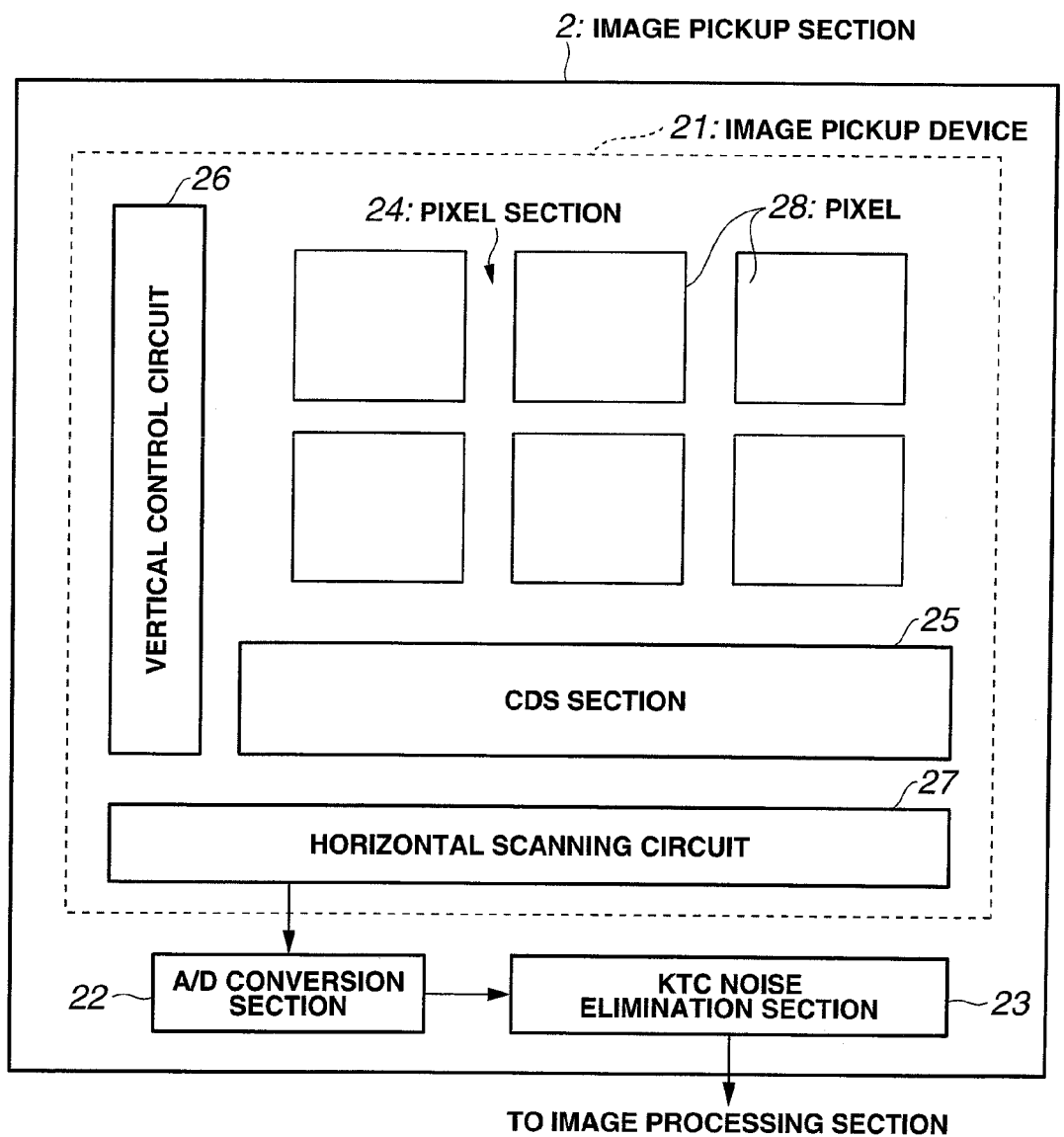
FIG. 2 is a diagram illustrating a more detailed configuration of the image pickup section according to Embodiment 1 of the present invention.

Next, FIG. 2 is a diagram illustrating a more detailed configuration of the image pickup section 2.

The image pickup section 2 is provided with the image pickup device 21 configured, for example, as a MOS-type solid image pickup device, an A/D conversion section 22 and a KTC noise elimination section 23.

The image pickup device 21 among these components is configured by including a pixel section 24, a CDS section 25, a vertical control circuit 26 and a horizontal scanning circuit 27.

The pixel section 24 is configured by arraying a plurality of pixels 28 two-dimensionally in a row direction and a column direction.

The vertical control circuit 26 is intended to apply various signals to the pixels arrayed in the pixel section 24 in row (line) units and intended to also serve as a vertical scanning circuit, a reset control section and a signal reading control section. A signal from a pixel on a row selected by the vertical control circuit 26 is outputted to a vertical transfer line VTL (see FIG. 3) provided for each column.

The CDS section 25 is intended to perform correlation double sampling on a pixel signal transferred from the vertical transfer line VTL when the image pickup section 2 operates through a rolling shutter.

The horizontal scanning circuit 27 is intended to capture pixel signals corresponding to one row selected by the vertical control circuit 26, transferred from the vertical transfer line VTL subjected or not subjected to CDS via the CDS section 25 and output the pixel signals on the row in a pixel sequence in the horizontal direction in chronological order.

The A/D conversion section 22 is intended to convert an analog image signal outputted from the image pickup device 21 to a digital image signal.

The KTC noise elimination section 23 is intended to perform processing of KTC noise elimination on the digital image signal outputted from the A/D conversion section 22 when the image pickup section 2 is operated through the global shutter.

Figure 3:
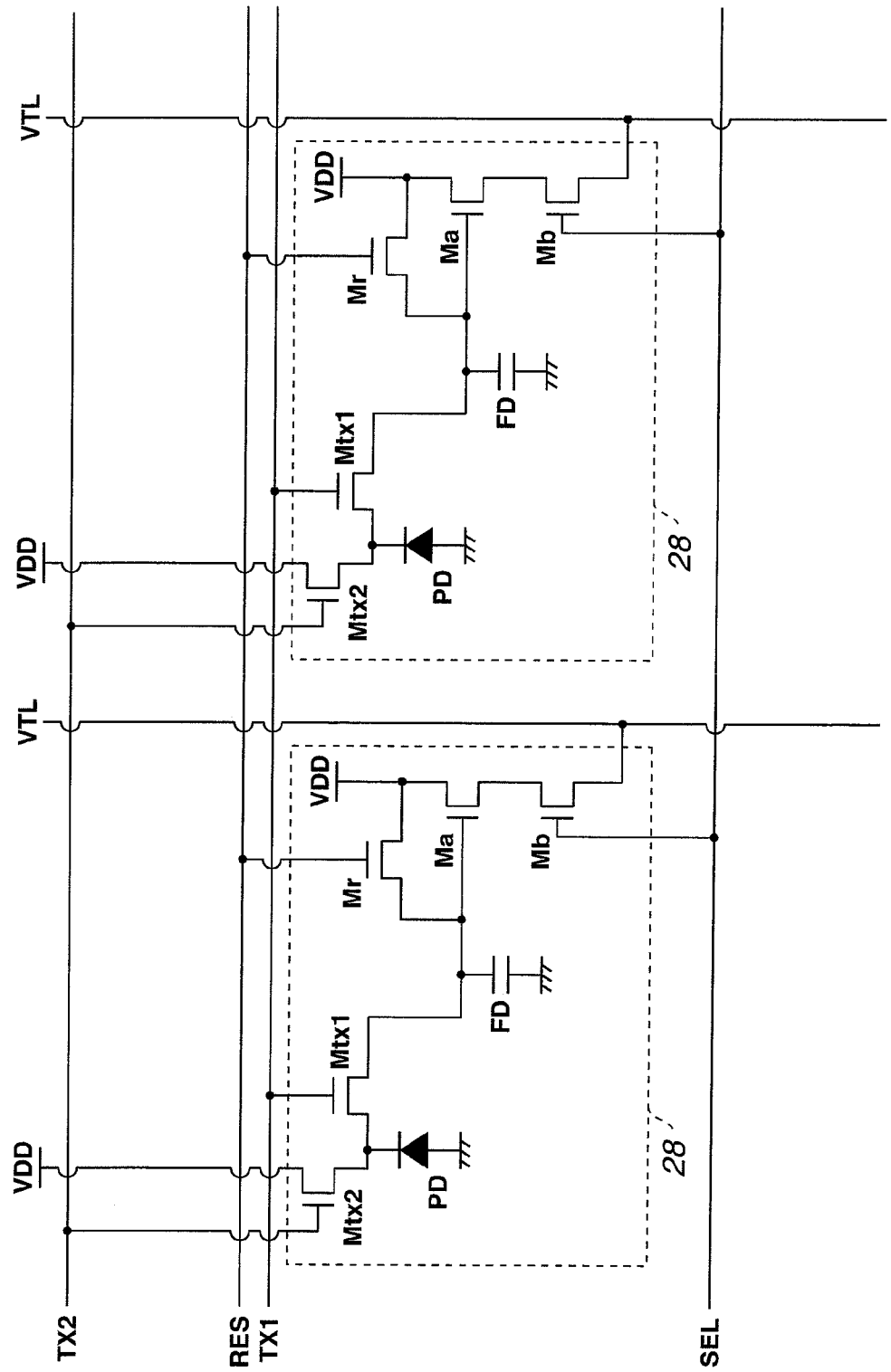
FIG. 3 is a circuit diagram illustrating a more detailed example of pixel configuration of a pixel section of an image pickup device according to Embodiment 1 of the present invention.

Next, FIG. 3 is a circuit diagram illustrating a more detailed configuration example of the pixel 28 in the pixel section 24 of the image pickup device 21.

In FIG. 3, reference character PD (photodiode) denotes a photoelectric conversion section and FD (floating diffusion) denotes a signal storage section (storage section, first charge storage section) that temporarily stores a signal of the photoelectric conversion section PD.

Reference character Mtx2 denotes a transistor that functions as a first reset section to reset the photoelectric conversion section PD, is connected to a current source VDD and also connected to a signal line TX2 to apply a PD reset pulse.

Reference character Mtx1 denotes a transistor that functions as a transfer section or a gate section to transfer the signal of the photoelectric conversion section PD to the signal storage section FD and is connected to a signal line TX1 to apply a transfer pulse.

Reference character Ma denotes an amplification transistor that functions as an amplification section and constitutes a source-follower amplifier together with the current source VDD. A signal of the signal storage section FD is amplified by the amplification transistor Ma and outputted to the vertical transfer line VTL via a selection transistor Mb that functions as a signal charge reading section (first signal charge reading section, second signal charge reading section, reset signal reading section, third signal charge reading section). The selection transistor Mb is connected to a signal line SEL to apply a selection pulse.

Reference character Mr denotes a transistor that functions as a second reset section that resets the input sections of the signal storage section FD and the amplification transistor Ma and is connected to a signal line RES to apply an FD reset pulse. If application of a transfer pulse to the aforementioned transistor Mtx1 and application of an FD reset pulse to this transistor Mr are performed simultaneously, it is possible to not only reset the signal storage section FD but also reset the photoelectric conversion section PD. Therefore, the combination of the transistor Mtx1 and the transistor Mr also functions as the first reset section for the photoelectric conversion section PD.

Figure 4:
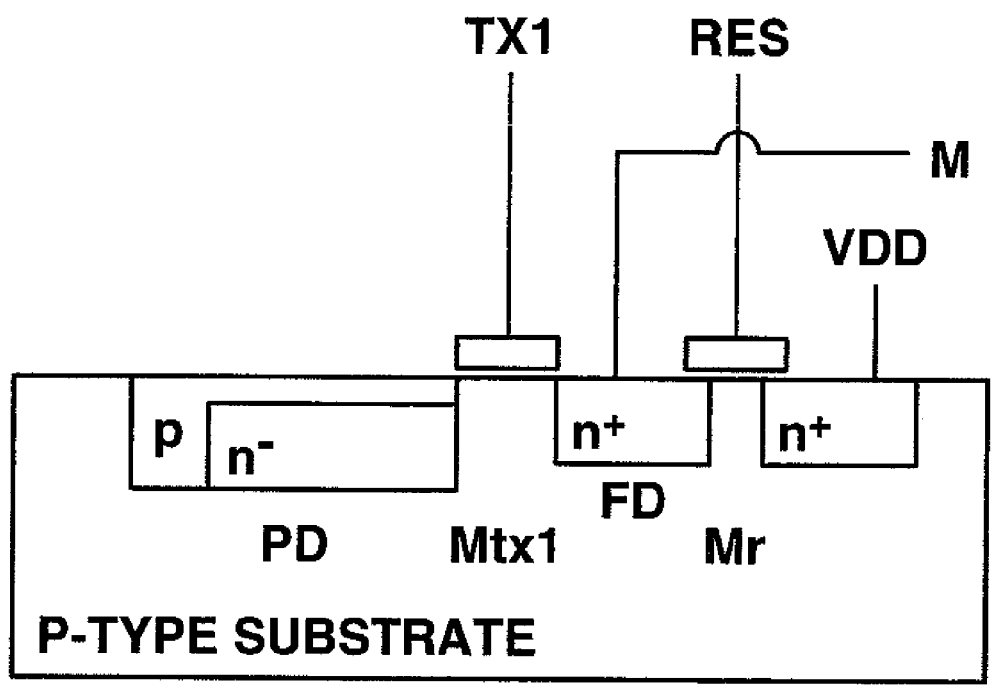
FIG. 4 is a diagram illustrating a pixel configuration in a semiconductor substrate in a thickness direction of the substrate according to Embodiment 1 of the present invention.

Next, FIG. 4 is a diagram illustrating a configuration of the pixel 28 on the semiconductor substrate in the thickness direction of the substrate.

A P-type substrate is used as the semiconductor substrate in the example shown in FIG. 4.

The photoelectric conversion section PD is formed as an n-region and a p-region is formed on the wiring layer side thereof. This allows the photoelectric conversion section PD to be formed as an embedded type and allows a dark current to be reduced. Furthermore, the substrate surface other than the part corresponding to the photoelectric conversion section PD is light-shielded by a light-shielding film provided with predetermined light-shielding performance.

The signal storage section FD is formed as an n+ region at a predetermined distance from the photoelectric conversion section PD. This n+ region is connected to the amplification transistor Ma. Thus, since the signal storage section FD is directly connected to the wiring layer, it is difficult to reduce the dark current.

Furthermore, a gate electrode is formed on the substrate surface between the photoelectric conversion section PD and the signal storage section FD and the transistor Mtx1 is configured. The gate electrode of this transistor Mtx1 is connected to the signal line TX1.

Furthermore, another n+ region is formed at a position at a predetermined distance from the n+ region making up the signal storage section FD and the current source VDD is connected to the latter n+ region. The gate electrode is then formed on the substrate surface between the two n+ regions and the transistor Mr is configured. The gate electrode of the transistor Mr is connected to the signal line RES.

Though not shown in FIG. 4, a gate electrode is formed and a transistor Mtx2 is configured between the photoelectric conversion section PD and the n+ region to which the current source VDD is connected. The gate electrode of the transistor Mtx2 is connected to the signal line TX2.

Figure 5:
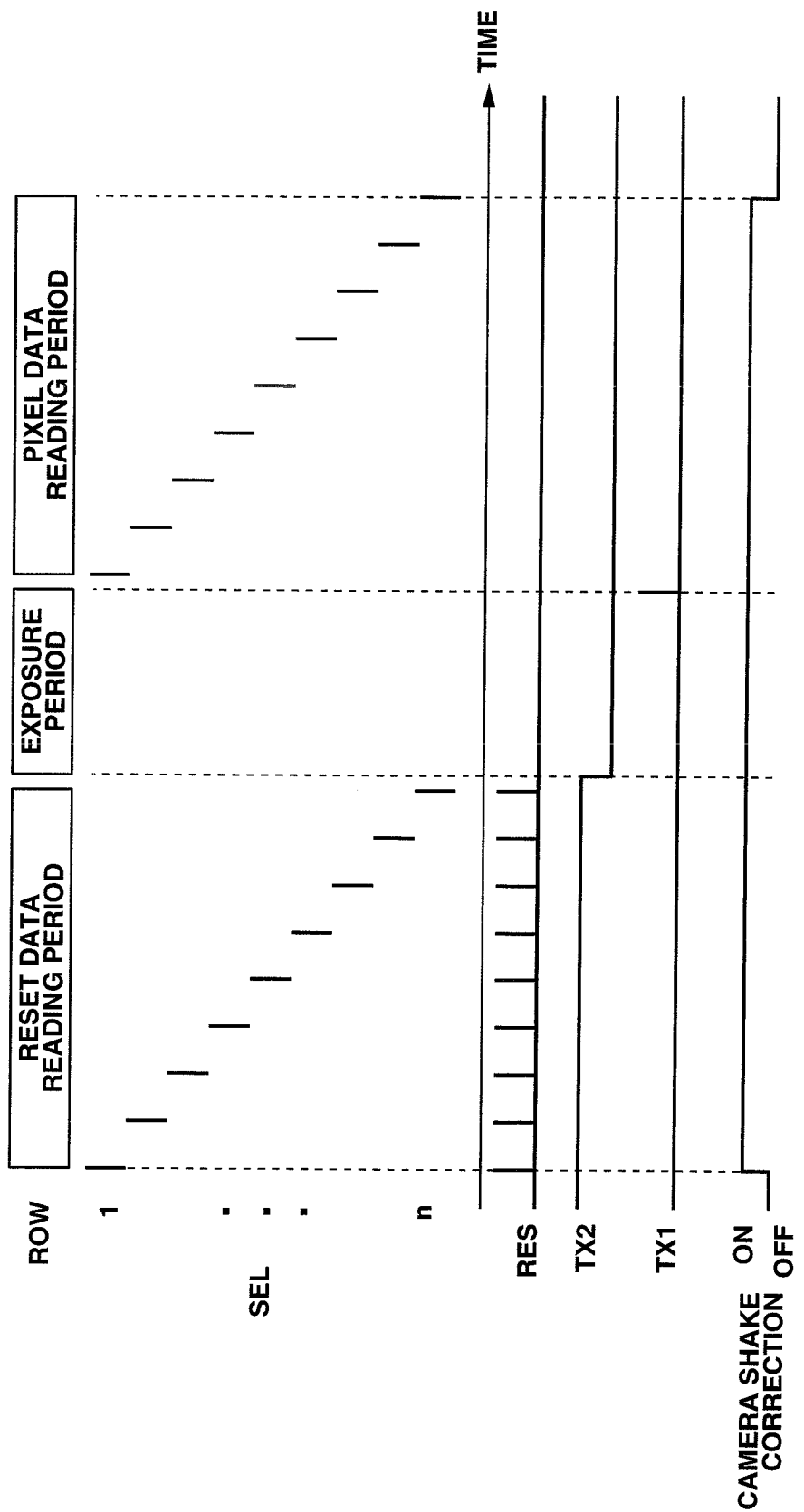
FIG. 5 is a timing chart illustrating a global shutter operation of the image pickup apparatus according to Embodiment 1 of the present invention.

Next, FIG. 5 is a timing chart illustrating a global shutter operation of the image pickup apparatus.

Before performing exposure through the global shutter operation, the signal storage section FD is reset and reset noise is read for a reset data reading period first. That is, the signal storage section FD on the first row is reset by applying a reset pulse to the transistor Mr of each pixel 28 arrayed on the first row of the pixel section 24 from the signal line RES. Furthermore, reset noise is read from the signal storage section FD on the first row by applying a selection pulse to the selection transistor Mb of each pixel 28 arrayed on the first row of the pixel section 24 from the signal line SEL.

By sequentially performing such an operation from the first row to the nth row (final row) of the pixel section 24, reset noise of all pixels is read. The reset noise read here is stored in the KTC noise elimination section 23 via the CDS section 25 (without CDS operation), the horizontal scanning circuit 27 and the A/D conversion section 22 in that order.

Next, during this global shutter operation, by simultaneously turning OFF the transistors Mtx2 of all pixels on all lines via the signal line TX2, storage of charge in the photoelectric conversion sections PD of all pixels is started, that is, exposures of all pixels are started simultaneously.

When a predetermined exposure period (this exposure period corresponds to the shutter speed determined by an AE calculation) has elapsed after exposures are started, a transfer pulse is simultaneously applied to the transistors Mtx1 of all pixels on all lines via the signal line TX1 and the charge stored in the photoelectric conversion sections PD is thereby transferred to the signal storage sections FD, that is, exposures of all pixels are simultaneously finished.

After that, a pixel data reading period starts, and the charge stored in the signal storage sections FD is sequentially transferred line by line from the first row toward the nth row (final row) to the vertical transfer line VTL via the amplification transistor Ma and the selection transistor Mb.

At least from the start of the reset data reading period (reset start by the transistor Mr which is the second reset section) to the end of the pixel data reading period, camera shake is corrected by the camera shake correction section 8 based on the detection result of the camera shake detection section 7. Such a camera shake correction is made to prevent, when a high luminance object is located within the field to be photographed, expansion of the range influenced by leakage light or leakage current from the high luminance section at the position at which an image of the high luminance object is formed.

That is, a normal high luminance object is considered to have a BV value on the order of 12 to 13 as an upper limit and the light-shielding performance of the light-shielding film of the image pickup device 21 is also designed to be able to shield light from the high luminance object at such a level. On the contrary, when the object is the sun, for example, the BV value may reach as high as 27 and the object can be said to be a high luminance object exceeding a normally conceivable range. In such a case, a certain amount of leakage light or leakage current should be assumed to be generated even in the signal storage section FD which is light-shielded by a light-shielding film, but if camera shake occurs in the reset data reading period or pixel data reading period, the influences of the leakage light or leakage current may expand over a wide range.

Thus, as shown in FIG. 5, a camera shake correction is performed by the camera shake correction section 8 based on the detection result of the camera shake detection section 7 from at least the start of the reset data reading period (reset start by the second reset section) to the end of the pixel data reading period. This makes it possible to suppress expansion of the influences of leakage light or leakage current and prevent image quality from further deteriorating.

Figure 6:
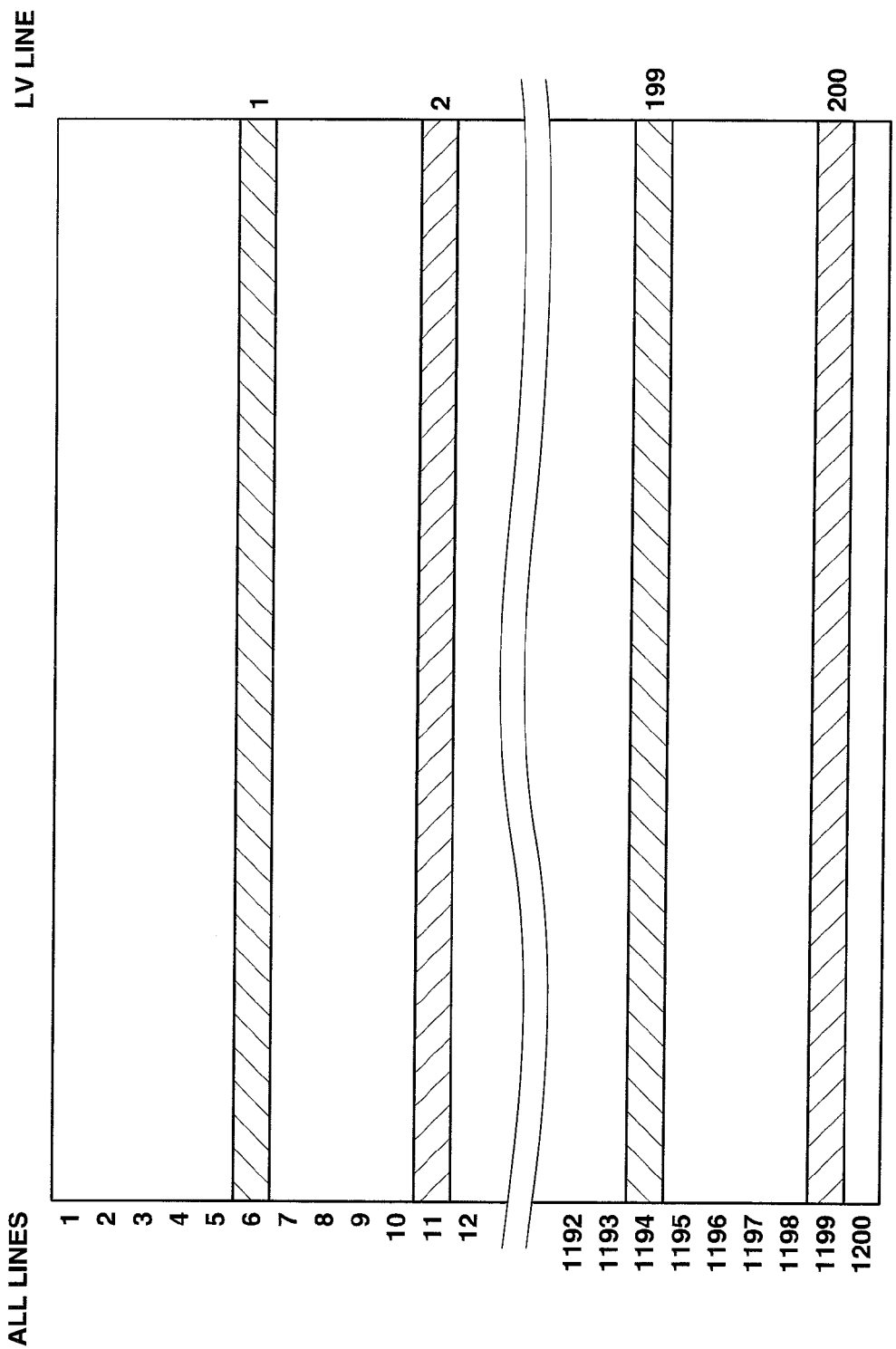
FIG. 6 is a diagram illustrating an example of lines read to be used for a live view by the pixel section according to Embodiment 1 of the present invention.

Next, FIG. 6 is a diagram illustrating examples of lines read to be used for a live view in the pixel section 24.

In the example shown in FIG. 6, the total number of lines configured in the pixel section 24 is 1200. An example where pixel data for a live view (LV) is read at a rate of one out of every six lines among all lines is shown here. However, when the image pickup device 21 is a single color image pickup device, a color filter of Bayer arrangement, for example, is disposed on the front of the pixel section 24, and if only lines corresponding to multiples of 6 are simply read, color components obtained are only G and R or only G and B, and therefore by reading (12m−6) lines (m is an integer of 1 to 100) of all lines as odd-numbered lines for LV and reading (12m−1) lines (m is an integer of 1 to 100) of all lines as even-numbered lines for LV, all color components of RGB can be obtained.

Figure 7:
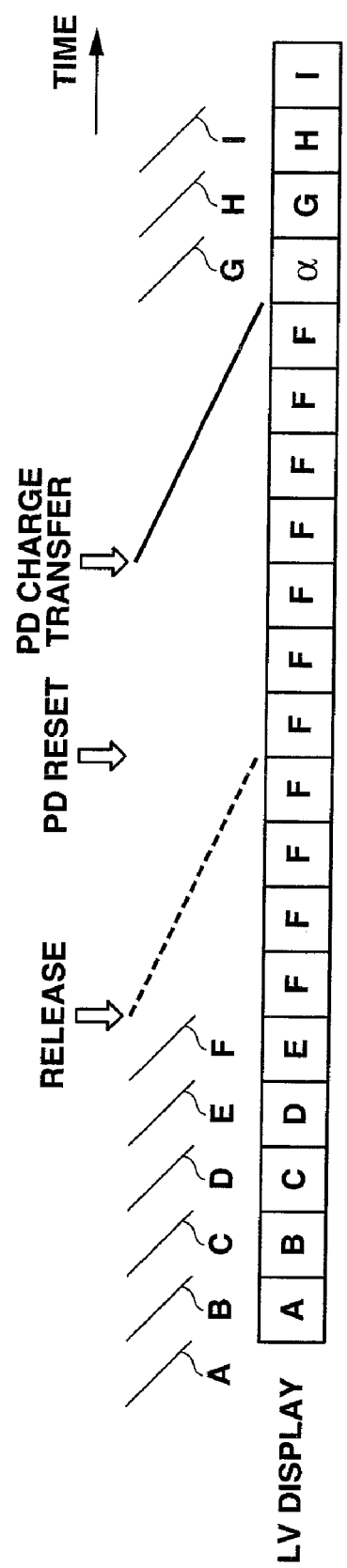
FIG. 7 is a diagram illustrating an example where the image pickup section is driven to pick up a still image using a first drive method in the middle of performing a live view according to Embodiment 1 of the present invention.

Next, FIG. 7 is a diagram illustrating an example when the image pickup section 2 is driven to pick up a still image using a first drive method in the middle of performing a live view.

As illustrated in FIG. 6, reading all the pixel data of all 1200 lines requires a time of 60 ms, for example, but it is possible to selectively read pixel data of 200 lines for LV in, for example, approximately 17 ms (or more exactly 16.67 ms) (also see FIG. 10 which will be described later). In the former case, 16 still images per second can be read at most, whereas image data of 60 frames per second can be acquired in the latter case.

Therefore, while a live view is being performed, image data is acquired at a rate of, for example, 60 frames per second until the release button is pressed (here two-stage pressing) and displayed on the display section 5. In this case, when image data is acquired in a certain frame as illustrated, image data acquired in a next frame is displayed as a live view.

If the release button is pressed in the middle of performing this live view, in such a case as shown in FIG. 7, that is, the image pickup section 2 is driven to pick up a still image using the first drive method, the capturing of image data for a live view is stopped and the image pickup operation shown in FIG. 5 is performed. Since the image data for a live view is not captured in the middle of this image pickup operation, the processing of continuing to display the last captured image data F for a live view as shown in FIG. 7 is performed. Instead of continuing to display the last captured image data F for a live view, live view display may be prevented from being performed during the image pickup operation.

When the image pickup operation of the still image as shown in FIG. 5 is finished, the image data for a live view is acquired again and image data acquired in the next frame is displayed as a live view. In the example shown in FIG. 7, in order to shorten, even by one frame, the period during which no live view is performed, image data a for a live view is generated from the image data acquired for a still image in the next frame in which the image pickup operation of a still image shown by a solid bold line ends and a live view display is performed.

Figure 8:
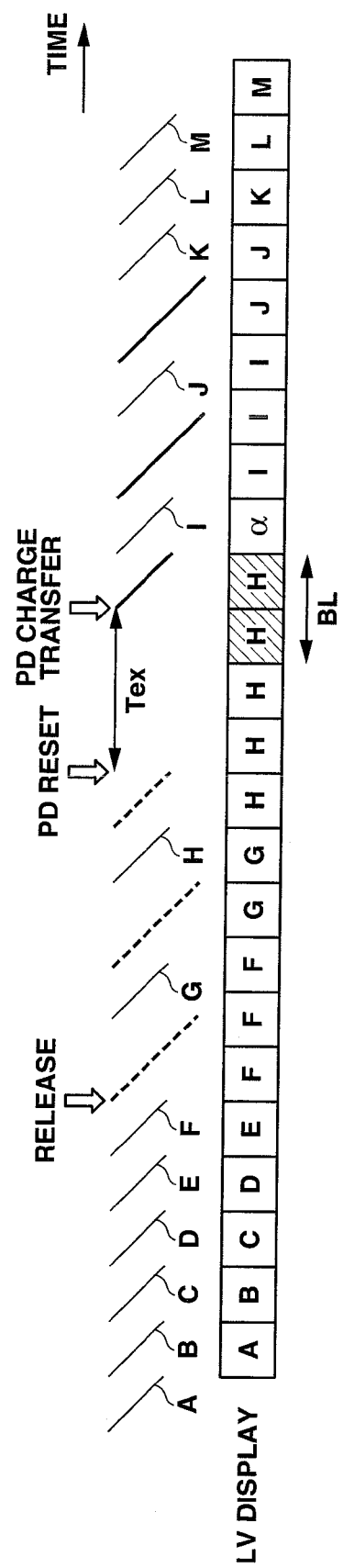
FIG. 8 is a diagram illustrating an example where the image pickup section is driven to pick up a still image using a second drive method in the middle of performing a live view according to Embodiment 1 of the present invention.

Next, FIG. 8 is a diagram illustrating an example where the image pickup section 2 is driven to pick up a still image using a second drive method in the middle of performing a live view.

When the image pickup section 2 is driven using the first drive method shown in FIG. 7, no live view image is acquired after the release button is pressed until the image pickup operation is finished, and therefore the display is not updated. On the other hand, when the image pickup section 2 is driven using the second drive method shown in FIG. 8, a live view image is acquired also after the release button is pressed until the image pickup operation is finished and the live view display is updated.

The operation shown in FIG. 8 is the same operation as that shown in FIG. 7 until the release button is pressed.

When the release button is pressed, reading of reset data is started, but when reading of several lines of reset data is performed, an operation of acquiring live view images from lines from which reset data has not been read yet is performed. By the time the reading of the reset data is completed, a live view image is acquired one or more times so that the reset data of each line used to acquire a live view image is acquired at the end of the reset data reading period. Furthermore, when live view images are acquired two or more times, reset data is read after acquisition of each live view image. A live view image acquired during the reset data reading period in this way has a lower frame rate of the image acquired than a normal live view image, and therefore the same live view image is displayed continuously over a plurality of display frames and the display is updated when acquisition of a new live view image is completed.

The exposure period is then started by resetting the photoelectric conversion section PD and the exposure period ends when charge of the photoelectric conversion section PD has been transferred to the signal storage section FD just as the operation shown in FIG. 7.

The pixel data reading period is then started, and in this case, pixel data of each line to be used to acquire a live view image is read first and then pixel data of other lines is read. A live view image is acquired one or more times at an appropriate time after reading of pixel data of each line is completed (appropriate time within the pixel data reading period). In this case, when live view images are acquired two or more times, pixel data is read after acquisition of each live view image.

In the example shown in FIG. 8 as with the example shown in FIG. 7, in order to shorten the period, even by one frame, during which no live view is performed, image data a for a live view is generated from the image data acquired for a still image in a frame next to a frame in which acquisition of the pixel data for a still image of each line to be used to acquire a live view image is completed and a live view is then displayed.

When the pixel data reading period is finished, the process is returned to a normal live view as with the example shown in FIG. 7.

Figure 9:
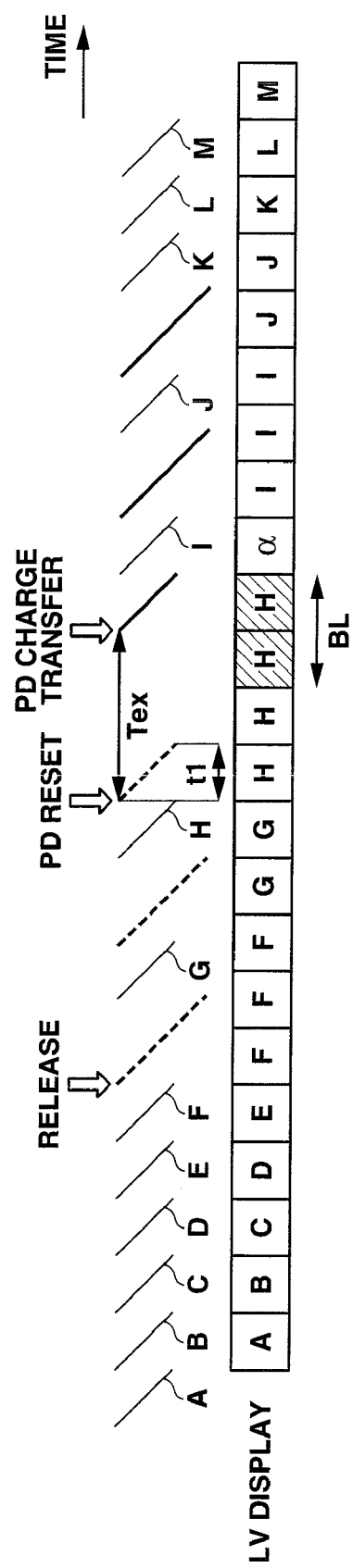
FIG. 9 is a diagram illustrating another example where the image pickup section is driven to pick up a still image using the second drive method in the middle of performing a live view according to Embodiment 1 of the present invention.

Next, FIG. 9 is a diagram illustrating another example where the image pickup section 2 is driven to pick up a still image using the second drive method in the middle of performing a live view.

The example shown in FIG. 9 is devised so as to further shorten the period during which no live view image is acquired compared to the example shown in FIG. 8.

That is, in the example shown in FIG. 8, the photoelectric conversion section PD is reset and exposure is started after reading of reset data on all lines is completed. On the other hand, in the example shown in FIG. 9, immediately after the last live view image in the reset data read period is acquired, the photoelectric conversion section PD is reset and reading of the remaining reset data is continued even after the exposure period is started. As is obvious with reference to the pixel configuration shown in FIG. 3, once the transistor Mtx1 is turned OFF, reading of reset data from the signal storage section FD via the amplification transistor Ma and the selection transistor Mb never influences the storage of pixel charge in the photoelectric conversion section PD started by turning OFF the transistor Mtx2. Therefore, exposure and reading of reset data can be performed simultaneously in this way.

By performing such processing, the period during which no live view image is acquired can be shortened by time t1 compared to the example shown in FIG. 8. Furthermore, by performing such processing, the time required after reading reset data until the pixel data is read can also be shortened by time t1 compared to the example shown in FIG. 8. As shown in FIG. 4, the signal storage section FD is directly connected to the wiring layer and it is difficult to reduce a dark current. Therefore, shortening the time required after reading the reset data until the pixel data is read leads to a reduction of the amount of generated dark current and also has an advantage that it is possible to reduce the influence of the reset data on the pixel data.

Figure 10:
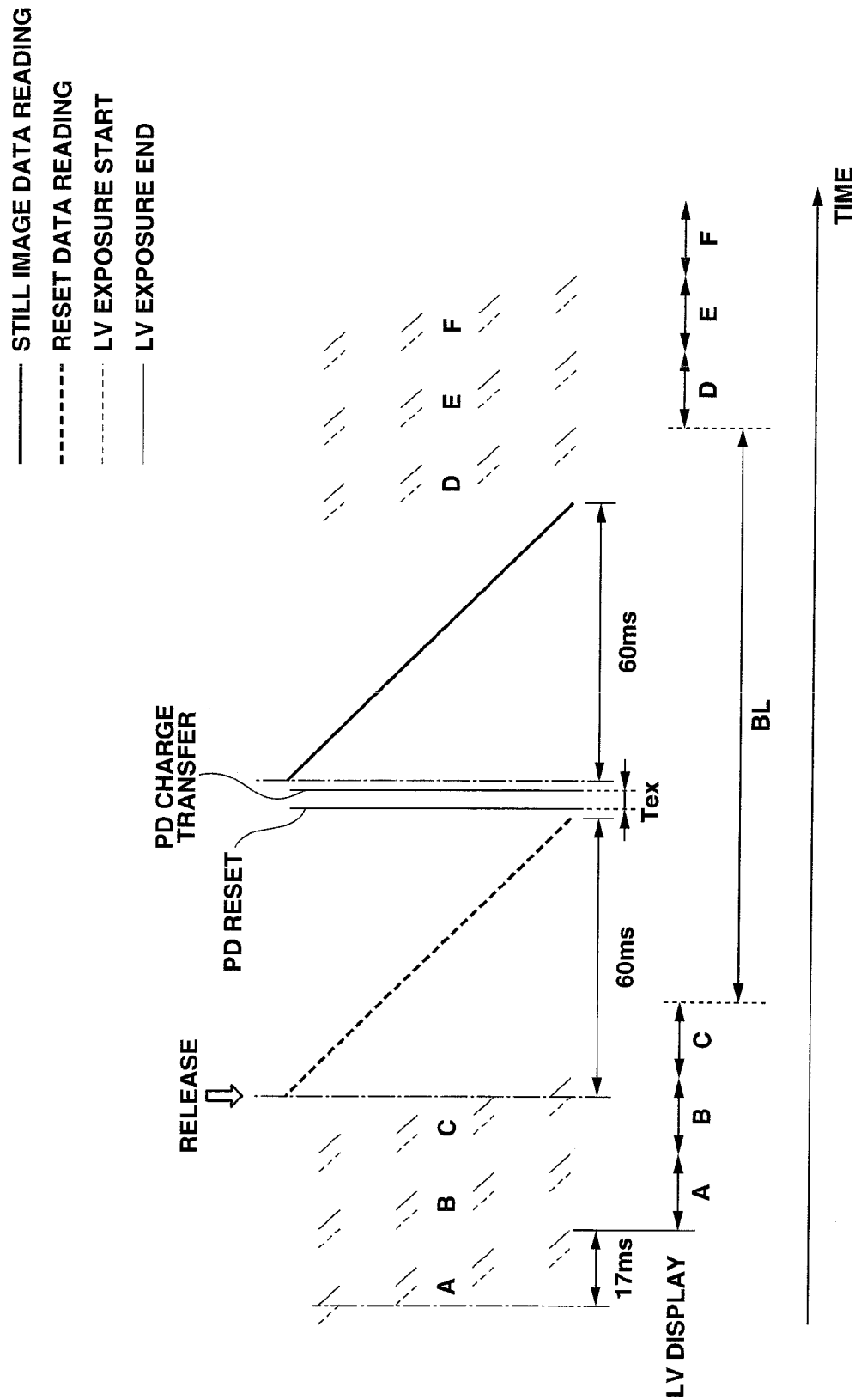
FIG. 10 is a timing chart illustrating in further detail the processing shown in FIG. 7 of Embodiment 1 of the present invention.

Next, FIG. 10 is a timing chart illustrating the processing shown in FIG. 7 in further detail.

As described in FIG. 7, this FIG. 10 also illustrates processing when the image pickup section 2 is driven to pick up a still image using the first drive method in the middle of performing a live view.

In the live view display period before the release button is turned ON, an exposure start for LV and an exposure end for LV are performed for each display frame on the lines for LV as shown in FIG. 6, for example, and displayed in the next display frame.

When the release button is pressed, reset data is read, but since reading of reset data for still image is performed on all lines of the pixel section 24 (all 1200 lines in the example shown in FIG. 6), the time required to read the reset data is, for example, 60 ms as described above. A period BL starts after performing a LV display of the last acquired LV image data (image data C in the illustrated example) before the reset data reading period starts. The period BL is a period during which no LV display is performed (blackout) or the image data C is LV-displayed continuously without any image update.

After that, acquisition of LV image data is started after a lapse of an exposure period (shutter speed Tex) and a pixel data reading period (for example, 60 ms as with the reset data reading period) and an LV display is performed in the next display frame after the acquisition. In the example shown in FIG. 10, it is the image data D that is the LV display updated first after the still image is acquired, but as in the case of the explanation with reference to FIG. 7, image data a for LV may be generated based on the image data acquired for the still image and may be LV-displayed before the image data D.

Figure 11:
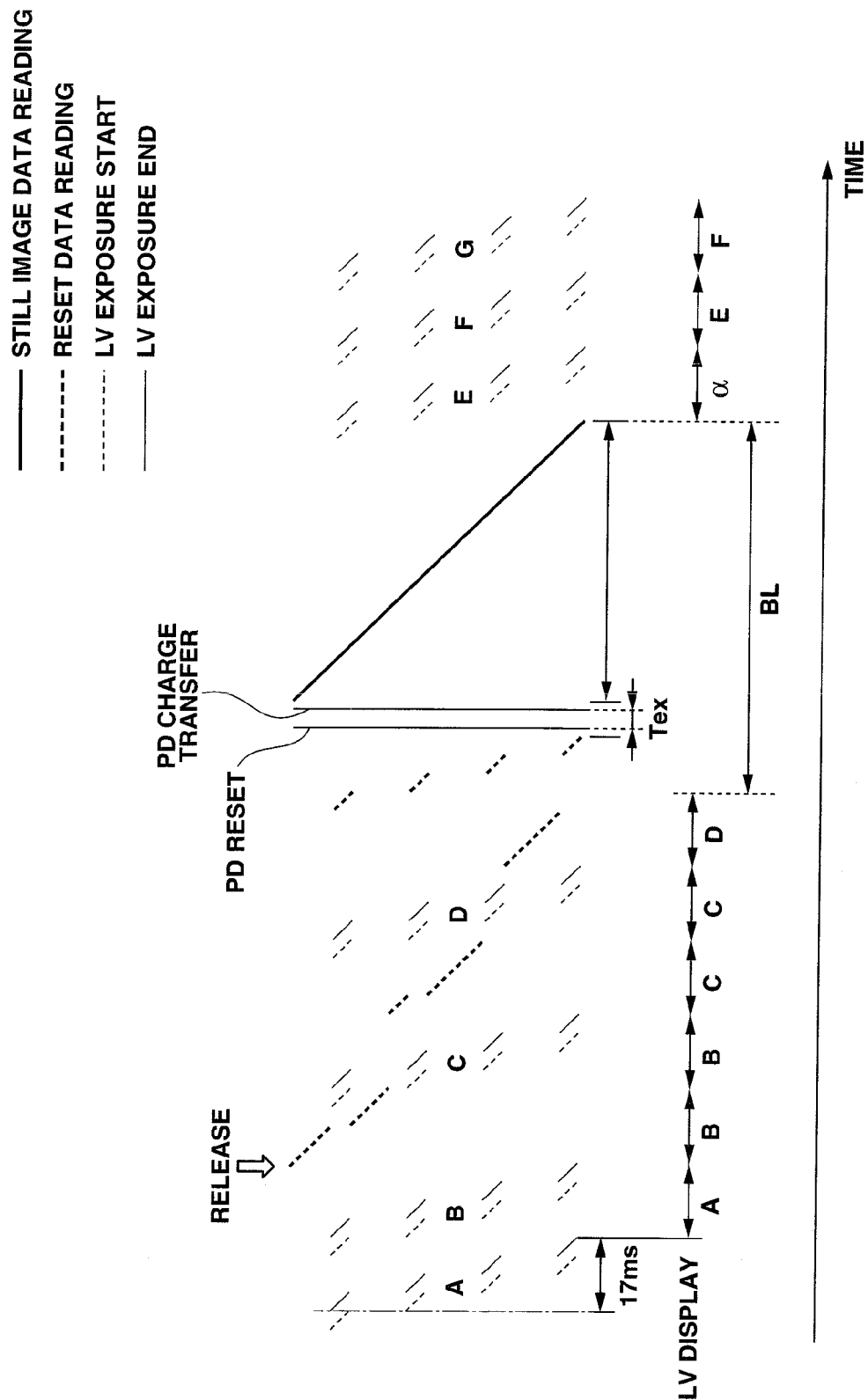
FIG. 11 is a timing chart illustrating an example of processing of acquiring LV image data only during a reset data reading period of the processing shown in FIG. 8 of Embodiment 1 of the present invention.

Next, FIG. 11 is a timing chart illustrating an example of processing where LV image data is acquired only for the reset data reading period of the processing shown in FIG. 8. That is, in the example shown in FIG. 11, unlike the example shown in FIG. 8, no LV image data is acquired during the pixel data reading period.

In the example shown in FIG. 11, reset data is read and LV image data is acquired after the release button is pressed based on the following principles.

First, as described above, reset data of each line used to acquire a live view image (hereinafter referred to as "LV line" and lines other than the LV line of all lines will be hereinafter referred to as "non-LV lines") is acquired at the end of the reset data reading period.

The LV image data is acquired at a rate of once every plurality of display frames (in the example shown in FIG. 11, LV image data C and D are acquired at a rate of once every two display frames. In this case, the last LV image data B acquired before the release button is pressed is LV-displayed twice repeatedly, and the image data C is also LV-displayed twice repeatedly likewise. Furthermore, the last LV image data D acquired before resetting of the photoelectric conversion section PD is LV-displayed only once in the example shown in FIG. 11, but as described above, may also be repeatedly displayed for the period BL). The LV image data need not necessarily be acquired in synchronization with the display frame.

Reset data of non-LV lines are read in ascending order of line numbers for a period during which no LV image data is acquired (in the example shown in FIG. 11, the period after the release button is pressed until reading of the LV image data C is started, period after reading of the LV image data C is finished until reading of the LV image data D is started and, period after reading of the LV image data D is finished).

After that, as described above, the reset data for LV lines is read at the end of the reset data reading period.

Next, after an exposure period and a pixel data reading period, a live view is started again, but in the example shown in FIG. 11, a live view is performed with the same LV line as that before the release button is pressed.

Furthermore, in the example shown in FIG. 11, image data a for a live view is generated from the image data acquired for a still image in a display frame next to the one in which an image pickup operation of a still image is finished so as to shorten, even by one frame, the period during which no live view is performed.

Figure 12:
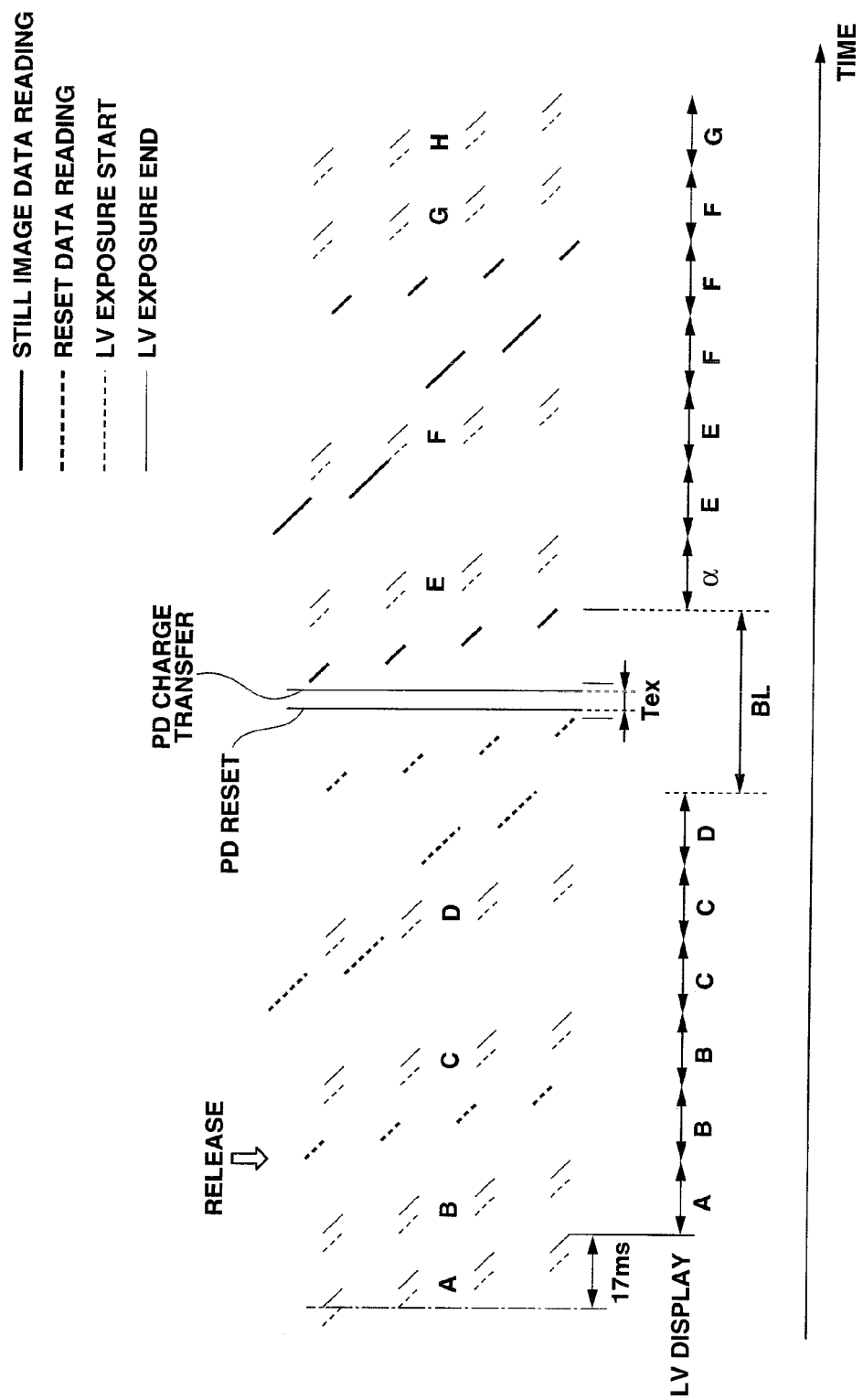
FIG. 12 is a timing chart illustrating a more detailed example of the processing shown in FIG. 8 of Embodiment 1 of the present invention.

Next, FIG. 12 is a timing chart illustrating a more detailed example of the processing shown in FIG. 8. In the example shown in FIG. 12 unlike the example shown in FIG. 11, LV image data is acquired for both the reset data reading period and the pixel data reading period.

Furthermore, in the example shown in FIG. 12, the LV line on which LV image data is acquired before the exposure period is made to differ from the LV line on which LV image data is acquired after the exposure period (made to differ particularly so as not to overlap with each other).

In the example shown in FIG. 12, reset data after the release button is pressed is read and LV image data is acquired based on the following principles.

First, the reset data of LV lines after the exposure period is read at the beginning of the reset data reading period (period after the release button is pressed until reading of LV image data C is started in the example shown in FIG. 12).

Furthermore, LV image data is acquired at a rate of once every plurality of display frames. As described above, LV image data need not necessarily be acquired in synchronization with the display frame.

For the period during which no LV image data is acquired (period after reading of the LV image data C is finished until reading of LV image data D is started and period after reading of LV image data D is finished in the example shown in FIG. 12), reset data of non-LV lines (a line not corresponding to any one of the LV line before the exposure period and the LV line after the exposure period will be referred to as a non-LV line in the explanations in FIG. 12) are read in ascending order of line numbers, for example.

After that, reset data of LV lines before the exposure period is read at the end of the reset data reading period (period after reading of the LV image data D is finished and after reading of reset data of non-LV lines is completed in the example shown in FIG. 12).

Next, after the exposure period, a pixel data reading period starts. Pixel data on the LV lines after the exposure period is read first (period after the exposure period ends until reading of LV image data E is started in the example shown in FIG. 12). After this reading is completed, LV image data from the LV lines after the exposure period can be read even within a pixel data reading period.

In the example shown in FIG. 12, image data a for a live view is generated based on pixel data read for a still image from the LV lines after the exposure period and a live view is displayed in the immediately following display frame.

After that, LV image data is acquired at a rate of once every plurality of display frames (LV image data need not be acquired in synchronization with the display frame as described above).

Next, for a period during which no LV image data is acquired (period after reading of LV image data E is finished until reading of LV image data F is started and period after reading of LV image data F is finished in the example shown in FIG. 12), reset data of non-LV lines are read in ascending order of line numbers, for example.

Furthermore, at the end of the pixel data reading period (period after reading of LV image data F is finished and after reading of reset data of non-LV lines is completed in the example shown in FIG. 12), pixel data of LV lines before the exposure period are read.

Since this completes image pickup of the still image, a normal live view is displayed thereafter.

In the example shown in FIG. 12, the time after reading reset data until the time of reading pixel data is basically (though some exceptions may occur depending on timing) set to be the same for each line. This allows the amount of noise caused by a dark current to be the same for any line (excluding some exceptions as described above). Therefore, it is possible to prevent deterioration of image quality resulting from differences in the amount of noise among lines.

In FIG. 12, LV image data is read for both the reset data reading period and the pixel data reading period, and in FIG. 11, LV image data is read for only one of the two periods, the reset data reading period, and further it is naturally possible to read LV image data only for the other, the pixel data reading period. That is, LV image data can be read within at least only one of the reset data reading period and the pixel data reading period.

Furthermore, when the processing shown in FIG. 12 is performed, the image displayed in a live view is shifted by a few lines in the horizontal direction before and after the exposure period, but when the image pickup apparatus is a digital camera or the like, since the screen size of the display section 5 is smaller than the display section of a personal computer or the like, this shift is not very noticeable when displayed and there is substantially no problem from a practical standpoint.

Furthermore, in the processing shown in FIG. 11 and FIG. 12, storage of LV image data is started (LV exposure start) simultaneously with the reading of reset data. To be more specific, part of the exposure start timing of LV image data C and D shown by a dotted line in FIG. 11 and FIG. 12 overlaps with the reset data reading timing shown by a thick dotted line. Furthermore, in the processing shown in FIG. 12, storage of LV image data is started (LV exposure start) simultaneously with the reading of the still image data. To be more specific, part of the exposure start timing of LV image data F shown by a dotted line in FIG. 12 overlaps with the reading timing of still image data shown by a thick line. Thus, LV exposure is started so as to temporally overlap with reset data divided reading or still image data divided reading, and a longer LV exposure time can be taken compared to a case where the LV exposure is started so as not to temporally overlap with reset data divided reading or still image data divided reading, and when the luminance of the object is low, a brighter LV image or an LV image with the suppressed signal amplification gain and reduced noise can be obtained.

Figure 13:
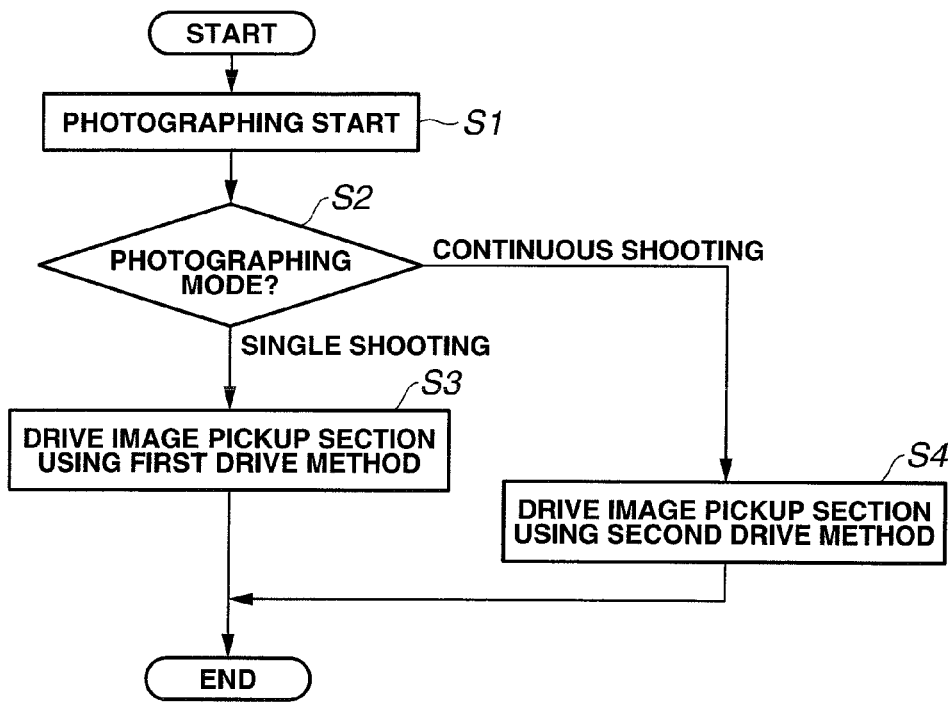
FIG. 13 is a flowchart illustrating processing according to a photographing mode of the image pickup apparatus according to Embodiment 1 of the present invention.

Next, FIG. 13 is a flowchart illustrating processing according to a photographing mode of the image pickup apparatus.

When this processing starts upon pressing of the release button of the camera operation section 11, for example, the image pickup apparatus starts a photographing operation (step S1).

Next, the camera control section 12 determines whether the setting of the photographing mode is a single shooting mode or a continuous shooting mode (step S2).

When the mode is determined to be the single shooting mode here, the image pickup section 2 is driven to photograph a still image using the first drive method (see FIG. 5, FIG. 7, FIG. 10 or the like) (step S3) and this process is finished.

On the other hand, when the photographing mode is determined to be the continuous shooting mode in step S2, the image pickup section 2 is driven to photograph a still image using the second drive method (see FIG. 8, FIG. 9, FIG. 11, FIG. 12 or the like) (step S4) and this process is finished.

In the continuous shooting mode, even if photographing of one image is finished, it is preferable that data for AF or data for AE can be acquired to photograph the next image and that the photographer can check the object. Image data for LV is used not only for a live view display on the display section 5 but also as data for AF and data for AE, and therefore the image pickup section 2 is made to be driven using the second drive method in the continuous shootings. This makes it possible to shorten the time during which LV images are not updated or blackout when continuous shooting photographing is performed, and makes it easier, even when the object is a moving object, for the photographer to change the photographing direction of the image pickup apparatus so as to capture the object within the photographing range. Moreover, each image photographed by continuous shootings can be an image focused with higher accuracy based on AF tracking or an image with a more appropriate exposure based on AE tracking. On the other hand, in the single shooting mode, since performing a normal AF operation or AE operation is sufficient, the image pickup section 2 is driven using the first drive method so as to shorten the time after the release button is pressed until recording to the memory card 6 is finished.

Figure 14:
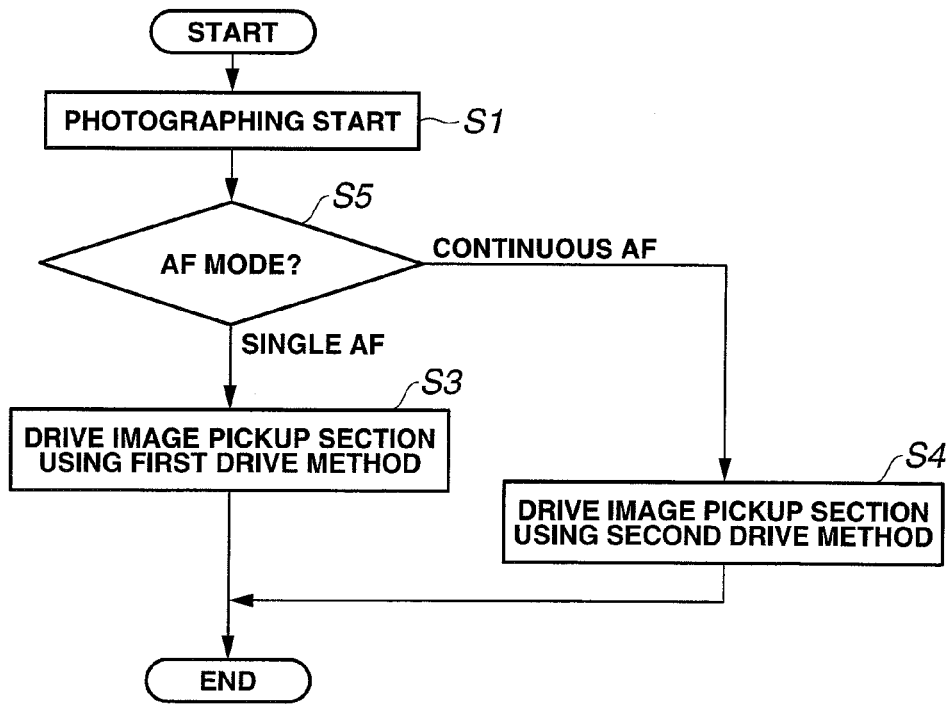
FIG. 14 is a flowchart illustrating processing according to an AF mode of the image pickup apparatus according to Embodiment 1 of the present invention.

Next, FIG. 14 is a flowchart illustrating processing according to an AF mode of the image pickup apparatus.

When, for example, this processing is started when the release button of the camera operation section 11 is pressed, the image pickup apparatus starts a photographing operation first (step S1).

Next, the camera control section 12 determines whether the setting of the AF mode is a single AF mode or a continuous AF mode (step S5).

When the AF mode is determined to be the single AF mode here, the image pickup section 2 is driven to photograph a still image using the first drive method (see FIG. 5, FIG. 7, FIG. 10 or the like) (step S3) and this process is finished.

On the other hand, when the AF mode is determined to be the continuous AF mode in step 5, the image pickup section 2 is driven to photograph a still image using the second drive method (see FIG. 8, FIG. 9, FIG. 11, FIG. 12 or the like) (step S4) and this process is finished.

In the continuous AF mode, even after the release button is half-pressed, data for AF (also data for AE, if possible) can be preferably acquired until immediately before the exposure period starts. Since the image data for LV is used as data for AF or data for AE, in the continuous AF mode, the image pickup section 2 is driven using the second drive method. This causes the image photographed in the continuous AF mode to be an image photographed with high AF trackability and allows the image to be focused with high accuracy even when an object moving at high speed is photographed. On the other hand, in a single AF mode, since performing a normal AF operation (and normal AE operation) is sufficient, the image pickup section 2 is driven using the first drive method so as to shorten the time after the release button is pressed until recording to the memory card 6 is finished.

In the above described case, whether to drive the image pickup section 2 using the first drive method or the second drive method is selected depending on the photographing mode or AF mode, but the factor of selection is not limited thereto methods and the drive method may also be selected according to other factors.

According to such Embodiment 1, when LV image data is read using the second drive method for at least one of the reset data reading period and the pixel data reading period, it is possible to shorten the period during which LV display is not displayed or not updated.

Furthermore, in the continuous shooting mode or continuous AF mode, LV image data is acquired using the second drive method, and therefore high AF tracking performance or high AE tracking performance can be secured. On the other hand, in the single shooting mode or single AF mode, the image pickup section 2 is driven using the first drive method, and therefore it is possible to shorten the time after the release button is pressed until recording to the memory card 6 is finished.

Moreover, for at least the period after the release button is pressed until reading of pixel data is finished, an image to be formed on the image pickup device is designed to never shake, and therefore even when an image of light from a high luminance object is formed as a high luminance section, it is possible to prevent charge which is leaking into a light-shielded section from generating unnatural traces. This makes it possible to prevent deterioration of image quality and acquire a natural image.

Embodiment 2

Figure 15:
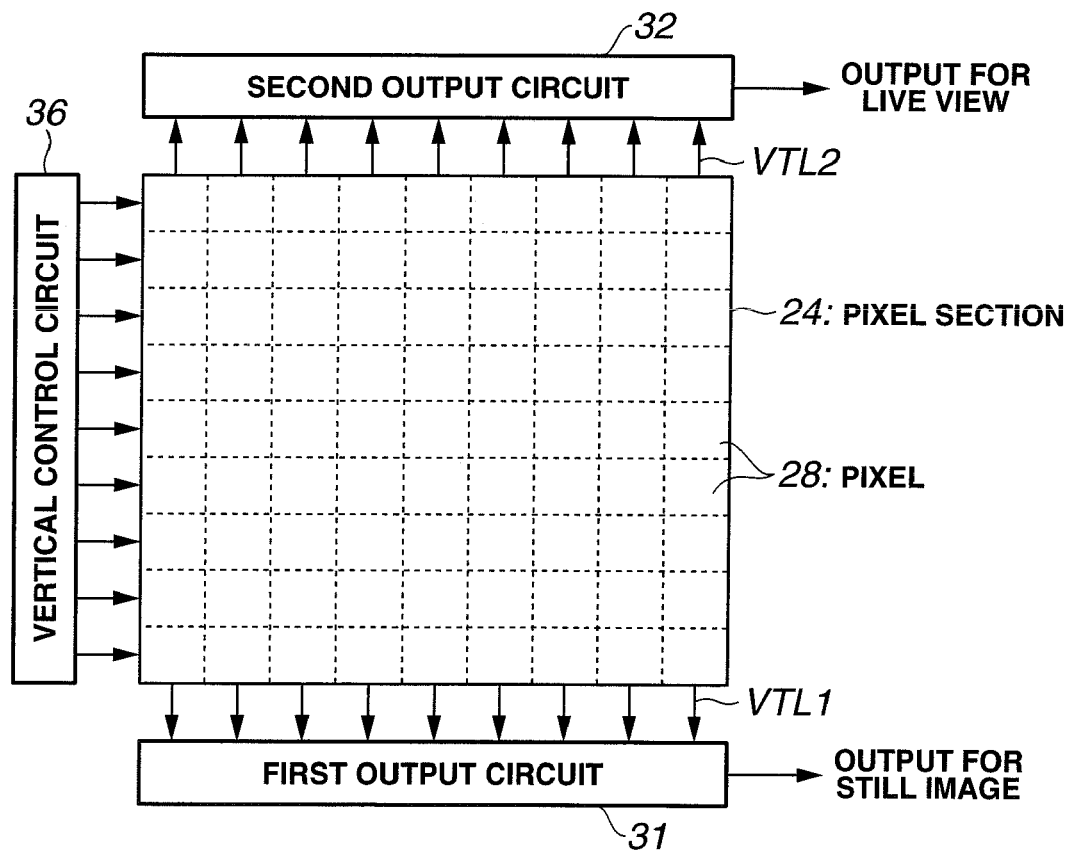
FIG. 15 is a diagram illustrating a configuration of an image pickup section according to Embodiment 2 of the present invention.
Figure 16:
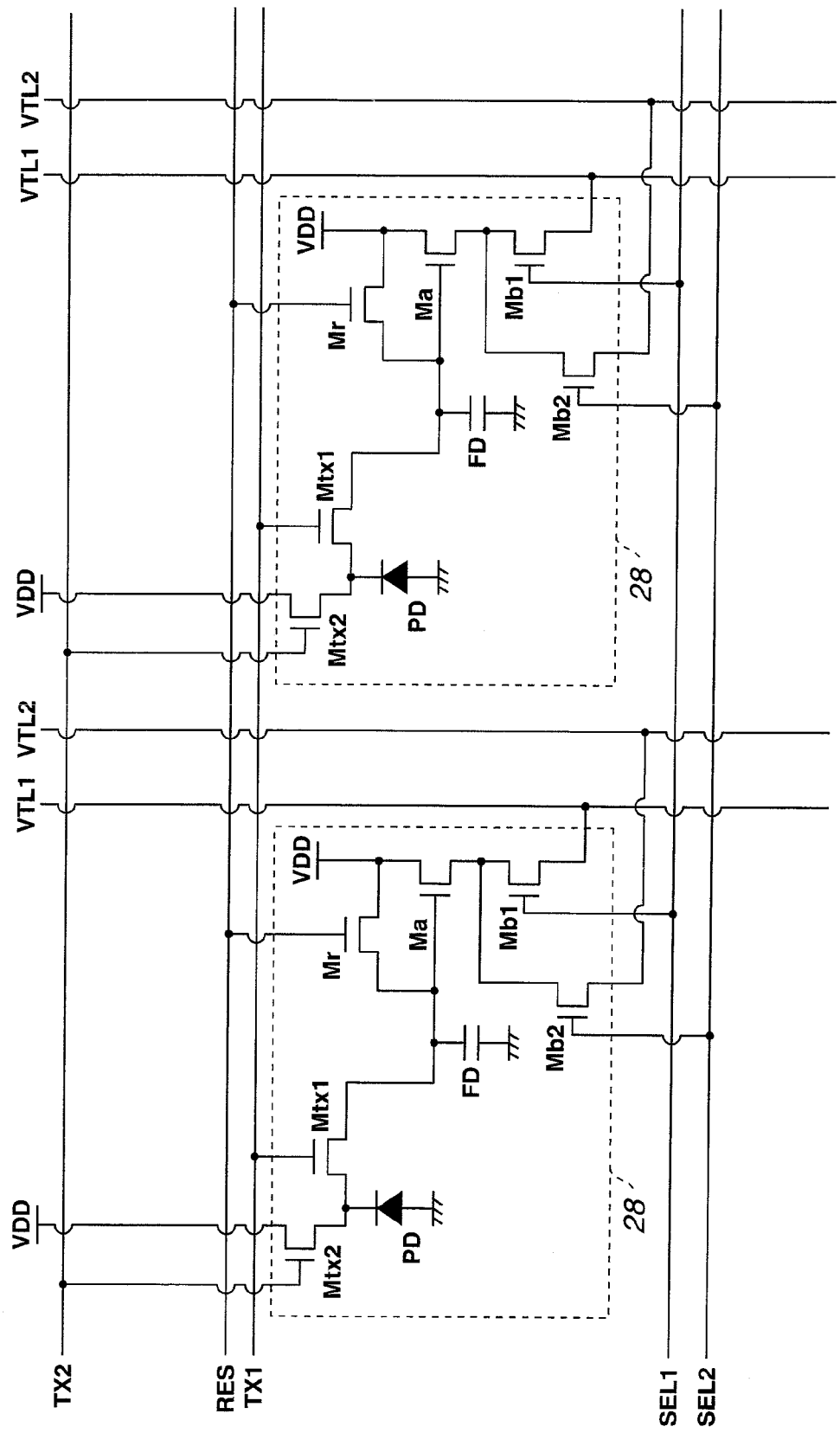
FIG. 16 is a circuit diagram illustrating an example of pixel configuration of a pixel section of an image pickup device according to Embodiment 2 of the present invention.
Figure 17:
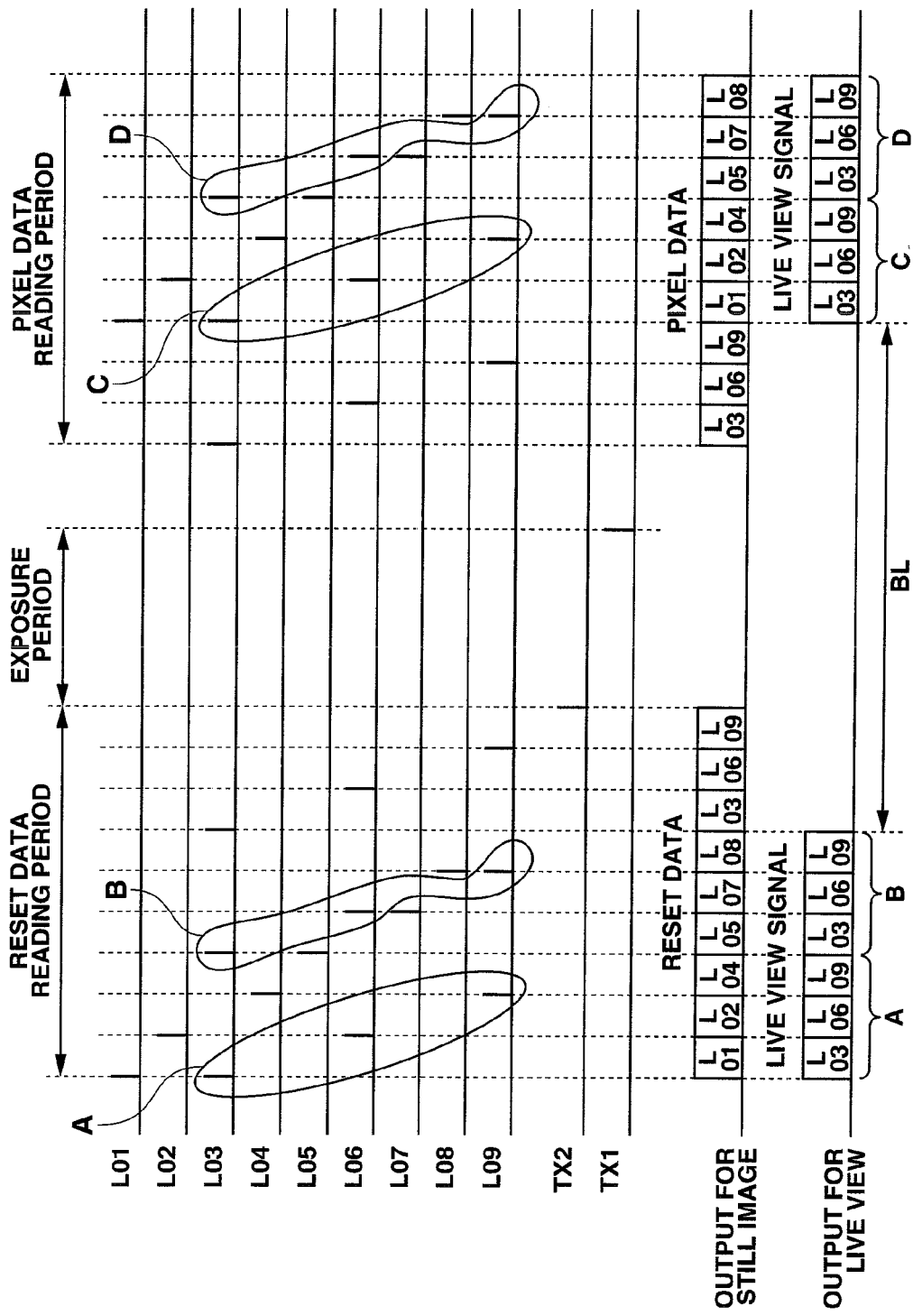
FIG. 17 is a timing chart illustrating an example of a first operation when the image pickup section is driven to pick up a still image through a global shutter using the second drive method according to Embodiment 2 of the present invention.
Figure 18:
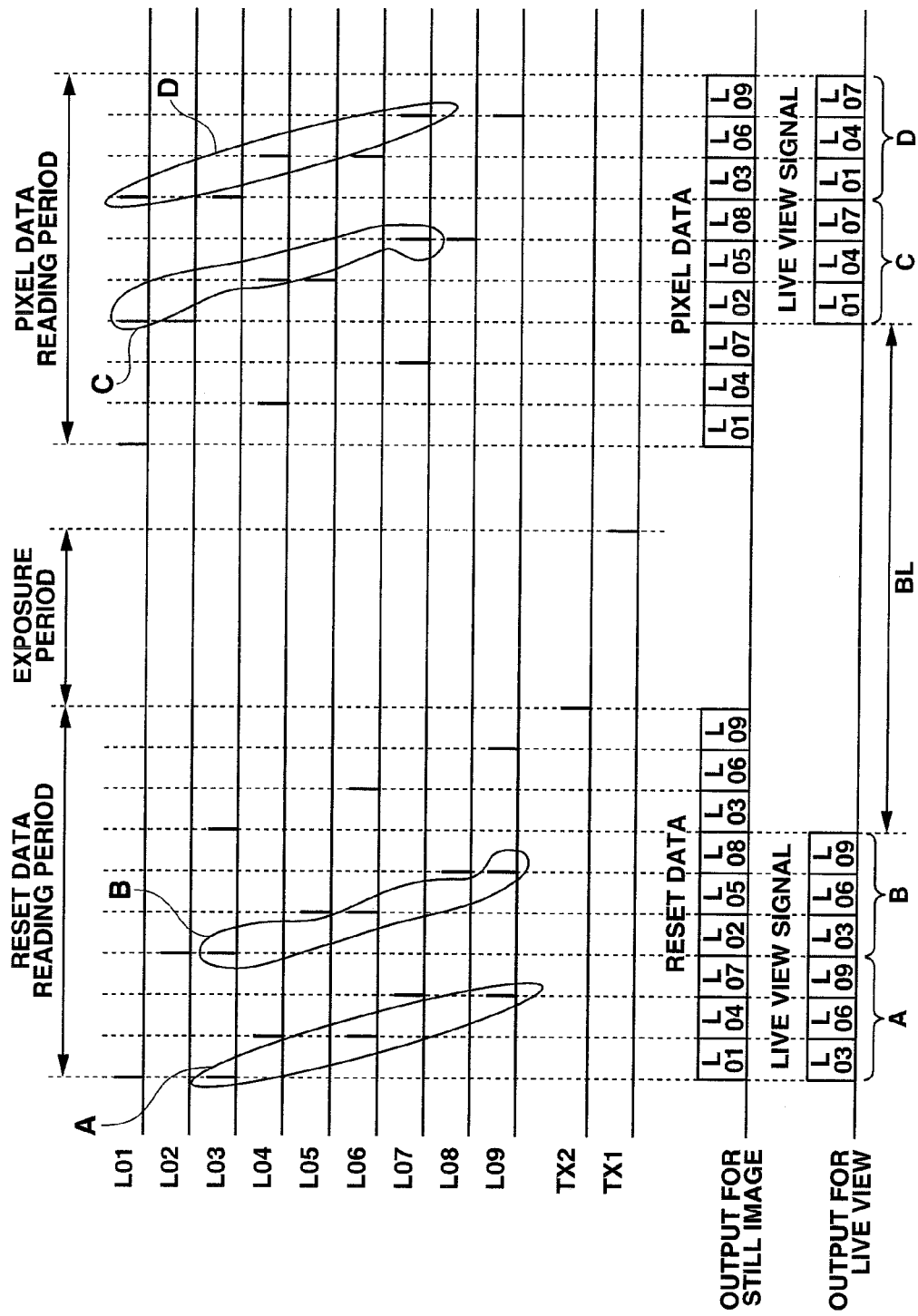
FIG. 18 is a timing chart illustrating an example of a second operation when the image pickup section is driven to pick up a still image through a global shutter using the second drive method according to Embodiment 2 of the present invention.

FIG. 15 to FIG. 18 illustrate Embodiment 2 of the present invention; FIG. 15 is a diagram illustrating a configuration of the image pickup section 2, FIG. 16 is a circuit diagram illustrating a configuration example of the pixel 28 in the pixel section 24 of the image pickup device 21, FIG. 17 is a timing chart illustrating an example of a first operation when the image pickup section 2 is driven to pick up a still image through a global shutter using a second drive method and FIG. 18 is a timing chart illustrating an example of a second operation when the image pickup section 2 is driven to pick up a still image through a global shutter using a second drive method.

In Embodiment 2, parts similar to those in aforementioned Embodiment 1 are assigned the same reference numerals, explanations thereof will be omitted and only differences will be mainly explained.

The image pickup section 2 of the present embodiment is designed to be able to read pixel data and reset data from the pixel section 24 from two output circuits and is configured as a so-called multi-line reading image pickup section.

That is, the pixel section 24 in which a plurality of pixels 28 are two-dimensionally arrayed receives signals applied in row (line) units by the vertical control circuit 36 that has multi-functions as a vertical scanning circuit, a reset control section and a signal reading control section and outputs signals from pixels of a selected row to any one of the vertical transfer lines VTL1 and VTL2 provided for each column, whichever is selected (also see FIG. 16).

All the vertical transfer lines VTL1 configured in the pixel section 24 are connected to a first output circuit 31. The first output circuit 31 includes, for example, the horizontal scanning circuit 27, the A/D conversion section 22 and the KTC noise elimination section 23 of the configuration shown in FIG. 2 (this does not, however, prevent the CDS section 25 from being included). A signal for a still image is designed to be outputted from the first output circuit 31.

All the vertical transfer lines VTL2 configured in the pixel section 24 are connected to a second output circuit 32. The second output circuit 32 includes, for example, the CDS section 25, the horizontal scanning circuit 27 and the A/D conversion section 22 of the configuration shown in FIG. 2 (this does not, however, prevent the KTC noise elimination section 23 from being included). A signal for a live view is designed to be outputted from the second output circuit 32.

Thus, the vertical control circuit 36 serves as both the live view data reading control section and the reset data/pixel data reading control section.

Next, a more detailed configuration of the pixel 28 will be explained with reference to FIG. 16.

First, as described above, the image pickup device 21 of the present embodiment is provided with the vertical transfer line VTL1 and the vertical transfer line VTL2 for each column.

In the pixel 28 shown in FIG. 16, the configuration of the photoelectric conversion section PD, the transistor Mtx2, transistor Mtx1, the signal storage section FD, the transistor Mr and the amplification transistor Ma is similar to that of the pixel 28 shown in FIG. 3.

However, the pixel 28 shown in FIG. 16 is provided with two transistors as signal charge reading sections connected to the amplification transistor Ma; a first selection transistor Mb1 (first signal charge reading section, reset signal reading section) and a second selection transistor Mb2 (second signal charge reading section, third signal charge reading section). The first selection transistor Mb1 is connected to the vertical transfer line VTL1 and is also connected to a signal line SEL1 to apply a first selection pulse. On the other hand, the second selection transistor Mb2 is connected to the vertical transfer line VTL2 and is also connected to a signal line SEL2 to apply a second selection pulse.

Therefore, charge stored in the signal storage section FD is outputted to the vertical transfer line VTL1 by applying a selection pulse to the signal line SEL1 or outputted to the vertical transfer line VTL2 by applying a selection pulse to the signal line SEL2. Outputting to the two different lines; outputting to the vertical transfer line VTL1 and outputting to the vertical transfer line VTL2, can be simultaneously performed.

Next, a first operation example when the image pickup section 2 is driven to pick up a still image through a global shutter using the second drive method will be explained with reference to FIG. 17. For simplicity, a case will be explained in FIG. 17 and next FIG. 18 assuming that the total number of horizontal lines provided in the pixel section 24 is 9 (arranged in order of lines L01 to L09 from the top end to the bottom end of the pixel section 24).

Moreover, in the example shown in FIG. 17, suppose LV lines are fixed to L03, L06 and L09. Therefore, non-LV lines are lines L01, L02, L04, L05, L07 and L08.

When a reset data reading period is started by pressing the release button, the transistor Mr is turned ON for line L01 to reset the signal storage section FD first, and the first selection transistor Mb1 is turned ON to read reset data. At the same time, the transistor Mr is turned ON for line L03 to reset the signal storage section FD, the second selection transistor Mb2 is turned ON to read reset data, and the transistor Mtx1 is turned ON to transfer pixel data from the photoelectric conversion section PD to the signal storage section FD, and the second selection transistor Mb2 is turned ON to read pixel data.

Therefore, this operation causes still image reset data of line L01 as output for still image and LV image data of line L03 as output for live view to be outputted from the first output circuit 31 and the second output circuit 32 respectively. Here, reading of the LV image data from line L03 more specifically includes processing of reading reset data and pixel data consecutively and causing the CDS section 25 included in the second output circuit 32 to subtract the former from the latter.

Next, by performing similar processing, still image reset data is read from line L02 and LV image data is read from line L06.

Furthermore, likewise, still image reset data is read from line L04 (since line L03 is an LV line, reading thereof is not performed yet at this time) and LV image data is read from line L09.

In this way, LV image data A corresponding to one frame is outputted, and it is thereby possible for the display section 5 to perform a live view display in the next display frame.

Likewise, still image reset data is read from line L05 and LV image data is read from line L03, and still image reset data is read from line L07 and LV image data is read from line L06, still image reset data is read from line L08 and LV image data is read from line L09, and LV image data B corresponding to the next one frame is thereby outputted.

Since reading of still image reset data on non-LV lines is completed at this time, reading of still image reset data on LV lines is then started. Therefore, from this time onward, the live view display is not updated until the exposure period is finished and it is possible to acquire LV image data from the LV lines for the pixel data reading period or a period BL for blackout starts (however, the period BL shown in FIG. 17 is displayed on a time chart for output for live view, but the actual LV display is performed in a display frame next to the frame in which LV image data is acquired, and therefore the actual LV display is shifted by approximately one display frame from the period BL on the display on the display section 5. The same will apply to the following explanations). That is, at the end of this reset data reading period, still image reset data is read from line L03, still image reset data is read from line L06 and still image reset data is read from line L09 in that order.

After that, exposures of all pixels are simultaneously started by simultaneously turning ON the transistors Mtx2 of all pixels on all lines via the signal line TX2 to reset the photoelectric conversion section PD and then simultaneously turning OFF the transistors Mtx2. Here, the transistor Mtx2 is turned ON only immediately before starting an exposure, but the transistors Mtx2 may be turned ON to reset the photoelectric conversion section PD except the period during which the photoelectric conversion section PD needs to be exposed for live view or photographing.

After a lapse of a predetermined exposure period, a transfer pulse is simultaneously applied to the transistors Mtx1 of all pixels on all lines via the signal line TX1, pixel charge is thereby transferred to the signal storage sections FD and exposures of all pixels are simultaneously finished. The signal of the signal line TX1 shown in FIG. 17 describes only timing of simultaneously turning ON the transistors Mtx1 of all the pixels (that is, when live view pixel charge is transferred from the photoelectric conversion section PD to the signal storage section FD, since the timing of turning ON the transistor Mtx1 differs from one line to another read for a live view, illustrations thereof are omitted).

Next, a pixel data reading period starts.

To enable LV image data to be acquired from the LV lines at the soonest possible time, reading of still image pixel data on the LV lines is started first. That is, at the beginning of this pixel data reading period, still image pixel data is read from line L03, still image pixel data is read from line L06, and still image pixel data is read from line L09 in that order. Therefore, upon completion of this reading, the period BL ends and LV image data can be acquired from this time on.

Since the present embodiment assumes that images for a still image and images for a live view have different output systems, in the flow shown in FIG. 17, image data α for a live view is not generated based on the still image pixel data read from the LV line at the beginning of the pixel data reading period, but a live view may be displayed from a time one display frame earlier after generating the image data α.

Next, still image pixel data is read from line L01, LV image data is read from line L03, still image pixel data is read from line L02 and LV image data is read from line L06 and still image pixel data is read from line L04 and LV image data is read from line L09, and LV image data C corresponding to one frame is thereby outputted.

Likewise, still image pixel data is read from line L05, LV image data is read from line L03, still image pixel data is read from line L07 and LV image data is read from line L06, still image pixel data is read from line L08 and LV image data is read from line L09, and LV image data D corresponding to the next one frame is thereby outputted.

Since reading of still image pixel data on all lines is completed at this time, image pickup of a still image is completed and a normal live view display will be performed from this time on.

Next, a second operation example where the image pickup section 2 is driven to pick up a still image through a global shutter using the second drive method will be explained with reference to FIG. 18.

As explained in aforementioned Embodiment 1 with reference to FIG. 11 and FIG. 12, when the time after reading of reset data until reading of pixel data varies from one line to another, the amount of noise resulting from a dark current varies from one line to another. This is likewise applicable to the flow of processing shown in FIG. 17. Therefore, it is a flow of processing shown in FIG. 18 that results from changing the flow of processing shown in FIG. 17 so that the amount of noise on each line becomes basically constant.

That is, in the example shown in FIG. 18, unlike the example shown in FIG. 17, LV lines (lines L03, L06, L09) for which LV image data is acquired before an exposure period and LV lines (lines L01, L04, L07) for which LV image data is acquired after the exposure period are made to differ from each other so as not to overlap with each other. Here, the LV lines before the exposure period and the LV lines after the exposure period are lines selected at certain line intervals so as to cover the entire surface of the pixel section 24 as uniformly as possible.

When the reset data reading period is started by pressing the release button, reset data of the LV lines after the exposure period are read first. That is, the still image reset data is read from line L01 and LV image data is read from line L03, and still image reset data is read from line L04, LV image data is read from line L06, and still image reset data is read from line L07 and LV image data is read from line L09, and reset data of LV lines after the exposure period is thereby outputted and LV image data A corresponding to one frame is outputted.

Next, still image reset data is read from line L02, LV image data is read from line L03, still image reset data is read from line L05, LV image data is read from line L06, and still image reset data is read from line L08, LV image data is read from line L09, and reset data and LV image data B corresponding to the next one frame are thereby outputted.

At the end of the reset data reading period, still image reset data is read from line L03, still image reset data is read from line L06 and still image reset data is read from line L09.

The processing for the next exposure period is similar to the processing shown in FIG. 17.

When the exposure period ends, next, a pixel data reading period starts.

First, still image pixel data on the LV lines (lines L01, L04, L07) after the exposure period for which reset data have been read first for the reset data reading period are sequentially read. From this time on, LV image data can be acquired from the LV lines after the exposure period.

In the flow shown in FIG. 18, image data α for a live view may also be generated based on the still image pixel data read from the LV lines at the beginning of the pixel data reading period and a live view may be displayed from a time one display frame earlier.

Next, still image pixel data is read from line L02, LV image data is read from line L01, still image pixel data is read from line L05, LV image data is read from line L04, still image pixel data is read from line L08, LV image data is read from line L07, and LV image data C corresponding to one frame is thereby outputted.

Likewise, still image pixel data is read from line L03, LV image data is read from line L01, still image pixel data is read from line L06, LV image data is read from line L04, still image pixel data is read from line L09, LV image data is read from line L07, and LV image data D corresponding to the next one frame is thereby outputted.

At this time, reading of still image pixel data of all lines is completed, and therefore image pickup of the still image is completed and a normal live view display will be performed from this time on.

As is obvious from FIG. 18, the processing as shown in FIG. 18 can be regarded as dividing the pixel section 24 into a plurality of fields (line groups or pixel groups) to perform reading and using, for example, one of the plurality of fields for LV reading for a certain time. That is, for the reset data reading period before the exposure, when reset data of another field is read, the last read field is used to read LV pixel data. Furthermore, for the pixel data reading period after the exposure, when the pixel data of another field is read, the first read field is used to read the LV pixel data.

Performing the processing as shown in FIG. 18 can prevent degradation of image quality caused by the amount of noise varying depending on lines.

The present embodiment reads images for a still image from one of multi-line reading output systems and reads images for a live view from another output system, and therefore when a line is different, simultaneous reading is possible, and the reset data reading period and the pixel data reading period never become longer than those of the first drive method of Embodiment 1. Therefore, there is no compelling necessity to select the first drive method or the second drive method depending on the photographing mode or AF mode.

However, when the first output circuit 31 and the second output circuit 32 have the same configuration (that is, when the CDS section 25 is included in the first output circuit 31 and the KTC noise elimination section 23 is included in the second output circuit 32 as described above), it is possible to perform both outputting for a live view from the first output circuit 31 and outputting for still images from the second output circuit 32. Therefore, when performing outputting for still images using the first drive method in the present embodiment, it is possible to read two lines from the first output circuit 31 and the second output circuit 32 and thereby enhance the reading speed. Therefore, when two-line reading using the first drive method is adopted, it is effective to select the first drive method or second drive method depending on the photographing mode or AF mode.

A case with two-line reading has been described above as an example of multi-line reading, but multi-line reading can naturally be three or more line reading.

According to such Embodiment 2, the configuration provided with an image pickup section based on a multi-line reading scheme can exert substantially the same effects as those of aforementioned Embodiment 1. Moreover, adopting multi-line reading can also shorten the reading period (reset data reading period and/or pixel data reading period) compared to Embodiment 1. Unlike Embodiment 1, LV image data can be acquired during a reset data reading period and pixel data reading period at a rate of once every one display frame.

Figure 19:
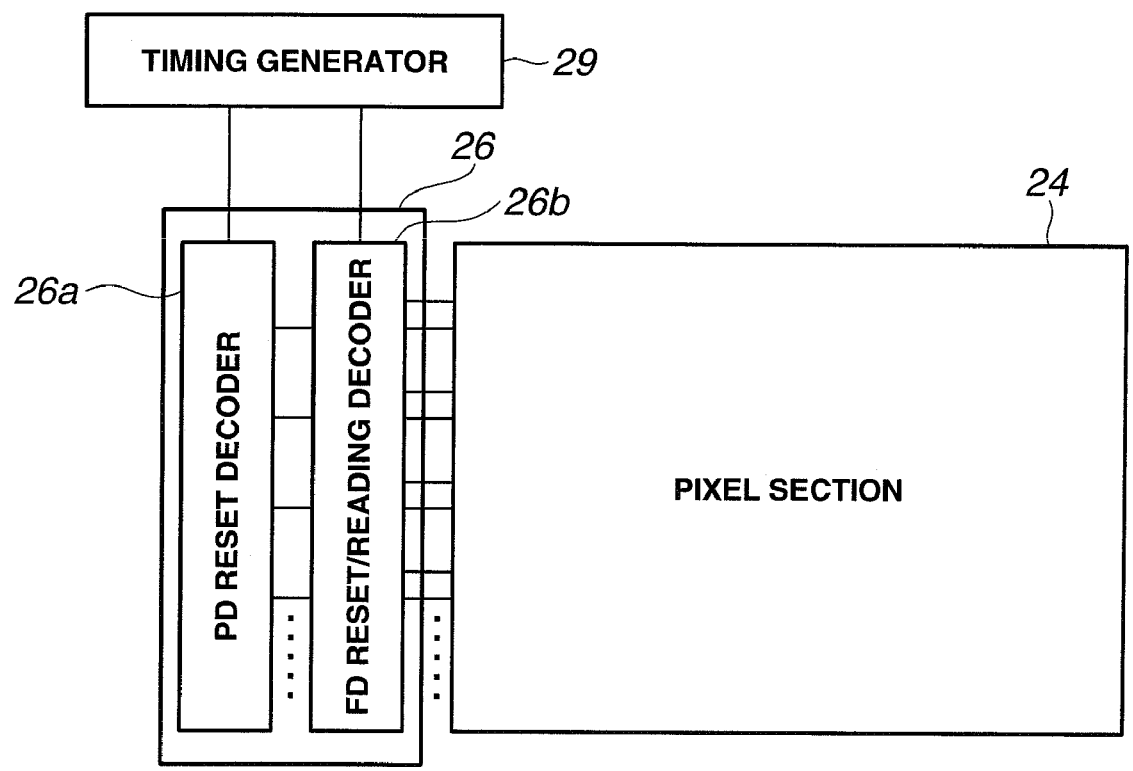
FIG. 19 is a block diagram illustrating a configuration of a vertical control circuit according to a first technique applied to the above embodiments.

Next, a first technique applicable to the aforementioned embodiments will be explained with reference to FIG. 19 and FIG. 20. FIG. 19 is a block diagram illustrating a configuration of the vertical control circuit 26 and FIG. 20 is a timing chart illustrating an operation example when LV display is performed before and after a still image is picked up through a global shutter using the first technique.

Figure 20:
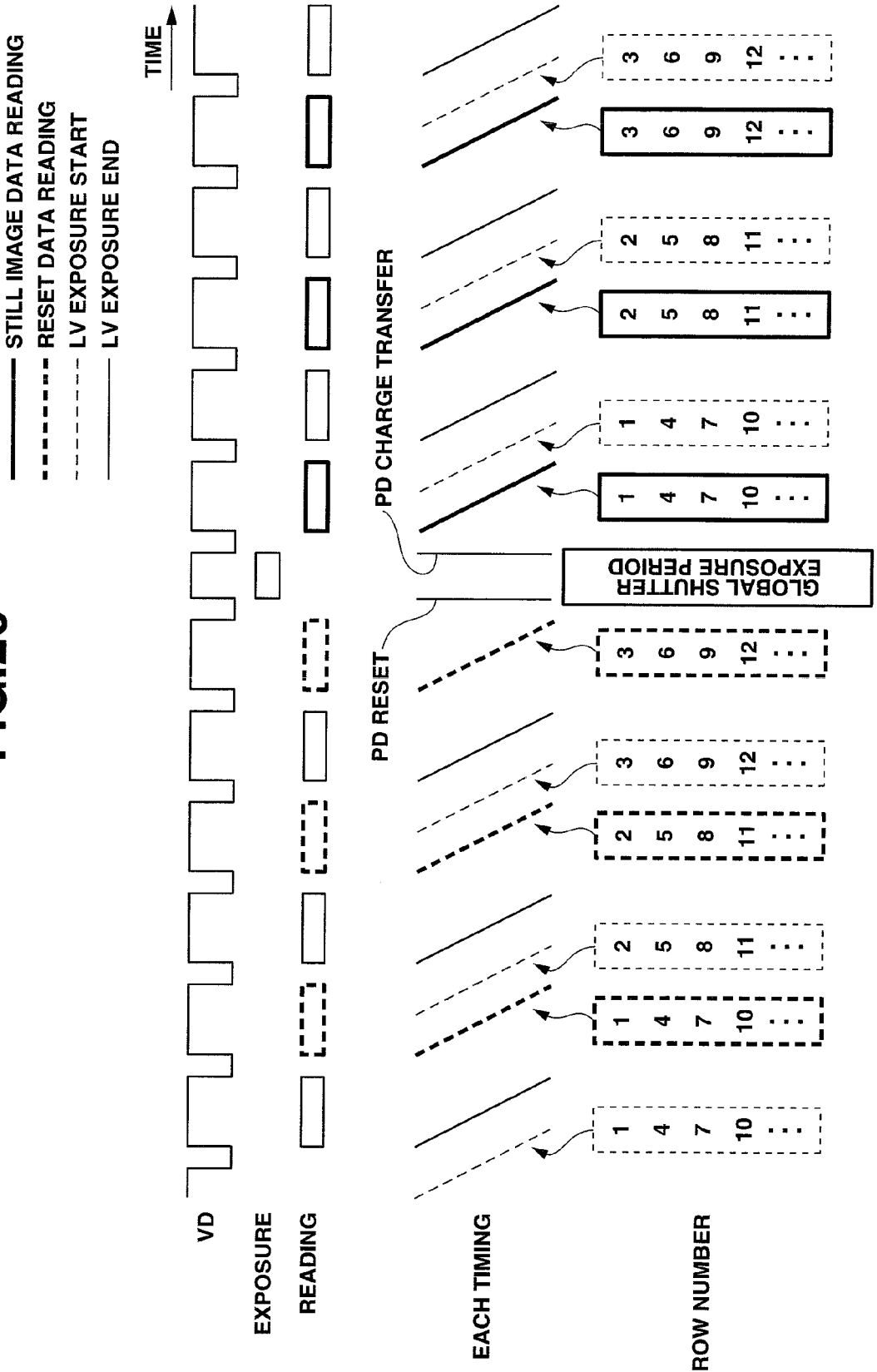
FIG. 20 is a timing chart showing an operation example when LV display is performed before and after a still image is picked up through a global shutter using the first technique applied to the above described embodiments.

As explained in aforementioned Embodiment 1 with reference to FIG. 11 and FIG. 12, the first technique starts an LV exposure (see diagonal lines shown by fine dotted lines in FIG. 20) so as to temporally overlap with divided reading of reset data (see diagonal lines shown by thick dotted lines in FIG. 20) or divided reading of still image data (see diagonal lines shown by thick lines in FIG. 20). As described above, this makes it possible to increase the LV exposure time and provides an advantage, when the object has low luminance, of being able to obtain a brighter LV image or an LV image with a reduced signal amplification gain with less noise.

Furthermore, the first technique realizes the division of the pixels 28 of the pixel section 24 by the second reset section (transistor Mr) and the selection transistor Mb into a plurality of pixel groups which do not overlap with each other to read reset data, through a division into equal parts in units of the number of lines making up a predetermined pixel group in which an LV signal charge read by the second signal charge reading section (second selection transistor Mb) is generated.

In addition, according to the first technique, the first signal charge reading section (selection transistor Mb) reads still image data by dividing pixels in the pixel section 24 into a plurality of pixel groups which do not overlap with each other and such a division is realized through a division into equal parts in units of the number of lines making up a predetermined pixel group in which the LV signal charge read by the second signal charge reading section (second selection transistor Mb) is generated.

That is, as shown in FIG. 19 first, the vertical control circuit 26 is configured by including a PD reset decoder 26a and an FD reset/reading decoder 26b. The PD reset decoder 26a and FD reset/reading decoder 26b are designed to receive a timing control signal from a timing generator 29.

Here, the PD reset decoder 26a is intended to apply a reset pulse for resetting the photoelectric conversion section PD in the pixel 28 to the transistor Mtx2 via the signal line TX2.

On the other hand, the FD reset/reading decoder 26b is intended to apply a reset pulse for resetting the signal storage section FD in the pixel 28 to the transistor Mr via the signal line RES and at the same time apply a selection pulse for reading a signal charge from the signal storage section FD to the selection transistor Mb via the signal line SEL.

Next, to be more specific, the division of the pixel section 24 into a plurality of equal pixel groups will be performed as follows.

First, suppose the number of lines of the pixel section 24 is n and the number of lines for reading a live view image is m ($m \geq n$). In this case, suppose the division number to perform divided reading on a still image signal is n/m. Here, for simplicity of explanations below, suppose n/m is an integer equal to or greater than 2. The pixels from the first row to the nth row are then divided into congruent pixel groups using (n/m) as a modulus [that is, the pixels are divided into groups having the same n mod (n/m)]. That is, the pixel section 24 is divided into a plurality of groups so that remainders resulting from dividing a row number by (n/m) become equal. Here, since the remainder is any one of 1 to $\{(n/m)-1\}$ and 0, it is evident that the pixel section 24 is divided into a total of (n/m) groups, that is, a group whose remainder is 1, . . . , a group whose remainder is $\{(n/m)-1\}$ and a group whose remainder is 0.

When n=3000 (rows), m=1000 (rows) are taken as a specific example, the division number n/m=3000/1000=3. The pixel section 24 is then divided into the following three groups:

(Group 1): Group whose remainder is 1: first row, fourth row, seventh row, . . . , 2998th row
(Group 2): Group whose remainder is 2: second row, fifth row, eighth row, . . . , 2999th row
(Group 3): Group whose remainder is 0: third row, sixth row, ninth row, . . . , 3000th row In such an example, data of a group for which divided reading of still image reset data has not been performed is used for the live view image before a global exposure.

As a specific example, data can be read in the following sequence.

Group 1 (live view image)
Group 1 (divided reading still image reset data)
Group 2 (live view image)
Group 2 (divided reading still image reset data)
Group 3 (live view image)
Group 3 (divided reading still image reset data)

Therefore, it is possible to use the same waveform for timing control signals outputted from the timing generator 29 to the PD reset decoder 26a that applies a reset pulse to the signal line TX2 to start an exposure of a live view image, the FD reset/reading decoder 26b that applies a reset pulse to the signal line RES and a selection pulse to the signal line SEL to read still image reset data except at a transmission time. Therefore, the timing generator 29 needs only to transmit a timing control signal to be transmitted to the preceding one to the following one with a time delay, and thereby a publicly known technique can be used for the delay circuit and thereby simplify the circuit configuration.

On the other hand, data of the group for which divided reading of still image data has already been performed is used for the live view image subjected to a global exposure.

As specific examples, data may be read in order:
Group 1 (divided reading still image data)
Group 1 (live view image)
Group 2 (divided reading still image data)
Group 2 (live view image)
Group 3 (divided reading still image data)
Group 3 (live view image)

Therefore, it is possible to use the same waveform for timing control signals outputted from the timing generator 29 to the PD reset decoder 26a that applies a reset pulse to the signal line TX2 to start an exposure of a live view image and the FD reset/reading decoder 26b that applies a selection pulse to the signal line SEL to read still image data except at a transmission time in this case, too. Therefore, the timing generator 29 needs only to transmit a timing control signal to be transmitted to the preceding one to the following one with a time delay, and thereby a publicly known technique can be used for the delay circuit and thereby simplify the circuit configuration.

Next, a second technique applicable to the aforementioned embodiments will be explained with reference to FIG. 21 to FIG. 32.

Figure 21:
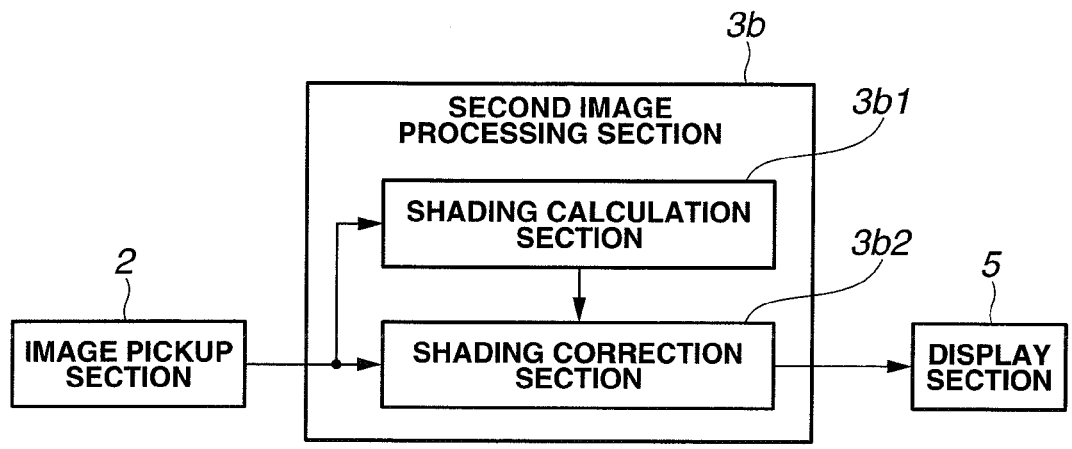
FIG. 21 is a block diagram illustrating a configuration of a second image processing section according to a second technique applied to the above described embodiments.

FIG. 21 is a block diagram illustrating a configuration of a second image processing section 3b.

The second image processing section 3b is provided with a shading calculation section 3b1 that calculates a correction value to correct shading based on a signal outputted from the image pickup section 2 and a shading correction section 3b2 that corrects shading of the LV image data outputted from the image pickup section 2 based on the correction value calculated by the shading calculation section 3b1, and is intended to generate second image data for image display based on the signal charge corrected by the shading correction section 3b2 and output the second image data to the display section 5. In the configuration example shown in FIG. 21, the shading calculation section 3b1 and the shading correction section 3b2 are provided inside the second image processing section 3b, but the present invention is not limited to this configuration and at least one of the shading calculation section 3b1 and the shading correction section 3b2 may be provided outside the second image processing section 3b.

When a normal live view is in progress, the shading calculation section 3b1 is intended to calculate a correction value for correcting shading based on an OB region (optical black region) (which will be described later) related to LV image data acquired in real time or an OB region signal related to LV image data acquired at a preceding time. On the other hand, when a live view is in progress simultaneously with divided reading of reset data or still image data when continuous shooting of a still image is started or the like, the shading calculation section 3b1 is intended to calculate a correction value to correct shading based on the reset data signal.

Figure 22:
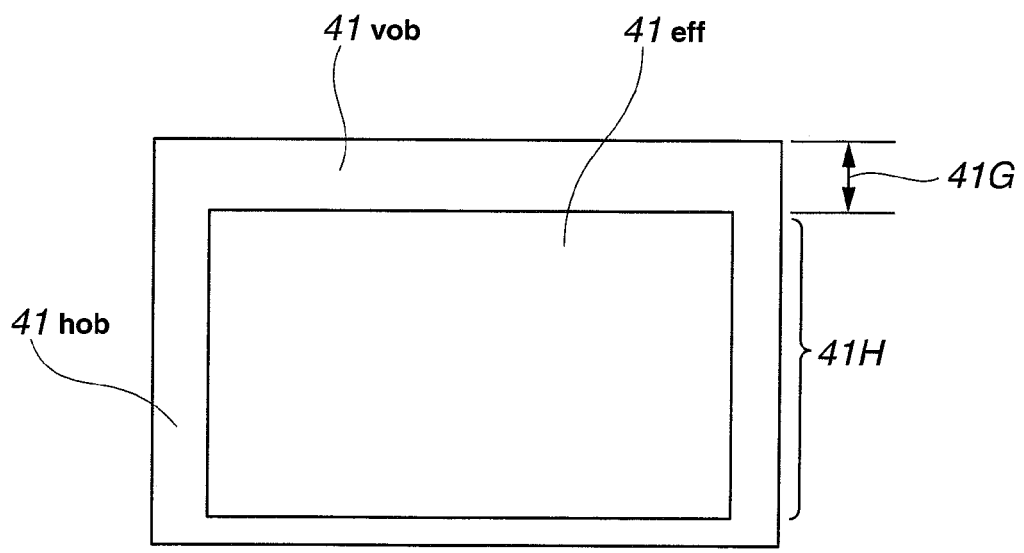
FIG. 22 is a diagram illustrating data related to a full-size still image read from a pixel section according to the second technique applied to the above described embodiments.
Figure 23:
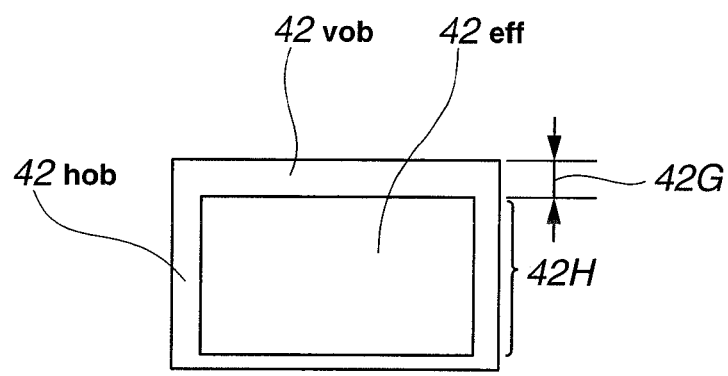
FIG. 23 is a diagram illustrating data related to a live view image read from the pixel section according to the second technique applied to the above described embodiments.

Next, FIG. 22 is a diagram illustrating data related to a full-size still image read from the pixel section 24 and FIG. 23 is a diagram illustrating data related to a live view image read from the pixel section 24.

Figure 33:
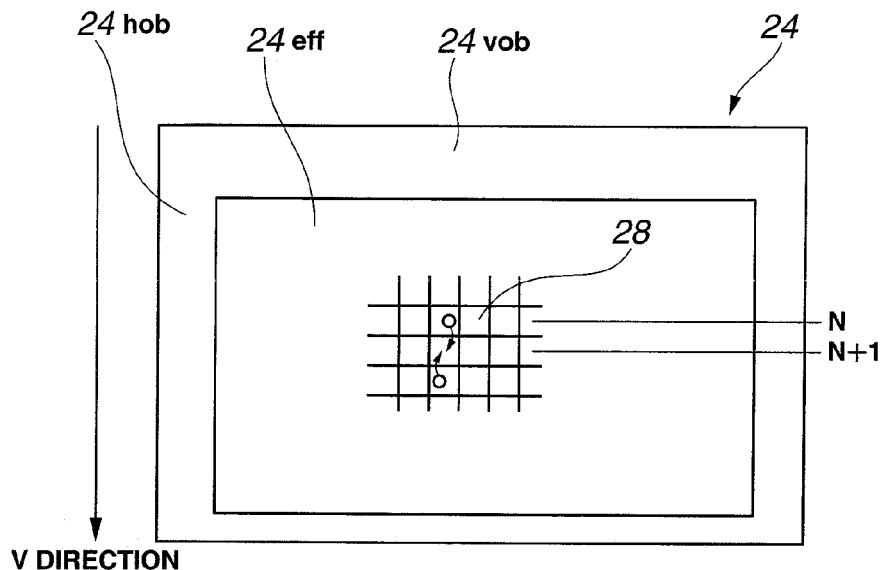
FIG. 33 is a diagram illustrating a situation in which blooming occurs in the pixel section according to a third technique applied to the above described embodiments.

As shown in FIG. 33, which will be described later, the pixel section 24 is provided with an effective region 24eff which is irradiated with light and photoelectrically converted and an OB region provided around the effective region 24eff as a light-shielding region. Of these regions, the OB region is divided into a VOB region 24vob provided in a belt shape in the horizontal direction above (or below) the effective region 24eff and a HOB region 24hob provided in a belt shape in the vertical direction on the left (or right) of the effective region 24eff.

Therefore, the data read from the pixel section 24 in correspondence with the full-size still image includes effective region data 41eff, VOB region data 41vob and HOB region data 41hob as shown in FIG. 22. Here, suppose the number of rows 41H of the effective region data 41eff is 3000 rows and the number of rows 41G of the VOB region data 41vob is 64 rows as an example.

On the other hand, as shown in FIG. 23, the data read from the pixel section 24 in correspondence with the live view image also includes effective region data 42eff, VOB region data 42vob and HOB region data 42hob as with the data read in correspondence with the full-size still image. However, both the effective region and OB region of the live view image are read through thinning-out reading and addition reading or the like and the number of pixels read is smaller than that of the full-size still image. Here, suppose the size of the live view image is ½ of the vertical size and ½ of the horizontal size of the full-size image (that is, the area is ¼). In this case, the number of rows 42H of the effective region data 42eff is 1500 rows and the number of rows 42G of the VOB region data 42vob is 32 rows.

Figure 24:
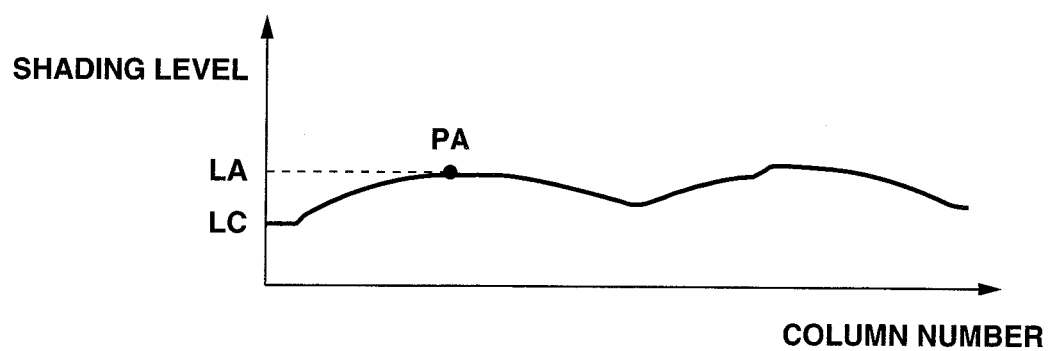
FIG. 24 is a diagram illustrating an example of a shading level related to a full-size still image according to the second technique applied to the above described embodiments.
Figure 25:
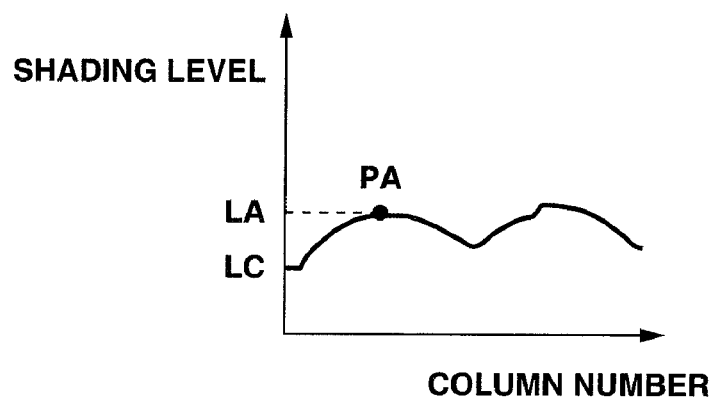
FIG. 25 is a diagram illustrating an example of a shading level related to a live view image according to the second technique applied to the above described embodiments.

Next, FIG. 24 is a diagram illustrating an example of a shading level related to the full-size still image and FIG. 25 is a diagram illustrating an example of a shading level related to the live view image.

MOS-type image pickup devices such as CMOS are generally known to produce dark shading in the horizontal direction as fixed pattern noise (FPN). This shading is caused by a difference in a signal transfer characteristic in sensor driving. More specifically, drive signals are applied to the image pickup device from both left and right ends, but since the length of the signal line until a drive signal is transferred differs depending on the position in the left/right direction (column position) of a pixel, the transfer time of the drive signal differs between a pixel in the center in the left/right direction and a pixel in the peripheral part of the pixel section (to be more specific, the transfer of the drive signal to the center is temporally slower than the transfer of the drive signal to the peripheral part). Furthermore, the length of the signal line until the signal is transferred also differs depending on the position in the left/right direction of a pixel, and impedance of the signal line or the like differs depending on the difference in length. The difference in impedance or the like causes the drive signal transferred to the pixel in the center to have a waveform slightly smoother than that of the drive signal transferred to the pixel in the peripheral part (e.g., the edge of the signal becomes smoother or the like) and the ON/OFF timing of a transistor or the like is shifted by the amount of smoothing of the waveform.

This entails a difference in exposure time between the center and the peripheral part in the left/right direction of the pixel section 24 and this appears as so-called "dark shading" in a captured image. FIG. 24 shows a situation of such dark shading on one line with respect to a full-size still image and FIG. 25 shows that with respect to a live view image. In the examples shown in FIG. 24 and FIG. 25, a shading level LA at a peak position PA of the shading level is a higher value than that of a clamp level LC. However, when no correction is made, the shading level LA in the full-size still image is basically the same as the shading level LA in the live view image.

Such dark shading is generally corrected based on dark signal data in the VOB region. That is, during a normal live view, the shading calculation section 3b1 performs statistical processing using a digital low pass filter such as an IIR filter (the IIR filter is a kind of weighted averaging processing in the time direction) on dark signal data corresponding to a plurality of rows in the VOB region in the column direction, thereby calculates the level of dark shading in the horizontal direction from the first column to the final column and uses the calculated dark shading level as a correction value. The shading correction section 3b2 then subtracts the correction value calculated from the data in the effective region or the like to thereby correct dark shading.

Figure 26:
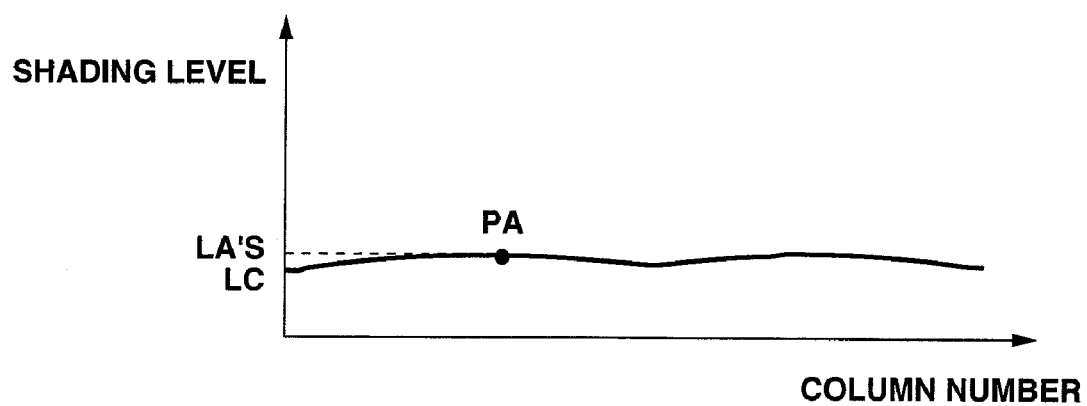
FIG. 26 is a diagram illustrating an example of a corrected shading level related to a full-size still image according to the second technique applied to the above described embodiments.
Figure 27:
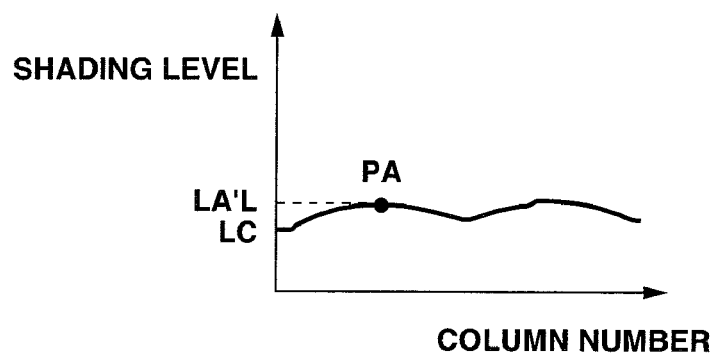
FIG. 27 is a diagram illustrating an example of a corrected shading level related to a live view image according to the second technique applied to the above described embodiments.

A situation in which dark shading is corrected through such processing will be explained with reference to FIG. 26 and FIG. 27. Here, FIG. 26 is a diagram illustrating an example of the corrected shading level related to a full-size still image and FIG. 27 is a diagram illustrating an example of the corrected shading level related to a live view image. A shading calculation section and a shading correction section are also provided in the first image processing section 3a as with the second image processing section 3b so that shading correction related to a still image can be performed.

As illustrated in the figure, a shading level LA'S of a peak position PA related to the full-size still image has a lower value than a shading level LA'L of the peak position PA related to the live view image. This is because when a correction value is calculated, for example, VOB region data 41vob corresponding to 64 rows is used in the full-size still image as described above, whereas VOB region data 42vob corresponding to 32 rows, for example, are used in the live view image as described above, and the full-size still image therefore has a correction value with higher statistical reliability than the live view image.

Thus, since VOB region data with a greater number of rows may be used to improve reliability of the correction value, VOB region data of a plurality of frames including VOB region data of the frame image and VOB region data of frame images acquired earlier than that are used to obtain a correction value related to a certain frame image in a moving imaged, continuous shooting of a still image or the like of, for example, a video image or still image.

Figure 28:
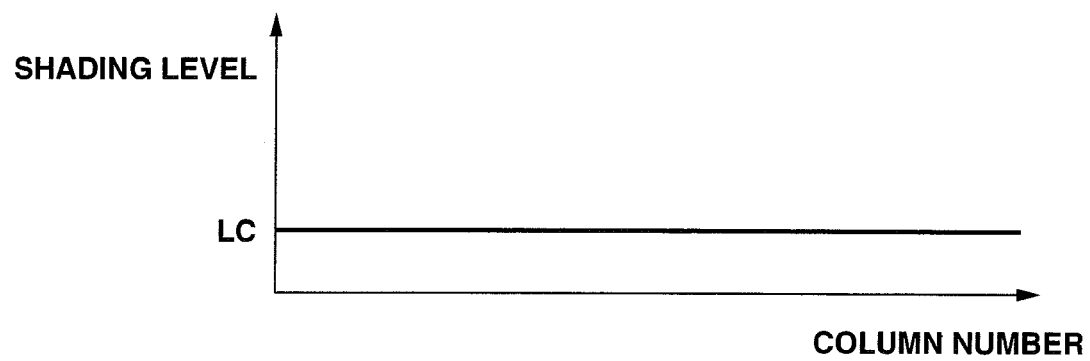
FIG. 28 is a diagram illustrating a shading correction result when one still image is created from two images obtained by reset data reading and still image data reading according to the second technique applied to the above described embodiments.

FIG. 28 is a diagram illustrating a result of shading correction when one still image is created from two images obtained through reset data reading and still image data reading. With a still image, the shading level can be satisfactorily corrected by carrying out such subtraction processing on two images (in this case, a correction value need not be calculated through digital processing through an IIR filter or the like using VOB region data).

However, it is pointed out here that an image pickup device capable of generating a still image without carrying out general two-image subtraction adopts a technique of dummy reading on a sufficient number of lines (e.g., 400 lines) to generate a shading correction value prior to still image data reading to compensate for the shortage of VOB lines.

On the other hand, since the live view image is smaller than the full-size still image as described above, the VOB region data related to the live view image has a smaller number of rows and obtaining correction effects similar to those of a full-size still image requires a live view image of a greater number of frames. Therefore, a live view image immediately after a live view is started in a continuous shooting mode has greater image quality degradation due to shading.

Thus, this second technique is intended to correct shading more effectively also for a live view image immediately after a continuous shooting mode is started.

That is, with the configuration shown in FIG. 3 and FIG. 16 in which five transistors are provided within one pixel, still image reset data is read before performing a global exposure and still image data is read after performing the global exposure.

Therefore, the shading calculation section 3b1 shown in FIG. 21 calculates shading in a row direction based on statistical values of reset signals of a plurality of pixels belonging to the same column in a still image reset signal read by the reset signal reading section (selection transistor Mb) when a live view is performed simultaneously with divided reading of reset data and divided reading of still image data caused by a start of continuous shooting or the like. An example of statistical values is an average value. Here, the average value may be any one of simple average value and weighted average value or the like. However, the statistical values are not limited to average values, but median values, modes and other statistical values may be widely used.

Furthermore, the shading correction section 3b2 is intended to correct (to be more specific, subtract a correction value calculated as shading from the signal charge) the signal charge read for LV by the second signal charge reading section (selection transistor Mb) based on shading calculated by the shading calculation section 3b1.

Figure 29:
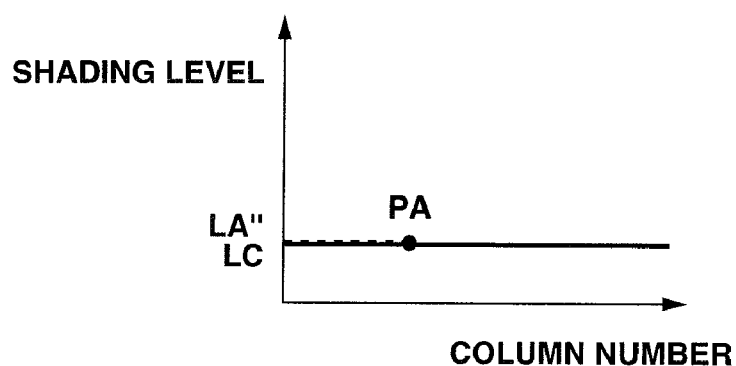
FIG. 29 is a diagram illustrating a result of correcting a shading level with a shading correction value calculated for a live view image based on reset data obtained through divided reading according to the second technique applied to the above described embodiments.
Figure 30:
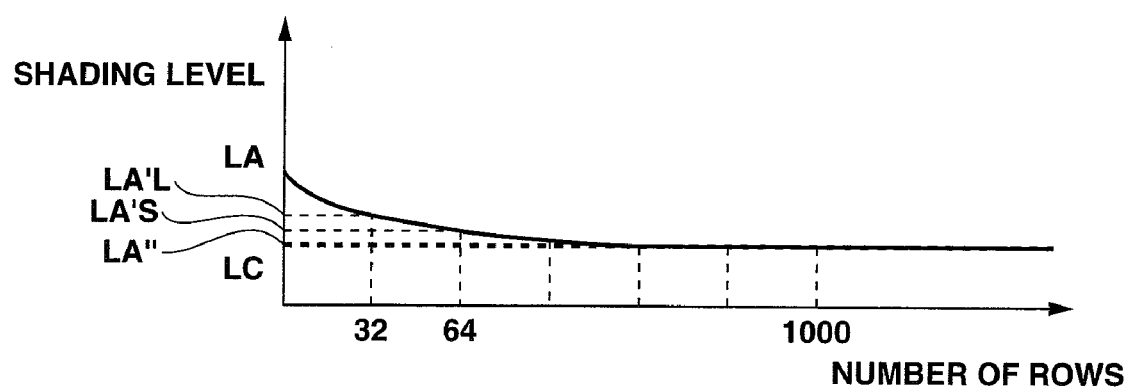
FIG. 30 is a diagram illustrating a situation in which the correction accuracy improves according to the number of rows of pixels used to calculate a correction value and the shading level converges to a clamp level according to the second technique applied to the above described embodiments.
Figure 31:
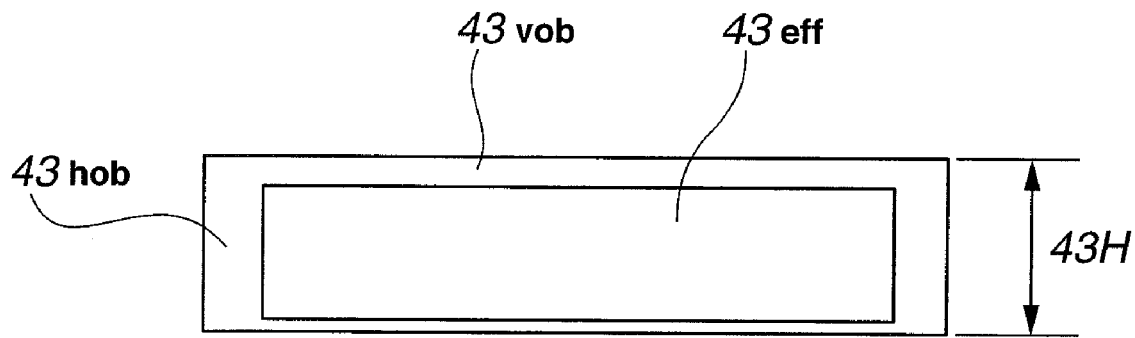
FIG. 31 is a diagram illustrating reset data obtained through divided reading according to the second technique applied to the above described embodiments.
Figure 32:
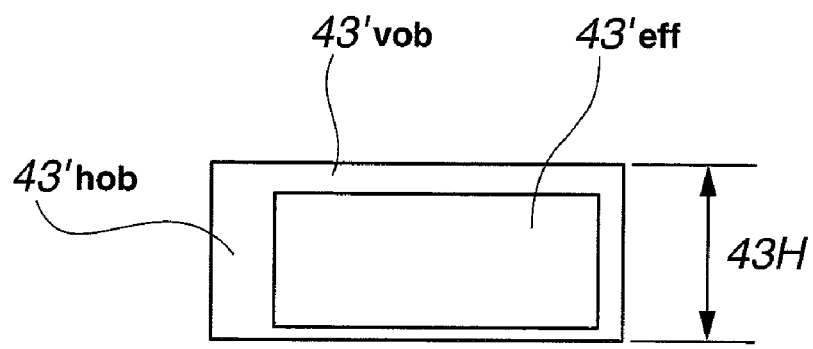
FIG. 32 is a diagram illustrating a situation in which reset data obtained through divided reading is resized according to a live view image according to the second technique applied to the above described embodiments.

FIG. 29 is a diagram illustrating a result of correcting the shading with a shading correction value calculated for a live view image based on reset data obtained through divided reading, FIG. 30 is a diagram illustrating a situation in which the correction accuracy improves according to the number of rows of pixels used to calculate a correction value and the shading level converges to a clamp level, FIG. 31 is a diagram illustrating reset data obtained through divided reading and FIG. 32 is a diagram illustrating a situation in which reset data obtained through divided reading is resized according to a live view image.

The reset data obtained through one divided reading operation differs depending on how the pixel section 24 is divided and in what order the divided data are read, but as shown, for example, in FIG. 31, suppose the reset data includes effective region data 43eff, VOB region data 43vob and HOB region data 43hob here as with the reading data related to a full-size still image and reading data related to a live view image. The reset data read in this case has the same number of pixels in the horizontal direction as the number of pixels in the horizontal direction of a full-size still image and has the number of pixels in the vertical direction which is a number obtained by dividing the number of pixels in the vertical direction of a full-size still image by the division number in divided reading. For example, assuming that the number of rows in the vertical direction (number of pixels in the vertical direction) of the full-size still image is 3000 rows and data is read by dividing the data into three portions, the number of rows 43H in the vertical direction of the reset data obtained through divided reading is 1000 rows.

When the number of rows through divided reading is made to match the number of rows of a live view, the number of rows in the vertical direction remains 1000 even if the reset data obtained through divided reading is resized (this resizing can be easily performed using a publicly known technique) into data including the effective region data 43'eff, VOB region data 43'vob and HOB region data 43'hob according to the live view image as shown in FIG. 32. Since the data corresponding to 1000 rows is data with a sufficiently large number of rows, data with sufficiently high reliability can be obtained if the shading level is statistically calculated based on the reset data shown in FIG. 32.

FIG. 29 shows an example of a shading level calculated for a live view image based on reset data obtained through divided reading. It is evident that a shading level LA" shown in FIG. 29 has sufficiently converged to a clamp level more than the shading level LA'L shown in FIG. 27 and is correction data with high reliability.

Furthermore, as shown in FIG. 30, the shading level converges to a clamp level according to the number of rows of pixels used to calculate a correction value (this FIG. 30 schematically illustrates a correction accuracy converging curve when, for example, an IIR filter is used). It is evident that the aforementioned shading level calculated based on the reset data corresponding to 1000 rows has a sufficient degree of convergence to the clamp level.

When live view images corresponding to a plurality of frames are acquired and displayed within a period during which reset data is subjected to divided reading, a correction value for shading may be calculated using the reset data subjected to divided reading immediately before acquiring each frame. On the other hand, when a live view image is displayed within a period during which still image data after a global exposure is subjected to divided reading, a correction value for shading may be calculated using the reset data subjected to divided reading before the global exposure. Furthermore, in addition to a correction value determined with immediately preceding reset data, it is also possible to continuously calculate correction values using VOB region data of a live view image (e.g., such processing can be easily performed using an IIR filter. Furthermore, when averaging processing is performed, a moving average is obtained).

According to such a second technique, when a live view is performed during continuous shooting to reduce blackout during continuous shooting (state in which no live view image can be observed from the display section 5) (see step S4 in FIG. 13), dark shading correction for a live view is performed using reset data, and it is thereby possible to observe an image whose shading has been satisfactorily corrected immediately after the start of live view during continuous shooting.

Next, a third technique applicable to the aforementioned embodiments will be explained with reference to FIG. 33 to FIG. 46.

First, FIG. 33 is a diagram illustrating a situation in which blooming has occurred in the pixel section 24.

As described above, the pixel section 24 is provided with an effective region 24*eff* which is irradiated with light and photoelectrically converted and a VOB region 24*vob* and HOB region 24*hob* provided around this effective region 24*eff* as a light-shielding region.

It is conventionally known that when part of the effective region 24*eff* of the pixel section 24 is irradiated with strong light, a blooming phenomenon occurs in which a signal charge of pixels irradiated with a strong light (e.g., pixels in which the signal charge indicated with a circle on an Nth line is generated in FIG. 33) overflows toward a neighboring pixel in the vertical direction (V direction) (e.g., neighboring pixel on an (N+1)th line in FIG. 33) causing the neighboring pixel to also appear bright.

Since the movement of charge between neighboring pixels is caused by the PD which is storing charge, whether or not PD storage is performed in the neighboring pixels has a large influence. A long-time exposure exceeding a reading frame as shown in FIG. 20, that is, a long-time exposure that starts an exposure for a live view in the middle of reading of reset data or still image data, is mainly performed on a dark photographing scene. However, since the difference in luminance between a light source and an object other than the light source increases in the dark photographing scene such as a night view, and therefore the probability that a scene may occur where the PD exceeds a saturation level increases or the degree of excess thereof increases and blooming is more likely to occur (or the degree of blooming that occurs increases).

Figure 34:
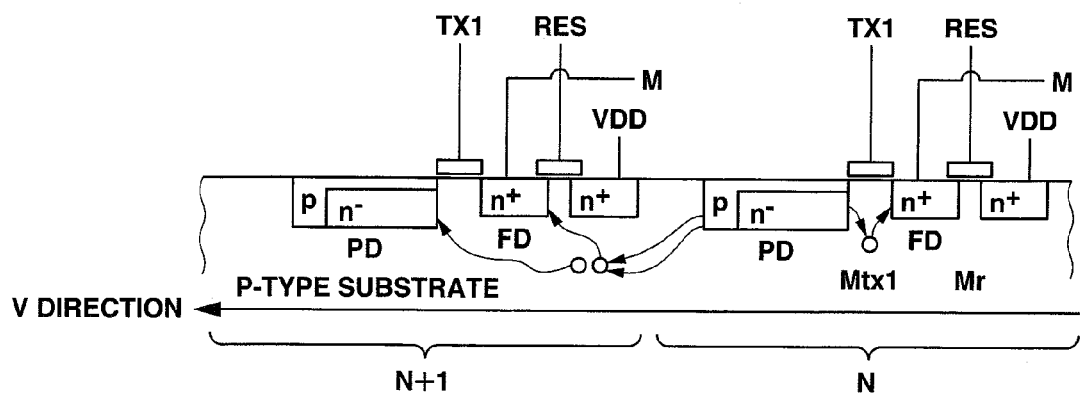
FIG. 34 is a diagram illustrating an example of a moving path of charge when blooming occurs in the pixel structure shown in FIG. 3 according to the third technique applied to the above described embodiments.
Figure 35:
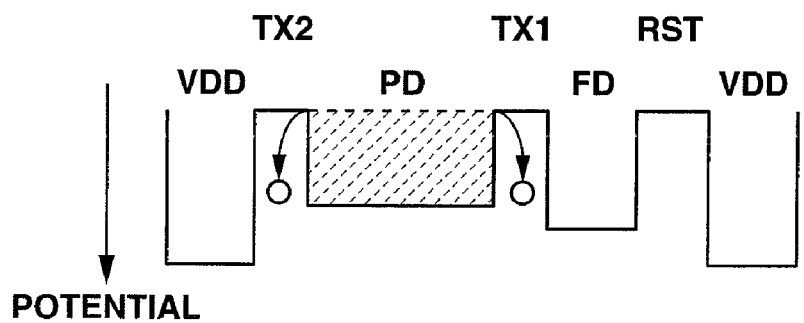
FIG. 35 is a diagram illustrating a situation in which a signal charge leaks from a saturated photoelectric conversion section PD and blooming occurs according to the third technique applied to the above described embodiments.

An example of a path through which charge moves in this blooming will be explained with reference to FIG. 34 and FIG. 35. FIG. 34 is a diagram illustrating an example of a charge moving path when blooming occurs in the pixel structure shown in FIG. 3 and FIG. 35 is a diagram illustrating a situation in which a signal charge leaks out of a saturated photoelectric conversion section PD and blooming has occurred.

As shown in FIG. 34, when, for example, a certain pixel on the Nth line is irradiated with strong light and the photoelectric conversion section PD is saturated (see FIG. 35), charge that overflows from the photoelectric conversion section PD may move to the own signal storage section FD or a signal storage section FD of a pixel on the (N+1)th line neighboring in the vertical direction (V direction) or the photoelectric conversion section PD.

In the configuration shown in FIG. 3 and FIG. 16 in which five transistors are provided in one pixel, if blooming occurs, not only still image data read after a global exposure but also still image reset data read before a global exposure may also be affected. Furthermore, if a neighboring line is read during a live view, the occurrence of blooming may also affect the live view image.

Figure 36:
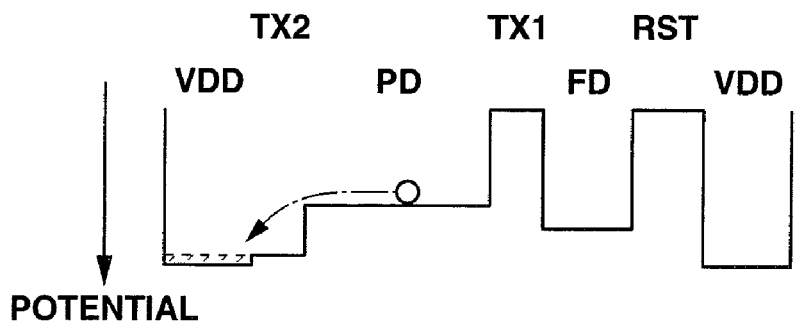
FIG. 36 is a diagram illustrating a potential when the photoelectric conversion section PD is reset according to the third technique applied to the above described embodiments.

Therefore, according to this third technique, for a period during which a signal charge (signal charge for a live view) to be read by the second signal charge reading section (selection transistor Mb) is generated by exposure of a predetermined pixel group, the photoelectric conversion sections PD of pixels of lines including at least a line neighboring the predetermined pixel group are kept reset by the third reset section (transistor Mtx2) so that charge generated in the photoelectric conversion section PD flows to the current source VDD as shown in FIG. 36. Here, FIG. 36 is a diagram illustrating a situation of potential when the photoelectric conversion section PD is reset.

According to this third technique, the photoelectric conversion section PD that can be kept reset is connected to the current source VDD to a maximum extent. Here, "to a maximum extent" means "all photoelectric conversion sections PD not carrying out any storage operation are basically reset" (however, more detailed conditions will be described later). The signal storage section FD is also configured to be connectable to the current source VDD and resettable, but since the source of unnecessary charge is the photoelectric conversion section PD, suppose resetting of only the photoelectric conversion section PD is considered here. However, a resettable signal storage section FD may also be connected to the current source VDD.

Figure 37:
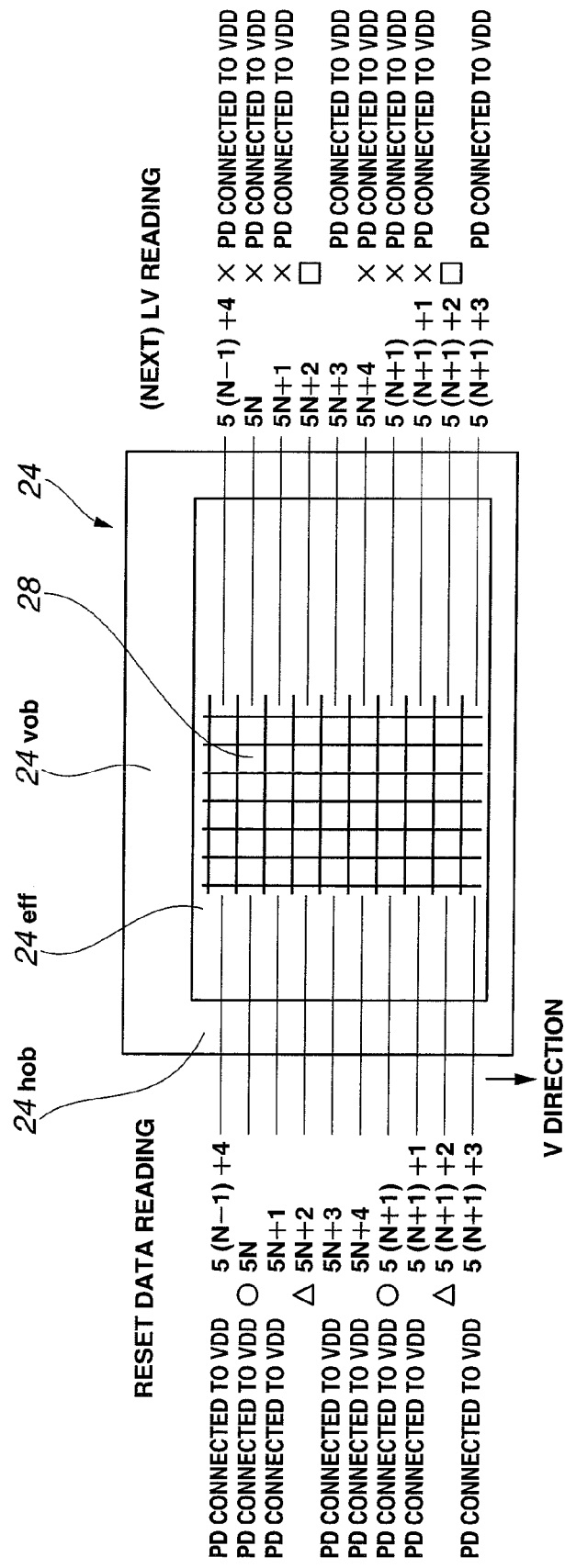
FIG. 37 is a diagram illustrating a situation in which divided reading of reset data of 5N (N is an integer) lines and reading of live view images of (5N+2) lines are performed during a reset data reading period according to the third technique applied to the above described embodiments.
Figure 38:
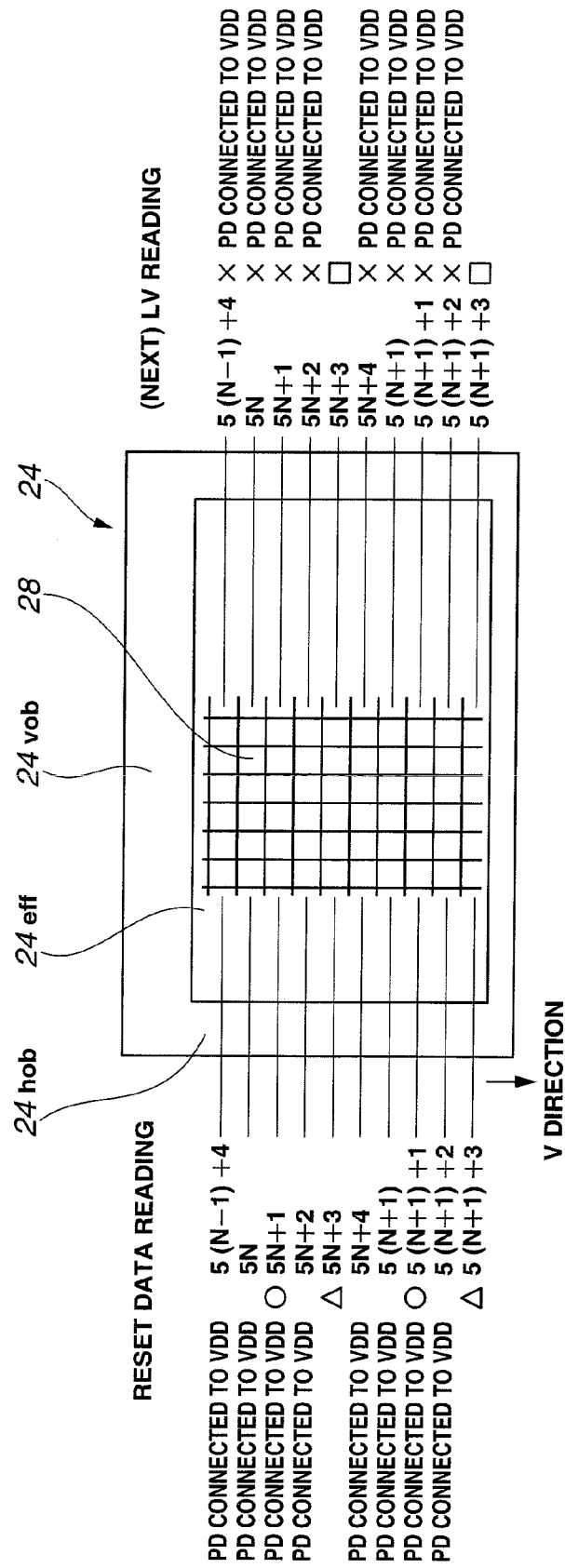
FIG. 38 is a diagram illustrating a situation in which divided reading of reset data of (5N+1) lines and reading of live view images of (5N+3) lines are performed during a reset data reading period according to the third technique applied to the above described embodiments.
Figure 39:
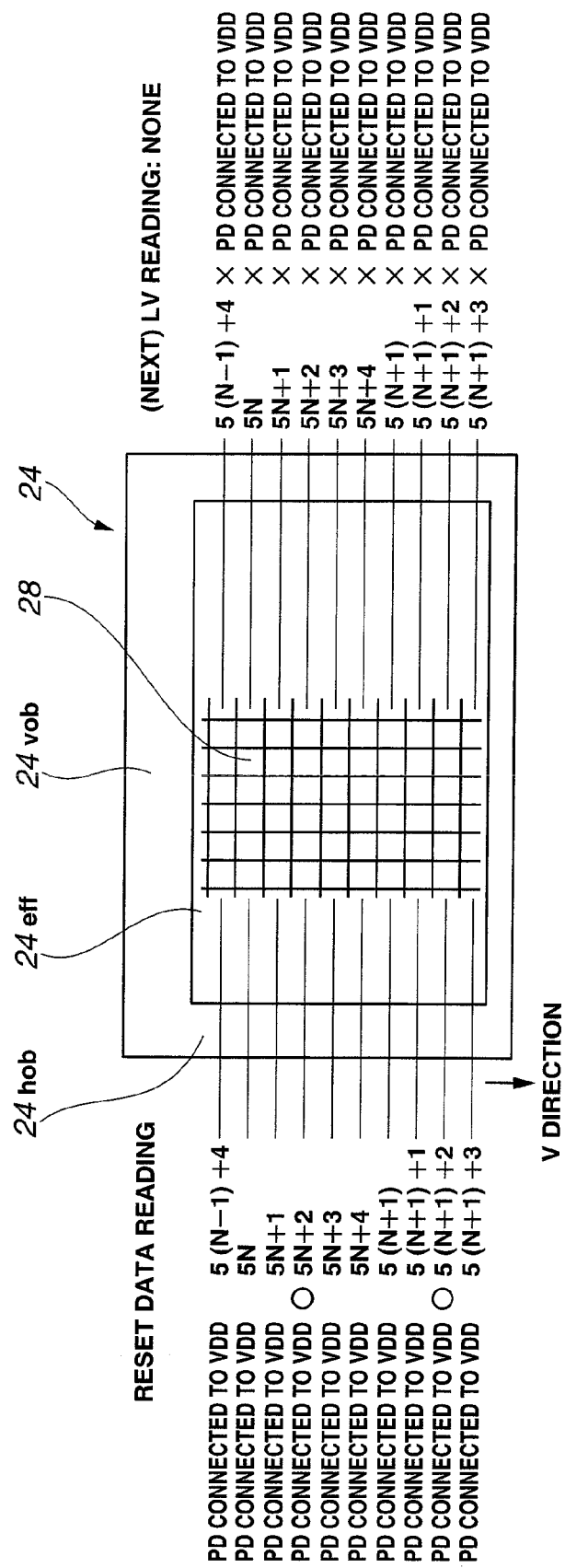
FIG. 39 is a diagram illustrating a situation in which divided reading of reset data of (5N+2) lines is performed during a reset data reading period according to the third technique applied to the above described embodiments.
Figure 40:
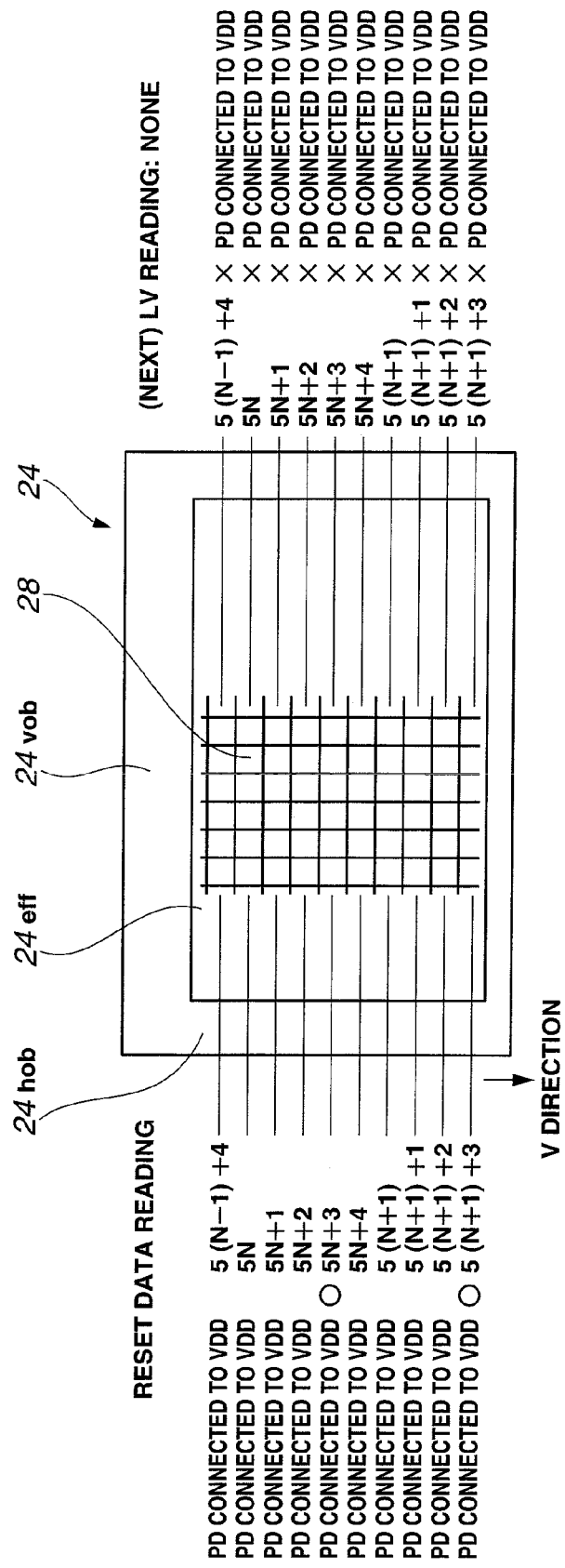
FIG. 40 is a diagram illustrating a situation in which divided reading of reset data of (5N+3) lines is performed during a reset data reading period according to the third technique applied to the above described embodiments.
Figure 41:
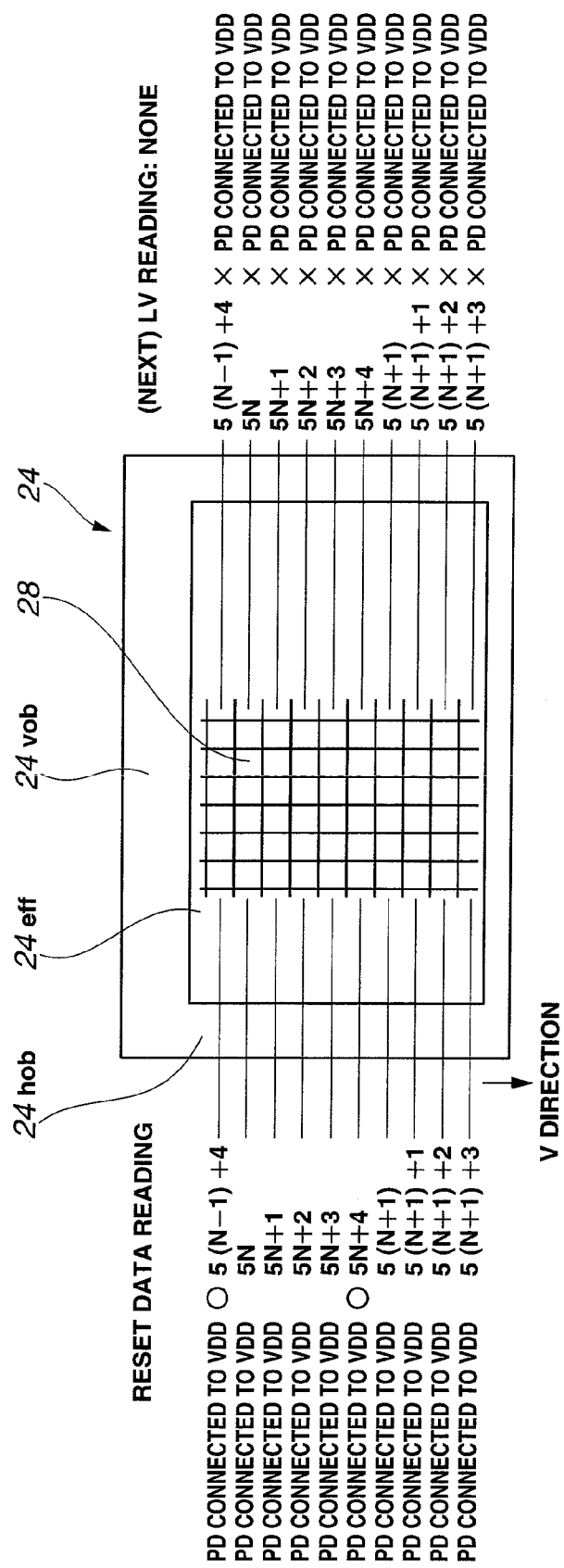
FIG. 41 is a diagram illustrating a situation in which divided reading of reset data of (5N+4) lines is performed during a reset data reading period according to the third technique applied to the above described embodiments.

First, FIG. 37 to FIG. 41 illustrate a situation of resetting of the photoelectric conversion section PD for suppressing blooming in the pixel section 24 when reset data is subjected to divided reading at a ratio of 5:1 (that is, at a rate of one line for every five lines) for the reset data reading period and a live view image is read. Here, FIG. 37 is a diagram illustrating a situation in which divided reading of reset data of 5N (N is an integer) lines and reading of live view images of (5N+2) lines are performed during a reset data reading period, FIG. 38 is a diagram illustrating a situation in which divided reading of reset data of (5N+1) lines and reading of live view images of (5N+3) lines are performed during a reset data reading period, FIG. 39 is a diagram illustrating a situation in which divided reading of reset data of (5N+2) lines is performed during a reset data reading period, FIG. 40 is a diagram illustrating a situation in which divided reading of reset data of (5N+3)

lines is performed during a reset data reading period, and FIG. 41 is a diagram illustrating a situation in which divided reading of reset data of (5N+4) lines is performed during a reset data reading period.

FIG. 37 to FIG. 41 illustrate a case where an exposure of a live view image is started simultaneously with reading of reset data (see FIG. 20). The principles which will be explained below are applicable not only to a case where an exposure of a live view image is started simultaneously with reading of reset data but also to a case where the exposure start is not simultaneous with reading of reset data.

In this case, a reset operation on the photoelectric conversion section PD will be performed based on the following principles.

(A1) Reading of reset data is an operation of resetting and reading the signal storage section FD and has no influence on the operation of the photoelectric conversion section PD. Furthermore, the state of the line from which reset data is read (here, suppose the "line from which reset data is read" includes not only a "line from which reset data has already been read" but also a "line from which reset data is currently being read") needs to be kept until still image data is read after a global exposure and influences of blooming, if any, in the meantime may cause degradation of image quality. The photoelectric conversion section PD of the line from which the reset data is read is reset.

(A2) Furthermore, the influence of blooming from a neighboring line on the line from which reset data is read also needs to be removed. Therefore, the photoelectric conversion sections PD of at least the lines neighboring above and below the line from which reset data is read are reset.

(A3) As a consequence of (A1) and (A2), the line from which reset data is read and the lines neighboring above and below the line from which reset data is read cannot be used as lines from which an exposure of a live view is started (lines marked with a triangle in the figure) (lines from which LV image data is read next (lines marked with a square in the figure) (an x is marked to the right of the lines to which this prohibition condition is applicable). Therefore, the lines neighboring above and below the line from which an exposure of a live view is started do not become the lines from which reset data is read. Therefore, one of the lines to which such a prohibition condition is not applicable is set as the line from which an exposure of a live view is started. When the ratio of divided reading is equal to or above 3:1 (equal to or above ⅓), there is no line to which the aforementioned prohibition condition is not applicable. That is, the suppression of blooming explained here can be realized only when reset data (or still image data which will be described later) is subjected to divided reading at a ratio equal to or below 4:1 (equal to or below ¼) (e.g., when the ratio of divided reading is 5:1 or 6:1, or 11:2, 13:3 or the like). For the line from which an exposure of a live view is started, signal charge is being stored in the photoelectric conversion section PD thereof, and therefore the photoelectric conversion section PD is naturally not reset.

(A4) When the ratio at which reset data (the same applies to still image data which will be described later) is subjected to divided reading is equal to or below 5:1 (equal to or below ⅕), there can be a line that corresponds to none of the line from which reset data is read, lines neighboring above and below the line from which reset data is read and the line from which an exposure of a live view is started at least at a time at which reset data is being subjected to the first divided reading. In this case, the photoelectric conversion section PD is also reset for the line that corresponds to none of those lines.

(A1) to (A4) described so far are briefly summarized as shown in (A) below from the standpoint of resetting the photoelectric conversion section PD.

(A) All photoelectric conversion sections PD for which live view signal charge is not stored are kept reset.

It is evident from FIG. 37 to FIG. 41 that all photoelectric conversion sections PD are reset for lines other than the lines for which live view signal charge is stored (lines marked with a triangle or square) thus satisfying the principle (A). It is also evident as a consequence of the principle (A) that the lines for which live view signal charge is being stored is not influenced by blooming from other lines.

Figure 42:
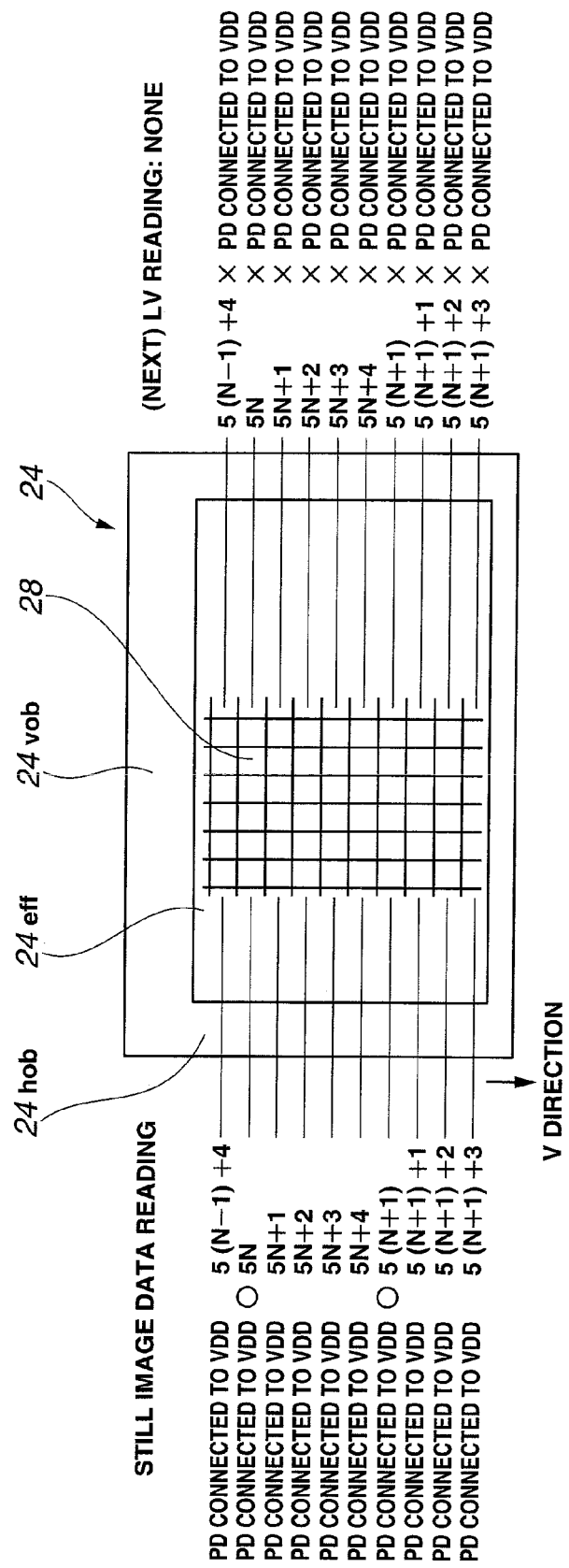
FIG. 42 is a diagram illustrating a situation in which divided reading of still image data of 5N lines is performed during a still image data reading period according to the third technique applied to the above described embodiments.
Figure 43:
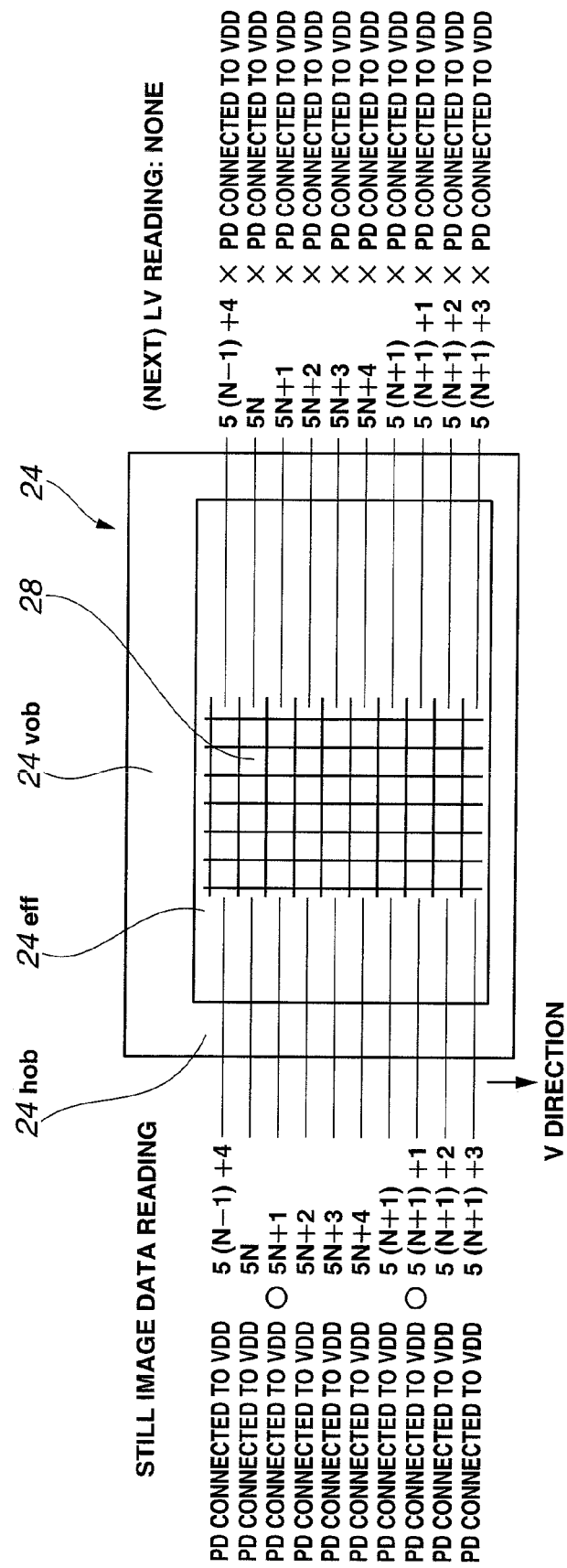
FIG. 43 is a diagram illustrating a situation in which divided reading of still image data of (5N+1) lines is performed during a still image data reading period according to the third technique applied to the above described embodiments.
Figure 44:
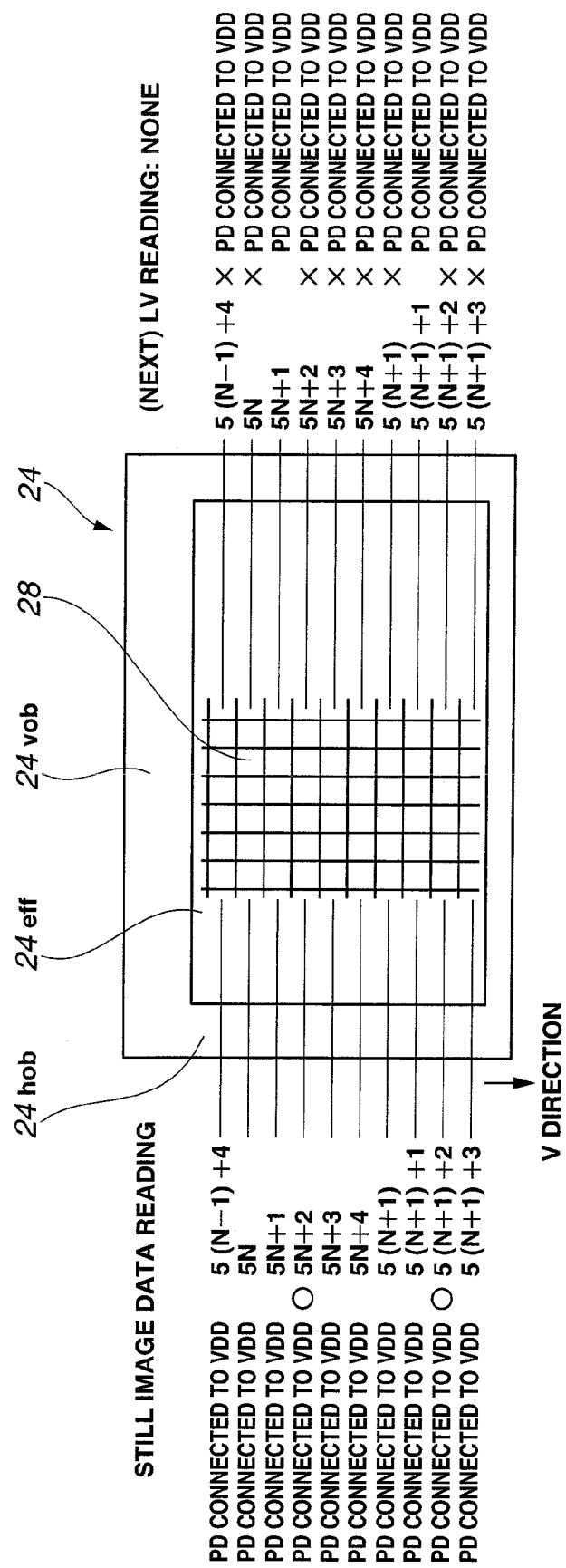
FIG. 44 is a diagram illustrating a situation in which divided reading of still image data of (5N+2) lines is performed during a still image data reading period according to the third technique applied to the above described embodiments.
Figure 45:
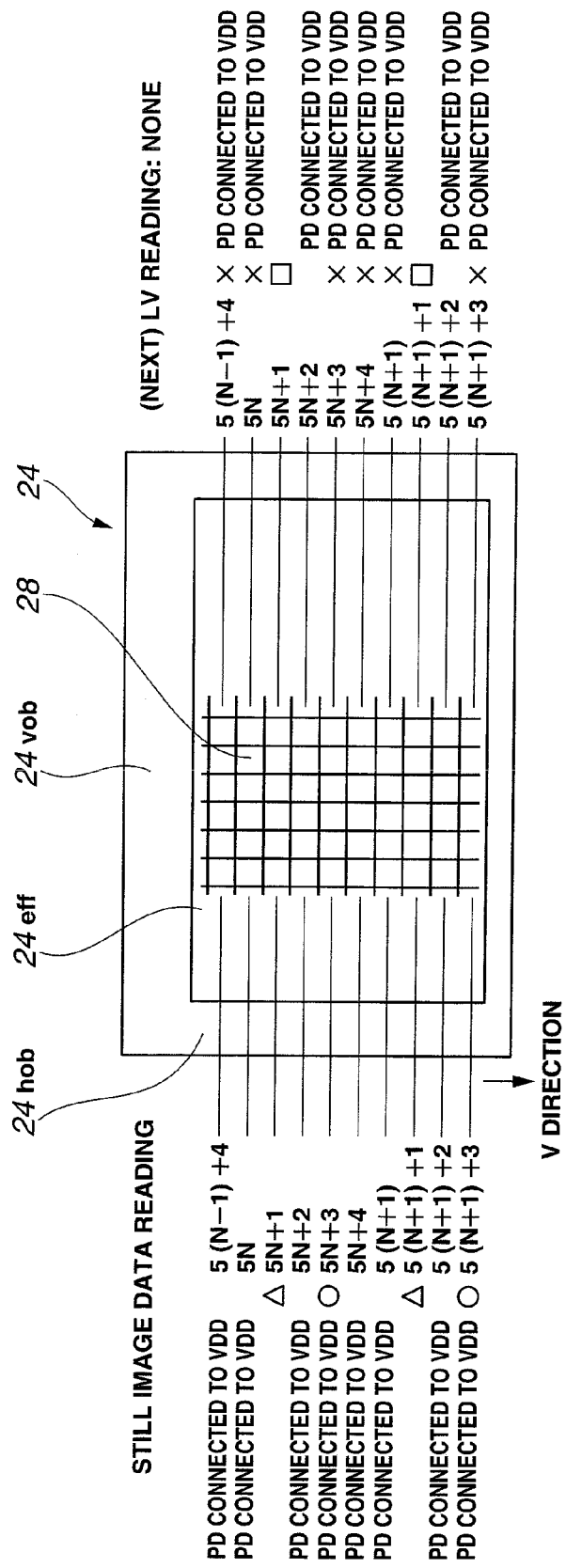
FIG. 45 is a diagram illustrating a situation in which divided reading of still image data of (5N+3) lines and reading of live view images of (5N+1) lines are performed during a still image data reading period according to the third technique applied to the above described embodiments.
Figure 46:
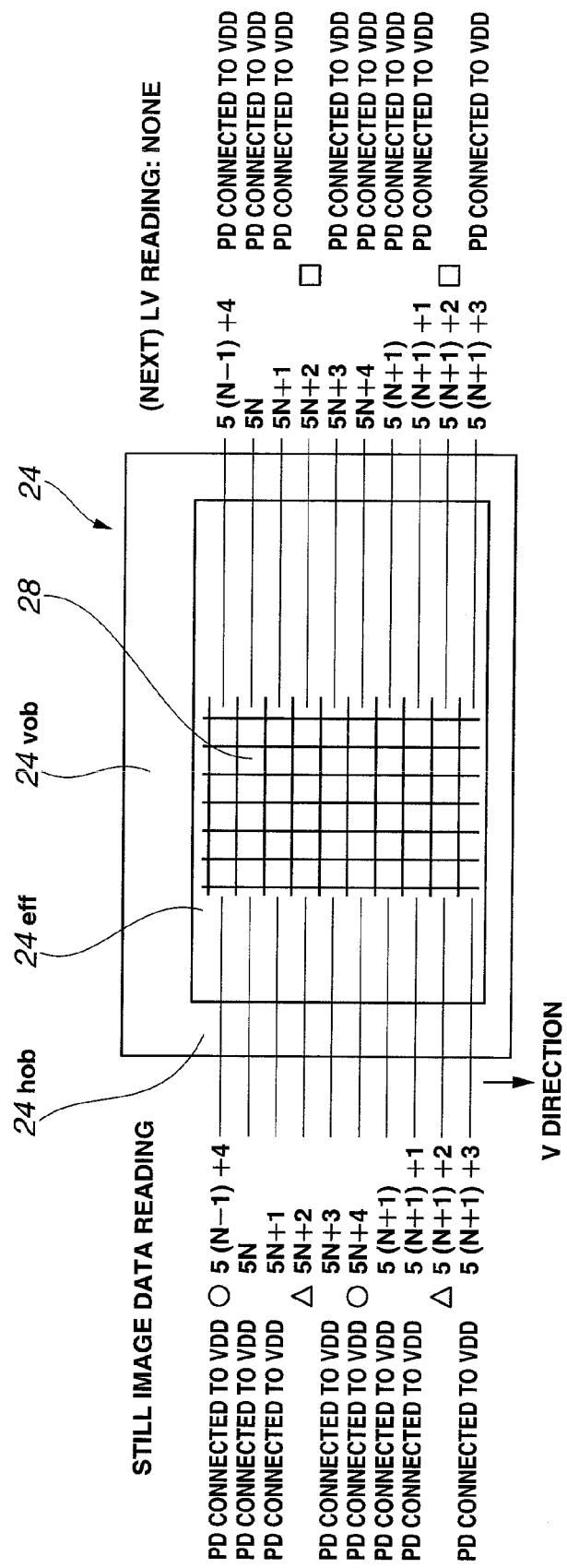
FIG. 46 is a diagram illustrating a situation in which divided reading of still image data of (5N+4) lines and reading of live view images of (5N+2) lines are performed during a still image data reading period according to the third technique applied to the above described embodiments.

Next, FIG. 42 to FIG. 46 illustrate a situation of resetting of the photoelectric conversion section PD for suppressing blooming in the pixel section 24 when divided reading of still image data at a ratio of 5:1 and reading of a live view image are performed for a still image data reading period. Here, FIG. 42 is a diagram illustrating a situation in which divided reading of still image data of 5N lines is performed during a still image data reading period, FIG. 43 is a diagram illustrating a situation in which divided reading of still image data of (5N+1) lines is performed during a still image data reading period, FIG. 44 is a diagram illustrating a situation in which divided reading of still image data of (5N+2) lines is performed during a still image data reading period, FIG. 45 is a diagram illustrating a situation in which divided reading of still image data of (5N+3) lines and reading of live view images of (5N+1) lines are performed during a still image data reading period and FIG. 46 is a diagram illustrating a situation in which divided reading of still image data of (5N+4) lines and reading of live view images of (5N+2) lines are performed during a still image data reading period.

FIG. 42 to FIG. 46 illustrate a case where an exposure of a live view image is started simultaneously with reading of still image data (see FIG. 20). However, the principles which will be described below are applicable not only to a case where an exposure of a live view image is started simultaneously with reading of still image data but also to a case where an exposure of a live view image is not started simultaneously with reading of still image data.

In this case, a reset operation on the photoelectric conversion section PD will be performed based on the following principles.

(B1) The still image data is transferred from the photoelectric conversion section PD to the signal storage section FD when a global shutter is closed. Therefore, subsequent reading of still image data is an operation of reading signal charge from the signal storage section FD and has no influence on the operation of the photoelectric conversion section PD. Furthermore, influences of blooming, if any, on lines from which still image data has not been read yet may cause degradation of image quality. Therefore, all photoelectric conversion sections PD on the lines from which still image data has not been read yet are reset.

(B2) Furthermore, the influence of blooming from a neighboring line on the line from which still image data has not been read yet also needs to be removed. Therefore, the photoelectric conversion sections PD of at least the lines neighboring above and below the line from which still image data has not been read yet are reset.

(B3) As a consequence of (B1) and (B2), the line from which still image data has not been read yet and the lines neighboring above and below the line from which still image data has not been read yet cannot be used as lines from which an exposure of a live view is started (lines marked with a triangle in the figure) (lines from which LV image data is read next (lines marked with a square in the figure) (an x is marked to the right of the lines to which this prohibition condition is applicable). Therefore, one of the lines to which such a prohibition condition is not applicable is set as the line from which an exposure of a live view is started. Only when the ratio of divided reading is equal to or below 4:1 (equal to or below ¼), there is a line to which the aforementioned prohibition condition is not applicable as with the above case. For the line from which an exposure of a live view is started, a signal charge is being stored in the photoelectric conversion section PD, and therefore the photoelectric conversion section PD is naturally not reset.

(B4) When the ratio at which still image data is subjected to divided reading is equal to or below 5:1 (equal to or below ⅕), there can be a line that corresponds to none of the line from which still image data has not been read yet, lines neighboring above and below the line from which still image data has not been read yet and the line from which an exposure of a live view is started at least at a time at which reset data is being subjected to the final divided reading. In this case, the photoelectric conversion section PD is also reset for the line that corresponds to none of those lines.

(B1) to (B4) described so far are briefly summarized as shown in (B) below from the standpoint of resetting of the photoelectric conversion section PD.

(B) All photoelectric conversion sections PD for which live view signal charge is not stored are kept reset.

It is evident from FIG. 42 to FIG. 46 that all photoelectric conversion sections PD are reset for lines other than the lines for which live view signal charge is stored (lines marked with a triangle or a square) thus satisfying the principle (B). It is also evident as a consequence of the principle (B) that the lines for which live view signal charge is being stored is not influenced by blooming from other lines.

From a comprehensive standpoint, the principle (A) and principle (B) may be combined and expressed as (AB) below.

(AB) All photoelectric conversion sections PD for which a signal charge for a still image or for a live view has not been stored are kept reset.

This principle (AB) needs to be satisfied at least from the start of a reset data reading period to the end of a still image data reading period, but the principle is not only applicable to this period but also widely and generally applicable.

Although there may also be a case where a live view line cannot be selected as shown in FIG. 39 to FIG. 44, decreasing the ratio of divided reading (that is, increasing the value of m in the ratio of m:1) causes the proportion of cases where a live view line cannot be selected to cases where a live view line can be selected to decrease, and can thereby reduce cases where the frame rate becomes nonuniform and achieve both improvement of visual quality of a live view image and reduction of blooming.

According to such a third technique, the live view line is never affected by blooming from other lines, and it is thereby possible to obtain a live view image signal with blooming suppressed. Therefore, in the case of a live view of long-time exposure as shown in FIG. 20 where blooming is likely to occur, this third technique is significantly effective.

Furthermore, it is possible to prevent noise by blooming from mixing into pixels from which reset data has been read or pixels from which still image data has not been read yet. Therefore, it is possible to obtain a still image with blooming suppressed.

Figure 47:
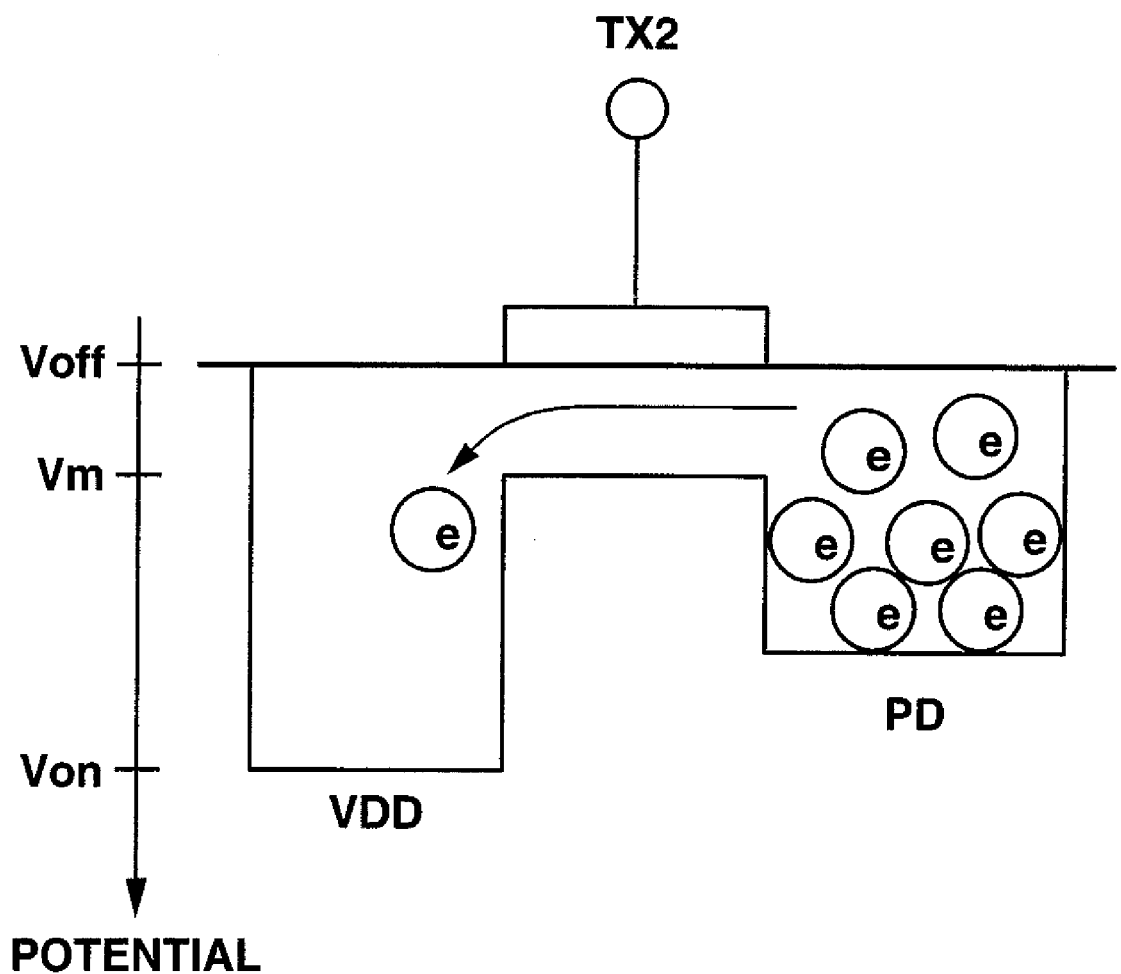
FIG. 47 is a diagram illustrating an example of a potential at the gate electrode of the transistor Mtx2 according to a fourth technique applied to the above described embodiments.

Next, a fourth technique which is applicable to the aforementioned embodiments will be explained with reference to FIG. 47 and FIG. 48. FIG. 47 is a diagram illustrating an example of potential at the gate electrode of the transistor Mtx2 and FIG. 48 is a timing chart illustrating an example of a signal applied to the signal line TX2 when the image pickup section 2 is driven to pick up a still image through a global shutter using the second drive method.

According to this fourth technique, for a period during which the signal charge (signal charge for LV) to be read from the second signal charge reading section (selection transistor Mb) is generated by exposure of a predetermined pixel group, the overflow control section (transistor Mtx2) keeps the photoelectric conversion section PD of each pixel of at least the predetermined pixel group in a state in which energy equal to or below a predetermined potential is stored and charge of energy exceeding the predetermined potential is made to overflow (a state in which the potential of the gate electrode of the transistor Mtx2 is kept to a predetermined potential Vm (Voff<Vm<Von), which is intermediate between a state in which charge is stored (a state in which the potential of the gate electrode of the transistor Mtx2 becomes gate OFF potential Voff) and a state in which the photoelectric conversion section PD is reset by the first reset section (transistor Mtx2) (a state in which the potential of the gate electrode of the transistor Mtx2 becomes gate ON potential Von).

Figure 48:
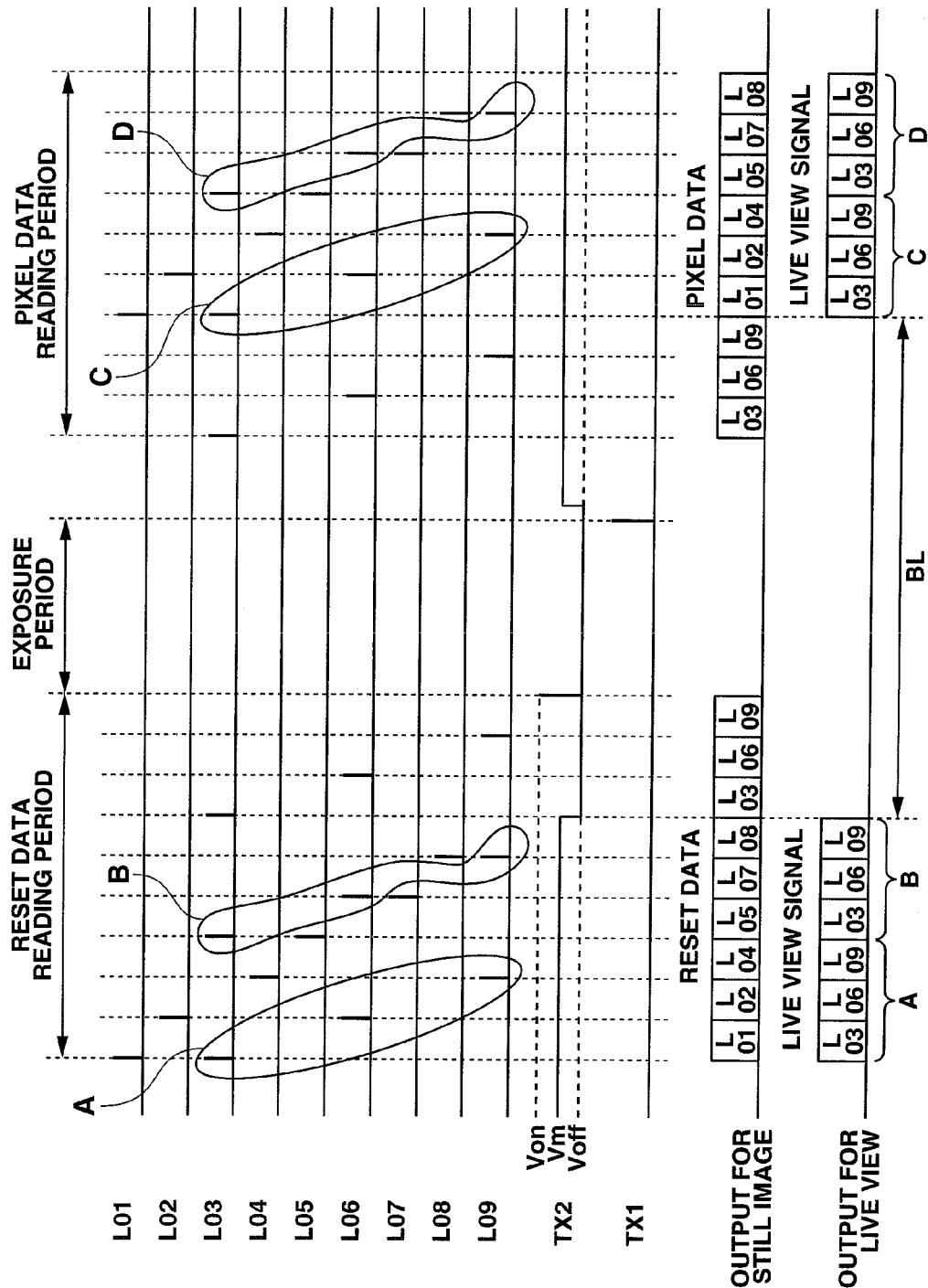
FIG. 48 is a timing chart illustrating an example of a signal applied to the signal line TX2 when the image pickup section is driven to pick up a still image through a global shutter using a second drive method according to the fourth technique applied to the above described embodiments.

That is, as shown in FIG. 48, for a period during which live view drive is performed, the potential of a signal (signal for controlling the gate of transistor Mtx2) applied to the line TX2 of pixels performing at least live view drive is set to the predetermined potential Vm which is intermediate between a gate OFF potential Voff at which charge is stored in the photoelectric conversion section PD and a gate ON potential Von at which the photoelectric conversion section PD is reset.

As shown in FIG. 47, this causes the potential at the gate electrode of the transistor Mtx2 to exceed the value at the time of resetting (the potential increases for electrons having negative charge and the potential decreases), and therefore charge having energy equal to or above the level determined by this potential is discharged toward the current source VDD side and the photoelectric conversion section PD performs an overflow operation.

Therefore, even if a pixel performing live view drive is irradiated with strong light, extra charge is reliably discharged toward the current source VDD side, and therefore the extra charge generated in the live view pixel never leaks into the neighboring pixel and it is thereby possible to prevent a blooming phenomenon from occurring in a live view image and still image.

When this fourth technique is applied, the saturation level of live view pixels (the number of charges that can be stored in the photoelectric conversion section PD) can be lowered compared to the level in the normal drive operation, and therefore the signal read from the image pickup device may be amplified in an analog fashion or subjected to gradation conversion in a digital fashion by the second image processing section 3b or the like.

This fourth technique may be used singly, but may be better used in combination with the aforementioned third technique. That is, applying the third technique can suppress blooming of pixels other than pixels driven for a live view, while applying the fourth technique can suppress blooming of pixels driven for a live view, and it is thereby possible to suppress blooming for all pixels in the pixel section 24.

In the above description, an overflow operation of the photoelectric conversion section PD is performed by controlling the potential of a signal applied to the transistor Mtx2, but the present invention is not limited to thereto. For example, the technique of performing an overflow operation of the photoelectric conversion section PD may also be adopted by setting the potential of the signal applied to the transistor Mtx2 to the gate ON potential Von at the time of normal resetting and controlling the potential of the current source VDD to which the transistor Mtx2 is connected to the aforementioned intermediate potential Vm.

An image pickup apparatus has been mainly explained in the aforementioned embodiments, but the present invention is not limited to an image pickup apparatus, and may also be applicable, for example, to a method of picking up a live view image and still image using an image pickup apparatus as described above, that is, an image pickup method for an image pickup apparatus, or an image pickup processing program for an image pickup apparatus or a recording medium that records an image pickup processing program for an image pickup apparatus or the like.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. An image pickup apparatus comprising:
a pixel section in which pixels each including a photoelectric conversion section for generating a signal charge according to an exposure amount are two-dimensionally arrayed;
a storage section that is light-shielded and temporarily stores the signal charge of the pixel section;
a second reset section that divides the pixels in the pixel section into a plurality of pixel groups that do not overlap each other and sequentially resets the storage sections of the plurality of pixel groups;
a reset signal reading section that sequentially reads reset signals of the storage sections of the plurality of pixel groups reset by the second reset section;
a second signal charge reading section that reads one or more times the signal charge generated by exposure of a predetermined pixel group out of the plurality of pixel groups within a time segment during which the second reset section sequentially resets the storage sections of the plurality of pixel groups before the storage sections of the predetermined pixel group are reset by the second reset section;
a second image processing section that creates second image data for image display based on the signal charge read by the second signal charge reading section;
a first reset section that collectively resets all photoelectric conversion sections that belong to the plurality of pixel groups after reading of reset signals of the plurality of pixel groups by the reset signal reading section is completed;
a transfer section that exposes the photoelectric conversion sections for a predetermined time after resetting by the first reset section and then collectively transfers the signal charge generated by the photoelectric conversion sections to the storage sections;
a first signal charge reading section that reads the signal charge in the storage sections transferred by the transfer section; and
a first image processing section that creates first image data for still image recording based on the signal charge read by the first signal charge reading section and the reset signal read by the reset signal reading section.

2. The image pickup apparatus according to claim 1, wherein the predetermined pixel group is a pixel group finally reset within a time segment during which the second reset section sequentially resets the storage sections of the plurality of pixel groups.

3. The image pickup apparatus according to claim 2, wherein the first signal charge reading section sequentially reads the signal charge of the storage sections transferred by the transfer section by dividing pixels in the pixel section into a plurality of pixel groups that do not overlap with each other, the image pickup apparatus further comprises:
a third signal charge reading section that reads one or more times, after a signal charge of a second predetermined pixel group out of the plurality of pixel groups is read by the first signal charge reading section and within a time segment during which the signal charge is read by the first signal charge reading section, the signal charge generated by exposure of the second predetermined pixel group; and
a third image processing section that creates third image data for image display based on the signal charge read by the third signal charge reading section.

4. The image pickup apparatus according to claim 3, wherein the second predetermined pixel group read by the third signal charge reading section is a pixel group different from the predetermined pixel group read by the second signal charge reading section with no overlapping pixels.

5. The image pickup apparatus according to claim 4, wherein the first signal charge reading section reads the signal charge of the storage sections transferred by the transfer section so that a time after the second reset section resets the storage sections until the signal charge is read is substantially identical for all pixels.

6. The image pickup apparatus according to claim 1, further comprising a camera control section for controlling whether to acquire the first image data for still image recording by a single shooting or continuous shootings,
wherein when the first image data is acquired by a single shooting, operations of the second signal charge reading section and the second image processing section are not performed, whereas when the first image data is acquired by continuous shootings, operations of the second signal charge reading section and the second image processing section are performed.

7. The image pickup apparatus according to claim 1, further comprising:
a photographing lens;
an AF control section that auto-focus controls the photographing lens; and
a camera control section for controlling, when the first image data for still image recording is acquired, the AF control section by any one of single AF and continuous AF,
wherein when control is performed by single AF, operations of the second signal charge reading section and the second image processing section are not performed, whereas when control is performed by continuous AF, operations of the second signal charge reading section and the second image processing section are performed.

8. The image pickup apparatus according to claim 1, wherein the second reset section divides the pixels in the pixel section into a plurality of pixel groups by dividing the pixels into equal portions in units of the number of lines making up the predetermined pixel group in which the signal charge read by the second signal charge reading section is generated.

9. The image pickup apparatus according to claim 1, further comprising:
a shading calculation section that calculates shading in a row direction based on statistical values of reset signals of a plurality of pixels that belong to a same column out of the reset signals read by the reset signal reading section; and a shading correction section that corrects the signal charge read by the second signal charge reading section based on the shading calculated by the shading calculation section, wherein the second image processing section creates second image data for image display based on the signal charge corrected by the shading correction section.

10. The image pickup apparatus according to claim 1, further comprising a third reset section that keeps the photoelectric conversion sections of pixels including at least lines neighboring the predetermined pixel group reset for a period during which the signal charge to be read by the second signal charge reading section is generated by exposure of the predetermined pixel group.

11. The image pickup apparatus according to claim 1, further comprising an overflow control section that keeps, for a period during which the signal charge to be read by the second signal charge reading section is generated by exposure of the predetermined pixel group, the photoelectric conversion section of each pixel of the predetermined pixel group in a state in which a charge of energy equal to or below a predetermined potential is stored and the charge of energy exceeding the predetermined potential is made to overflow, which is intermediate between a state in which the charge is stored and a state in which the charge is reset by the first reset section.

12. An image pickup method of reading a reset signal of a storage section that is light-shielded and temporarily stores a signal charge generated by a pixel section in which pixels each including a photoelectric conversion section are arrayed two-dimensionally, then exposing the photoelectric conversion sections for a predetermined time after collectively resetting the photoelectric conversion sections, collectively transferring the signal charge generated by the photoelectric conversion sections to the storage sections, then reading the signal charge and creating image data based on the read signal charge and the read reset signal, the method comprising:

a step of causing a second reset section to divide the pixels in the pixel section into a plurality of pixel groups that do not overlap each other and sequentially reset the storage sections of the plurality of pixel groups;

a step of causing a reset signal reading section to sequentially read the reset signals of the storage sections of the plurality of pixel groups reset by the second reset section;

a step of causing a second signal charge reading section to read one or more times the signal charge generated by exposure of a predetermined pixel group out of the plurality of pixel groups within a time segment during which the second reset section sequentially resets the storage sections of the plurality of pixel groups before the storage sections of the predetermined pixel group are reset by the second reset section;

a step of causing a second image processing section to create second image data for image display based on the signal charge read by the second signal charge reading section;

a step of causing a first reset section to collectively reset all photoelectric conversion sections that belong to the plurality of pixel groups after reading of reset signals of the plurality of pixel groups by the reset signal reading section is completed;

a step of causing a transfer section to expose the photoelectric conversion sections for a predetermined time after resetting by the first reset section and then collectively transfer the signal charge generated by the photoelectric conversion sections to the storage sections;

a step of causing a first signal charge reading section to read the signal charge in the storage sections transferred by the transfer section; and a step of causing a first image processing section to create first image data for still image recording based on the signal charge read by the first signal charge reading section and the reset signal read by the reset signal reading section.

* * * * *